(12) United States Patent
Smith et al.

(10) Patent No.: US 7,381,503 B2
(45) Date of Patent: Jun. 3, 2008

(54) REFERENCE WAFER CALIBRATION RETICLE

(75) Inventors: Adlai H. Smith, Escondido, CA (US); Robert O. Hunter, Jr., Snowmass Village, CO (US)

(73) Assignee: Litel Instruments, San Diego, CA (US)

(*) Notice: Subject to any disclaimer, the term of this patent is extended or adjusted under 35 U.S.C. 154(b) by 0 days.

(21) Appl. No.: 11/742,468

(22) Filed: Apr. 30, 2007

(65) Prior Publication Data
US 2007/0216902 A1    Sep. 20, 2007

Related U.S. Application Data

(60) Continuation of application No. 11/371,514, filed on Mar. 8, 2006, now Pat. No. 7,261,983, which is a continuation-in-part of application No. 10/765,223, filed on Jan. 26, 2004, now Pat. No. 7,160,657, which is a division of application No. 10/020,569, filed on Dec. 7, 2001, now Pat. No. 6,699,627.

(60) Provisional application No. 60/254,413, filed on Dec. 8, 2000, provisional application No. 60/254,315, filed on Dec. 8, 2000, provisional application No. 60/254,271, filed on Dec. 8, 2000.

(51) Int. Cl.
*G03F 9/00* (2006.01)
(52) U.S. Cl. .................. 430/5; 430/22; 430/30
(58) Field of Classification Search .......... 430/5, 430/22, 30, 296, 942, 967; 356/399
See application file for complete search history.

(56) References Cited

U.S. PATENT DOCUMENTS

| | | |
|---|---|---|
| 4,757,207 A | 7/1988 | Chappelow et al. |
| 4,861,148 A | 8/1989 | Sato et al. |
| 4,929,083 A | 5/1990 | Brunner |
| 5,124,927 A | 6/1992 | Hopewell et al. |
| 5,262,257 A | 11/1993 | Fukuda et al. |
| 5,285,236 A | 2/1994 | Jain |
| 5,438,413 A | 8/1995 | Mazor et al. |
| 5,444,538 A | 8/1995 | Pellegrini |
| 5,477,058 A | 12/1995 | Sato |
| 5,615,006 A | 3/1997 | Hirukawa et al. |
| 5,700,602 A | 12/1997 | Dao et al. |
| 5,757,507 A | 5/1998 | Ausschnitt et al. |
| 5,805,290 A | 9/1998 | Ausschnitt et al. |
| 5,824,441 A | 10/1998 | Farrow et al. |
| 5,877,861 A | 3/1999 | Ausschnitt et al. |
| 5,894,350 A | 4/1999 | Hsieh et al. |
| 5,953,128 A | 9/1999 | Ausschnitt et al. |
| 6,023,338 A | 2/2000 | Bareket |
| 6,064,486 A | 5/2000 | Chen et al. |
| 6,079,256 A | 6/2000 | Bareket |
| 6,259,525 B1 | 7/2001 | David |

OTHER PUBLICATIONS

Armitage et al, Analysis of overlay distortion patterns, SPIE vol. 921, 207:221, 1988.

Biesterbos et al., A New Lens for Submicron Lithography and its Consequences for Wafer Stepper Design, SPIE vol. 633, Optical Microlithography V, 34:43, 1986.

Bjorkholm et al., Reduction Imaging at 14nm Using Multilayer-Coated Optics: Printing of Features Smaller than 0.1 Micron, Journal Vacuum Science and Technology, B 8(6), 1509:1513, Nov./Dec. 1990.

Bruning, Optical Lithography—Thirty Years and Three Orders of Magnitude, SPIE vol. 3051, 14:27, 1997.

Brunner, Impact of Lens Aberrations on Optical Lithography, IMB Journal of Research and Development: Optical Lithography, 41(1-2): 57-67 (1997).

Cote et al., Micrascan™ III Performance of a Third Generation, Catadioptric Step and Scan Lithographic Tool, SPIE vol. 3051, 806:816, 1997.

DeJule, Mix-and-Match: A Necessary Choice, Semiconductor International, 66:76, Feb. 2000.

Dooly et al, Stepper Matching for Optimum Line Performance, SPIE vol. 3051, 426:432, 1997.

Goodwin et al, Characterizing Overlay Registration of Concentric 5X and 1X Stepper Exposure Fields Using Interfield Data, SPIE vol. 3050, 407:417, 1997.

Goodwin et al., Expanding Capabilities in Existing Fabs with Lithography Tool-Matching, Solid State Technology, 97:106, Jun. 2000.

Handbook of Microlithography, Micromachining and Microfabrication, Book: vol. 1, "Microlithography", Rai-Choudhury, P. (Ed.), SPIE Optical Engineering Press, SPIE, Bellingham, Washington, pp. 417-418 (1997).

Hasan et al., Automated Electrical Measurements of Registration Errors in Step and Repeat Optical Lithography Systems, IEEE Transactions on Electron Devices, vol. ED-27, No. 12, 2304:2312, Dec. 1980.

(Continued)

*Primary Examiner*—Christopher G. Young

(57) ABSTRACT

An apparatus and method for manufacturing and using a calibrated registration reference wafer in a semiconductor manufacturing facility where an archive media includes etched alignment attributes. Exposing a pattern of complementary alignment attributes onto the archive media such that the pattern of complementary alignment attributes overlay and interlock with the etched alignment attributes thereby forming completed alignment attributes. Then, measuring offsets in the completed alignment attributes and constructing a calibration file for the archive media based upon the offset measurements and other characteristic data of the exposure tool.

2 Claims, 39 Drawing Sheets

OTHER PUBLICATIONS

Kemp et al., "A 'Golden Standard' Wafer Design for Optical Stepper Characterization", Proc. of SPIE, vol. 1464, pp. 260-266, 1991.

KLA 5105, "Linewidth and Misregistration System", KLA 5105 Product Specification, KLA Instruments Corporation, 2 pages (1995).

KLA 5200, "Value-added Overlay Metrology for Advanced Lithography", KLA 5200 Product Specification, KLA Instruments Corporation, 2 pages (1996).

Kodama et al., Measuring System XY-5I, K. SPIE vol. 2439, 144:155, 1995.

Leica LMS IPRO, "Fulling Automated Mask and Wafer Metrology System", Lecia, brochure, pp. 1-5, 2001.

Lin, "The Attenuated Phase-Shifting Mask", Solid State Technology, Special Series/Advanced Lithography, 35(1): 43-47 (1992).

MacMillan et al, "Analysis of Image Field Placement Devations of a 5X Microlithographic Reduction Lens", SPIE, 334:78-89 (1982).

Martin et al, Measuring Fab Overlay Programs, SPIE Conference on Metrology, Inspection, and Process Control for Microlithography XIII, 64:71, Mar. 1999.

McFadden, C. et al, A Computer Aided Engineering Workstation for Registration Control, SPIE vol. 1087, 255:266, 1989.

Mulkens et al., ArF Step and Scan Exposure System for 0.15 Micron and 0.13 Micron Technology Node, SPIE Conference on Optical Microlithography XII, 506:521, Mar. 1999.

Muller et al., Large Area Fine Line Patterning by Scanning Projection Lithography, MCM 1994 Proceedings, 100:104.

Newnam et al., Development of XUV Projection Lithography at 60-80 nm, SPIE vol. 1671, 419:436, 1992.

Pellegrini, "Comparisions of Six Different Intrafield Control Paradigms in an Advanced Min-And-Match Environment", SPIE, 3050:398-406 1997.

Pellegrini, Super Sparse Overlay Sampling Plans: An Evaluation of Methods and Algorithms for Optimizing Overlay Quality Control and Metrology Tool Throughput, SPIE vol. 3677, 72:82, 1999.

Preil et al., "A New Approach to Correlating Overlay and Yield", Proc. of SPIE Conference on Metrology, Inspection, and Process Control for Microlithography XIII, pp. 208-216, Mar. 1999.

Press et al., Numerical Recipes, The Art of Scientific Computing, Cambridge University Press, 52:64, 1990.

Press et al., Numerical Recipes, The Art of Scientific Computing, Cambridge University Press, 509:520, 1990.

Progler et al., Method to Budget and Optimize Total Device Overlay, SPIE vol. 3679, 193:207, 1999.

Quaestor Q7, "Fully Automated Optical Metrology System for Advanced IC Production", Quaestor Q7 Product Specification, BIO-RAD 2 pages, 2001.

Raugh, "Error Estimation for Lattice Methods of State Self-Calibration", SPIE, 3050:614-625 1997.

Starikov et al., Accuracy of Overlay Measurements: Tool and Mark Asymmetry Effects, Optical Engineering, 1298:1309, 1992.

Starikov, "Metrology of Image Placement", Handbook of Silicon Semiconductor Metrology, pp. 411-475, 2001.

Sullivan, "Semiconductor Pattern Overlay", Proc. of SPIE Critical Reviews, vol. CR52, pp. 160-188; 1997.

Takac et al, "Self-Calibration in Two-Dimensions: The Experiment", SPIE, 2725:130-146 1996.

M. van den Brink et al, Direct-Referencing Automatic Two-Points Reticle-to-Wafer Alignment Using a Projection Column Servo System, SPIE vol. 633, Optical Microlithography V, 60:71, 1986.

M. van den Brink et al., "Matching Management of Multiple Wafer Steppers Using a Stable Standard and a Matching Simulator", Proc. of SPIE, vol. 1087, pp. 218-232, 1989.

M. van den Brink et al. "Matching of Multiple Wafer Steppers for 0.35 micron Lithography Using Advanced Optimization Schemes", Proc. of SPIE, vol. 1926, pp. 188-207, 1993.

van den Brink et al., Matching Performance for Multiple Wafer Steppers using an Advanced Metrology Procedure, SPIE vol. 921, 180:197, 1988.

van den Brink et al, New 0.54 Aperture I-Line Wafer Stepper with Field by Field Leveling Combined with Global Alignment, SPIE vol. 1463, 709:724, 1991.

van den Brink et al., Step and Scan and Step and Repeat, a Technology Comparison, SPIE vol. 2726, 734:753, 2001.

van Schoot, 0.7 NA DUV Step and Scan System for 150nm Imaging with Improved Overlay, SPIE vol. 3679, 448:463, 1999.

Yost et al., Lens Matching and Distortion Testing in a Multi-Stepper, Sub-Micron Environment, SPIE vol. 1087, 233:244, 1989.

Zavecz, Life Beyond Mix-and-Match: Controlling Sub-0.18 Micron Overlay Errors, Semiconductor International, Jul. 2000.

Zavecz, "Machine Models and Registration", SPIE Critical Reviews of Optical Science and Technology, CR52:134-159 (1994).

Zych et al., Electrical Methods for Precision Stepper Column Optimization, SPIE vol. 633, 98:105, 1986.

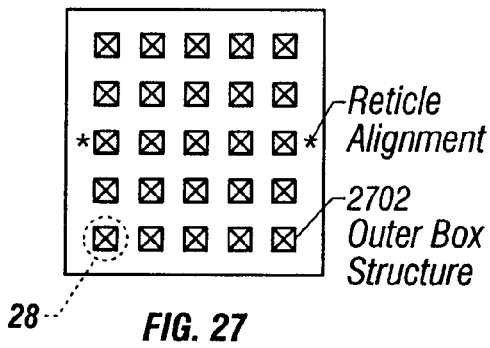
FIG. 27
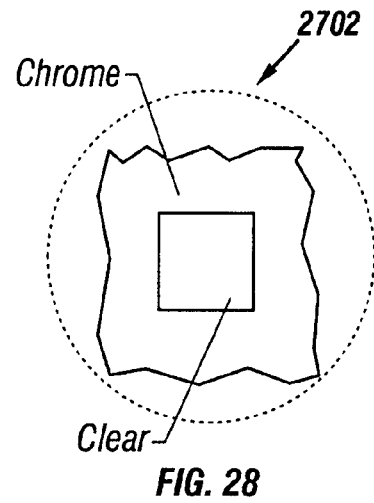
FIG. 28
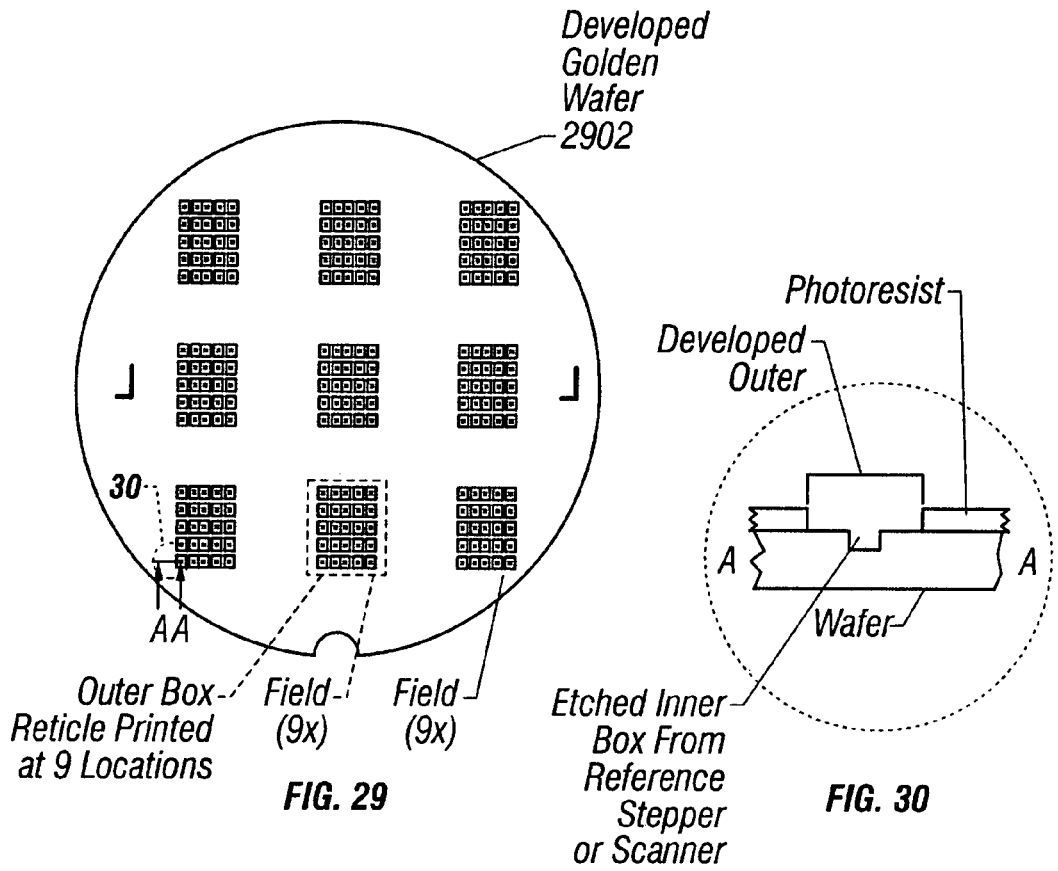
FIG. 29
FIG. 30

| Feature | xG | yG | dx | dy |
|---|---|---|---|---|
| M1 | -95.000000 | 0.000000 | 0.000050 | -0.000037 |
| M2 | 0.000000 | -95.000000 | -0.000387 | 0.000298 |
| M3 | 95.000000 | 0.000000 | 0.000499 | -0.000799 |
| M4 | 0.000000 | 95.000000 | 0.000174 | 0.000274 |
| RM | 10.000000 | 10.000000 | 0.000598 | 0.000420 |
| RM | 10.000000 | 20.000000 | 0.000495 | -0.000229 |
| ⋮ | ⋮ | ⋮ | ⋮ | ⋮ |
| RM | -60.000000 | -80.000000 | 0.000339 | 0.000449 |

52 Entries For Wafer of Figure 33

Pits in Wafer
FIG. 35A
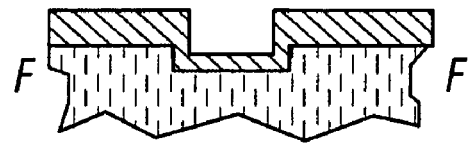
Pits in Wafer Overcoated
FIG. 35D
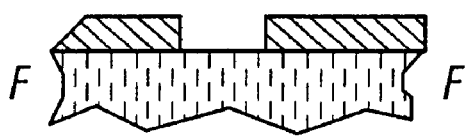
Pits in Overcoating
FIG. 35B
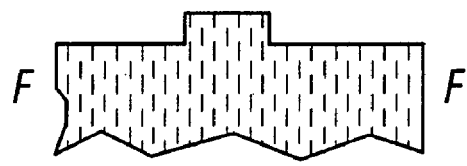
Mound in Wafer
FIG. 35E
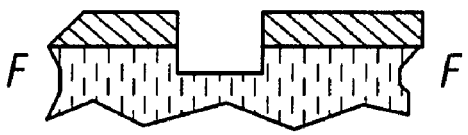
Pits in Overcoating & Wafer
FIG. 35C
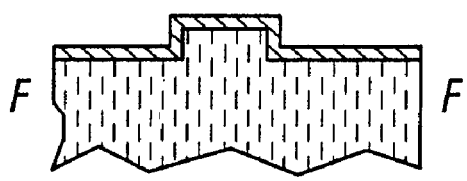
Overcoated Mound on Wafer
FIG. 35F
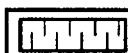 = Si or Substrate
 = Deposited of Overcoat Layer Wafer Serial #: W5077J4Q

| XW | YW | ΔX(AW) | ΔY(AW) |
|---|---|---|---|
| −10000 | −90000 | −0.013 | +0.021 |
| . | . | . | . |
| . | . | . | . |
| . | . | . | . |

Figure 47

REFERENCE WAFER CALIBRATION RETICLE

CROSS REFERENCE TO RELATED APPLICATIONS

This application is a continuation of U.S. application Ser. No. 11/371,514 filed on Mar. 8, 2006 now U.S. Pat. No. 7,261,983, which is a continuation-in-part of U.S. application Ser. No. 10/765,223 filed Jan. 26, 2004, now U.S. Pat. No. 7,160,657 which is a divisional application of U.S. application Ser. No. 10/020,569 filed Dec. 7, 2001, now U.S. Pat. No. 6,699,627 all of which claim priority to U.S. Provisional Application No. 60/254,315 filed Dec. 8, 2000; U.S. Provisional Application No. 60/254,271 filed Dec. 8, 2000 and U.S. Provisional Application Ser. No. 60/254,413 filed Dec. 8, 2000, all of which are incorporated by reference in their entirety herein.

BACKGROUND

1. Field of the Invention

The present invention relates generally to processes for semiconductor manufacture and more particularly to semiconductor pattern overlay.

2. Description of Related Art

Lithographic processing is increasingly requiring ever tighter layer-to-layer overlay tolerances to meet device performance requirements. Overlay registration on critical layers can directly impact device performance, yield and repeatability. Increasing device densities, decreasing device feature sizes and greater overall device size conspire to make pattern overlay one of the most important performance issues during the semiconductor manufacturing process. The ability to accurately determine correctable and uncorrectable pattern placement error depends on fundamental techniques and algorithms used to calculate lens distortion, stage error, and reticle error.

Overlay registration generally refers to translational error that exists between features exposed layer to layer in a vertical fabrication process of semiconductor devices on silicon wafers. Other names for overlay registration include, registration error and pattern placement error. A typical microelectronic device or circuit may consist of 20-30 levels or pattern layers. The placement of patterned features on other levels must match the placement of corresponding features on other levels, commonly referred to as overlap, within an accuracy which is some fraction of the minimum feature size or critical dimension (CD).

Overlay error is typically, although not exclusively, measured with an optical overlay metrology tool. See Semiconductor Pattern Overlay, N. Sullivan, SPIE Critical Reviews Vol. CR52, 160:188 1997; Accuracy of Overlay Measurements: Tool and Mark Asymmetry Effects, A. Starikov et al., Optical Engineering, 1298:1309, 1992; KLA 5105 Overlay Brochure, KLA-Tencor; KLA 5200 Overlay Brochure, KLA Tencor; Quaestor Q7 Brochures, Bio-rad Semiconductor Systems. Lithographers have crafted a variety of analysis techniques that attempt to separate out systematic process induced overlay error from random process induced error using a variety of statistical methods. See A Computer Aided Engineering Workstation for Registration Control, E. McFadden, C. Ausschnitt, SPIE Vol. 1087, 255:266, 1989; A "Golden Standard" Wafer Design for Optical Stepper Characterization, K. Kemp, C. King, W. Wu, C. Stager, SPIE Vol. 1464, 260:266, 1991; Matching Performance for Multiple Wafer Steppers using an Advanced Metrology Procedure, M. Van den Brink et al., SPIE Vol. 921, 180:197, 1988; Characterizing Overlay Registration of Concentric 5× and 1× Stepper Exposure Fields Using Interfield Data, F. Goodwin, J. Pellegrini, SPIE Vol. 3050, 407:417, 1997; Super Sparse Overlay Sampling Plans: An Evaluation of Methods and Algorithms for Optimizing Overlay Quality Control and Metrology Tool Throughput, J. Pellegrini, SPIE Vol. 3677, 72:82, 1999.

The importance of overlay error and its impact to yield can be found elsewhere. See Measuring Fab Overlay Programs, R. Martin, X. Chen, I. Goldberger, SPIE Conference on Metrology, Inspection, and Process Control for Microlithography XIII, 64:71, March 1999; A New Approach to Correlating Overlay and Yield, M. Preil, J. McCormack, SPIE Conference on Metrology, Inspection, and Process Control for Microlithography XIII, 208:216, March 1999. Lithographers have created statistical computer algorithms (for example, Klass II (See Lens Matching and Distortion Testing in a Multi-Stepper, Sub-Micron Environment, A. Yost et al., SPIE Vol. 1087, 233:244, 1989) and Monolith (See A Computer Aided Engineering Workstation for Registration Control, supra)) that attempt to separate out correctable sources of pattern placement error from non-correctable sources of error. See Analysis of overlay distortion patterns, J. Armitage, J. Kirk, SPIE Vol. 921, 207:221, 1988; Method to Budget and Optimize Total Device Overlay, C. Progler et al., SPIE Vol. 3679, 193:207, 1999; and System and Method for Optimizing the Grid and Intrafield Registration of Wafer Patterns, J. Pellegrini, U.S. Pat. No. 5,444,538. Overall theoretical reviews of overlay modeling can be found in See Semiconductor Pattern Overlay, supra; Machine Models and Registration, T. Zavecz, SPIE Critical Reviews Vol. CR52, 134:159.

Typically, most overlay measurements are made on silicon product wafers after each lithographic process, prior to final etch. Product wafers cannot be etched until the alignment attributes or overlay target patterns are properly aligned to the underlying overlay target patterns. Examples of overlay targets are described in Overlay Alignment Measurement of Wafers, N. Bareket, U.S. Pat. No. 6,079,256 (at FIG. 1b), Matching Management of Multiple Wafer Steppers Using a Stable standard and a Matching Simulator, M. Van den Brink et al., SPIE Vol. 1087, 218:232, 1989; Automated Electrical Measurements of Registration Errors in Step and Repeat Optical Lithography Systems, T. Hasan et al., IEEE Transactions on Electron Devices, Vol. ED-27, No. 12, 2304:2312, December 1980; Method of Measuring Bias and Edge Overlay Error for Sub 0.5 Micron Ground Rules, C. Ausschnitt et al., U.S. Pat. No. 5,757,507; Capacitor Circuit Structure for Determining Overlay Error, K. Tzeng et al., U.S. Pat. No. 6,143,621.

Generally, manufacturing facilities rely heavily on exposure tool alignment, wafer stage matching and calibration procedures (See Stepper Matching for Optimum Line Performance, T. Dooly, Y. Yang, SPIE Vol. 3051, 426:432, 1997; Matching Management of Multiple Wafer Steppers Using a Stable standard and a Matching Simulator, supra), Matching Performance for Multiple Wafer Steppers using an Advanced Metrology Procedure, supra) to help insure that the stepper or scanner tools are aligning properly; inaccurate overlay modeling algorithms can corrupt the exposure tool calibration procedures and degrade the alignment accuracy of the exposure tool system. See Characterizing Overlay Registration of Concentric 5× and 1× Stepper Exposure Fields Using Interfield Data, supra.

Over the past 30 years the microelectronics industry has experienced dramatic, and rapid decreases in critical dimension in part due to improving lithographic imaging systems. See A New Lens for Submicron Lithography and its Consequences for Wafer Stepper Design, J. Biesterbos et al., SPIE Vol. 633, Optical Microlithography V, 34:43, 1986; New 0.54 Aperture I-Line Wafer Stepper with Field by Field Leveling Combined with Global Alignment, M. Van den Brink, B. Katz, S. Wittekoek, SPIE Vol. 1463, 709:724, 1991; Step and Scan and Step and Repeat, a Technology Comparison, M. Van den Brink et al., SPIE Vol. 2726, 734:753; 0.7 NA DUV Step and Scan System for 150 nm Imaging with Improved Overlay, J. V. Schoot, SPIE Vol. 3679, 448:463, 1999. Today, these photolithographic exposure tools or machines are pushed to their performance limits. As the critical dimensions of semiconductor devices approach 50 nm the overlay error requirements will soon approach atomic dimensions. See Life Beyond Mix-and-Match: Controlling Sub-0.18 Micron Overlay Errors, T. Zavecz, Semiconductor International, July 2000. To meet the needs of next generation device specifications new overlay methodologies need to be developed. In particular, overlay methodologies that can accurately separate out systematic and random effects and break them into assignable causes may greatly improve device process yields. See A New Approach to Correlating Overlay and Yield, supra; Expanding Capabilities in Existing Fabs with Lithography Tool-Matching, F. Goodwin et al., Solid State Technology, 97:106, June 2000; Super Sparse Overlay Sampling Plans: An Evaluation of Methods and Algorithms for Optimizing Overlay Quality Control and Metrology Tool Throughput, supra; Lens Matching and Distortion Testing in a Multi-Stepper, Sub-Micron Environment, supra.

New "mix and match" technologies that can quickly and accurately reduce the registration error through better calibration and cross referencing procedures are desirable. See Mix-and-Match: A Necessary Choice, R. DeJule, Semiconductor International, 66:76, February 2000.

SUMMARY

In accordance with the invention, a process for manufacturing, using, and maintaining a calibrated registration reference wafer for use in semiconductor manufacturing facilities is described. An embodiment, a technique of calibrating an archive media; includes an archive media which includes etched alignment attributes. A pattern of complementary alignment attributes is exposed onto the archive media such that the pattern of complementary alignment attributes overlay and interlock with the etched alignment attributes thereby forming completed alignment attributes. Then, offsets in the completed alignment attributes are measured and a calibration file for the archive media is constructed based upon the offset measurements and dynamic intrafield lens distortion data of a lens used to expose the pattern of complementary alignment attributes, and calibration error of the complementary alignment attributes.

Another embodiment of a technique of calibrating an archive media includes an archive media which includes etched alignment attributes. A pattern of a calibration reticle is exposed onto the archive media, wherein the pattern of the calibration reticle includes complementary alignment attributes. The pattern of the calibration reticle is positioned such that the pattern of complementary alignment attributes overlay and interlock with the etched alignment attributes thereby forming interlocking rows and columns of completed alignment attributes between adjacent static calibration reticle exposure fields. Then, offsets in the completed alignment attributes are measured and a calibration file for the archive media constructed based upon the offset measurements and intrafield lens distortion data of a lens used to expose the pattern of complementary alignment attributes, and a manufacturing error data for the calibration reticle.

Still another embodiment of a technique of calibrating an archive media includes an archive media which includes etched alignment attributes. A pattern of a calibration reticle is exposed onto the archive media, wherein the pattern of the calibration reticle includes central overlay groups and offset overlay groups. The calibration reticle is positioned such that the pattern is positioned so that a complementary alignment attribute of the central overlay group interlocks with an etched alignment attribute thereby forming a completed alignment attribute archive, and attributes in adjacent exposures of the calibration reticle pattern interlock with complementary alignment attributes of the offset overlay groups thereby forming completed alignment attributes calibration. Then, offsets in the completed alignment attribute archive and completed alignment attribute calibration are measured, and a calibration file for the archive media is constructed based upon the offset measurements and manufacturing error data for the calibration reticle.

The exposures in the embodiments can be performed in a static mode or in a dynamic mode. The exposures can be multiple sub-nominal exposures. For example, the reticle may be partially transmitting. In addition, the exposures may be performed by a stepper machine, a step and scan machine, or a two dimensional scanner machine.

The archive media may be a silicon wafer, a flat panel display, a reticle, or electronic media. In addition, the embodiments may include exposing z-height mapping structures onto the archive media.

Also, constructing a calibration file for the archive media may be further based upon a combined effect of a source and exit pupil non-telecentricity of a projection imaging tool used in exposing the pattern of the calibration reticle onto the archive media. In addition, constructing a calibration file for the archive media may be further based upon a lens aberration of a projection imaging tool used in exposing the pattern of the calibration reticle onto the archive media.

In addition, the embodiments may include exposing z-height mapping structures onto the archive media. Also, constructing a calibration file for the archive media may be further based upon a focus variation of a projection imaging tool used in exposing the pattern of the calibration reticle onto the archive media.

A reticle for use in calibrating an archive media may include a pattern of complementary alignment attributes that are exposed onto an archive media such that the pattern of complementary alignment attributes overlay and interlock with the etched alignment attributes on the archive thereby forming completed alignment attributes. Then, measurements of offsets in the completed alignment attributes may be used to construct a calibration file for the archive media based upon the offset measurements and dynamic intrafield lens distortion data of a lens used to expose the pattern of complementary alignment attributes, and calibration error of the complementary alignment attributes.

A calibration reticle for use in calibrating an archive media may include a pattern exposed onto an archive media, wherein the pattern of the calibration reticle includes complementary alignment attributes. The reticle may be positioned such that the pattern of complementary alignment attributes overlay and interlock etched alignment attributes on the archive media, thereby forming interlocking rows and columns of completed alignment attributes between adjacent static calibration reticle exposure fields. Measurements of offsets in the completed alignment attributes may be used to construct a calibration file for the archive media based upon the offset measurements and intrafield lens distortion data of a lens used to expose the pattern of complementary alignment attributes, and manufacturing error data for the calibration reticle.

An embodiment of a technique of manufacturing a reference substrate on a projection imaging tool includes at least one reticle that include interlocking rows and columns of alignment attributes. The reticle is exposed onto a substrate that includes a recording media in a pattern such that adjacent exposures create a pattern of interlocking alignment attributes. Then overlay errors of desired alignment attributes are measured and positional coordinates of the desired alignment attributes are calculated with respect to intra-field error data and overlay errors. Then a calibration file associated with the reference substrate is created that records the positional coordinates of the alignment attributes.

BRIEF DESCRIPTION OF THE DRAWINGS

The features of this invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction the accompanying drawings in which:

FIG. 27 is a schematic showing an outer box reticle.

FIG. 28 is a schematic showing additional detail of an outer box reticle.

FIG. 29 is a schematic showing an example of a golden wafer for overlay measurement.

FIG. 30 is a cross section of a box-inbox.

FIGS. 35A-35F are cross sectional views of a reference wafer.

FIG. 47 shows an example of a final archive wafer calibration file.

DETAILED DESCRIPTION

In accordance with the invention, a process for manufacturing, using, and maintaining a calibrated registration reference wafer for use in semiconductor manufacturing facilities is described. A reference reticle consisting of, for example, a 2-dimensional array of standard alignment attributes is exposed in an interlocking field pattern onto a photoresist coated semiconductor wafer using a photolithographic exposure tool. Following the lithographic development process, the resist patterned wafer is physically etched using standard techniques, thereby creating a permanent record of the alignment attribute exposure pattern. Along the interlocking rows and columns of the resulting wafer, the permanently recorded alignment attributes are measured for placement error using a conventional overlay metrology tool. The resulting overlay error data may be used, for example, in a software program, to generate a unique reference wafer calibration file that contains the positions of all the reference marks (alignment attributes) forming an uninterrupted, regular array across the wafer as well as the wafer alignment marks. The positions of these alignment attributes on the reference wafer can be determined very accurately, except for the possibility of arbitrary translation, rotation, asymmetric scaling and non-orthogonal positional offset errors.

The reference wafer and its associated calibration file can be used to determine the wafer stage registration performance for any photolithographic exposure tool. The accuracy and the precision of the calculated registration error are controlled, in large part, by the number of alignment attributes and overlay measurements. In addition, the process can be quickly repeated resulting in multiple reference wafers. Because of the ease of manufacture of this article, each photolithographic exposure tool in a semiconductor factory can have its own unique reference wafer for routine monitoring. Furthermore, the method of calculating the positional coordinates of the alignment attributes for the preferred reference wafer are more accurate and precise as compared to other techniques. The reference wafer, and its associated calibration file, may then be used as a calibrated ruler for measuring registration error induced by any photolithographic exposure tool, independently from a reference machine. Because a conventional overlay metrology tool is used for local measurements to extract global wafer stage and lens distortion, the above described process can be easily implemented in a semiconductor fabrication facility. Additional applications of the resulting calibrated reference wafers include; improved lithographic simulation using conventional optical modeling software, advanced process control in the form of feedback loops that automatically adjust the projection lens, reticle stage, and wafer stage for optimum registration performance.

Figures 33, 34:
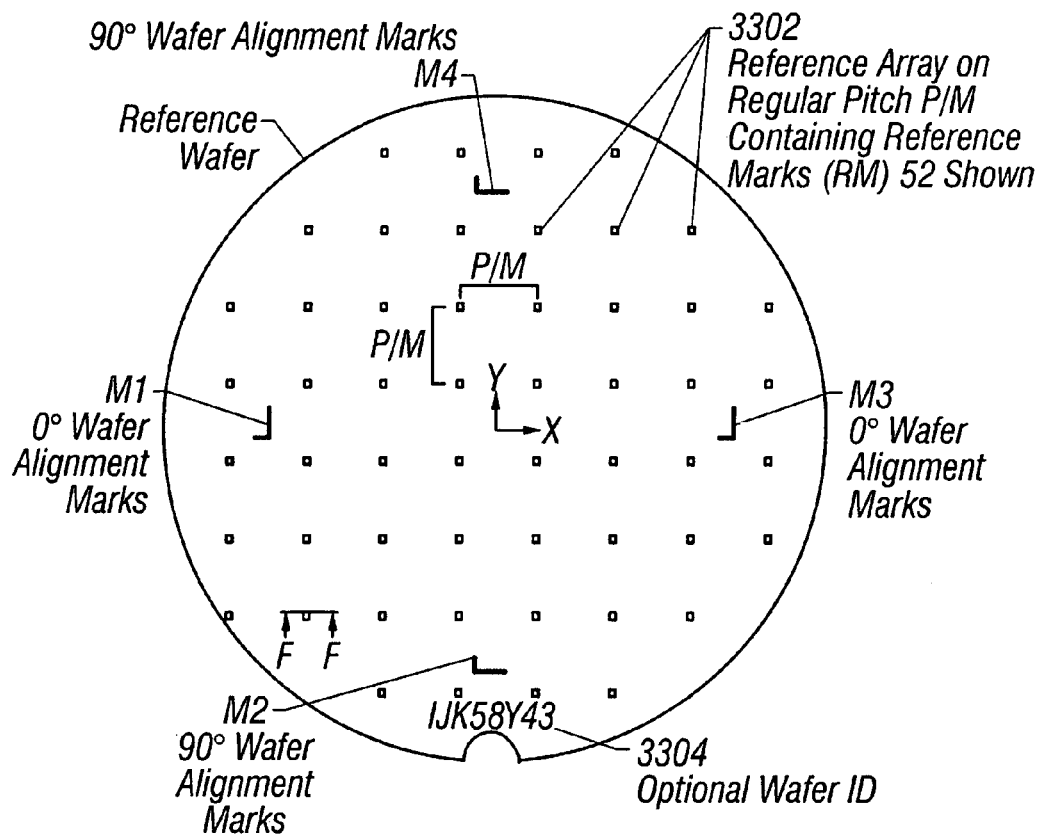
FIG. 33 is a schematic showing the operational portions of a completed reference wafer.
FIG. 34 is a block diagram showing an exemplary calibration file for a reference wafer.

The reference wafer, or archive wafer, and its associated calibration file functions as a "ruler" and it can be used like a traditional "golden wafer" in the sense that an exposure of the reference marks 3302 illustrated in FIG. 33, by any lithographic projection tool. For example, a set of complementary marks like the outer box 2702, illustrated in FIGS. 27 and 28 or the outer box 1302 and inner box 1304 marks illustrated in FIGS. 13A and 13B, result in a box-in-box structure or complete alignment attribute that can be measured with a conventional overlay metrology tool. Using the measurements from the overlay metrology tool and subtracting the corrections provided by the reference wafer calibration file from the overlay measurements, the combination of the intra-field and the inter-field errors of a machine can be directly interpreted. By accounting for stage distortion and yaw effects during the determination of the calibration, the inherent machine-to-machine reference errors of the prior art golden wafer method are effectively eliminated. See A "Golden Standard" Wafer Design for Optical Stepper Characterization, supra; Matching Management of Multiple Wafer Steppers Using a Stable standard and a Matching Simulator, supra.

Improvement in the measurement accuracy reduces the need for cross calibration between different photolithographic exposure tool sets and allows direct interpretation, after calibration file correction, of the results of a set of overlay measurements using the reference wafer. Errors in the overlay measurements due to the exposure of the present machine and not as due to systematic or random errors associated with the machine on which the reference wafer was manufactured. The technique described above can adjust the accuracy by adjusting the number of alignment attributes or overlay measurements.

A technique in accordance with the present invention includes providing a reticle, exposing a reference wafer in such a way as to create a unique pattern of overlapped interlocking alignment attributes, etching the reference wafer, measuring the interlocked alignment attributes, and finally creating a reference wafer calibration file that permanently records the positional coordinates of the alignment attributes. Additionally, other embodiments may allow production of a robust set of reference wafers for manufacturing facilities that use scanners in addition to steppers. For this case, we minimize the non-repeatable source of intra-field error associated with the moving scanner stage during the exposure of the reference wafer by using a special reticle and multiple exposures. By utilizing a high precision overlay metrology tool for local measurements and extracting a global set of calibrated positional measurements, the metrology error multiplier can be kept near unity.

Figure 6:
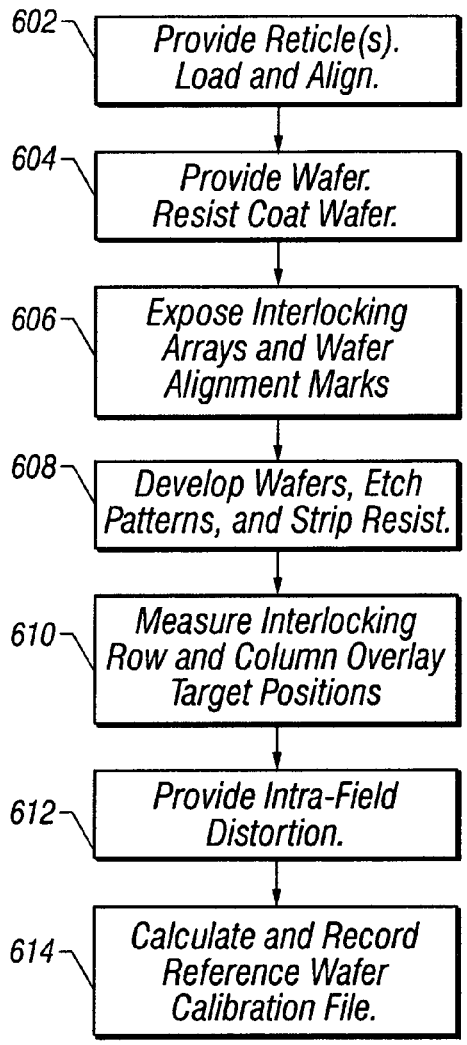
FIG. 6 is a flowchart of an embodiment for creating reference wafers.
Figure 10:
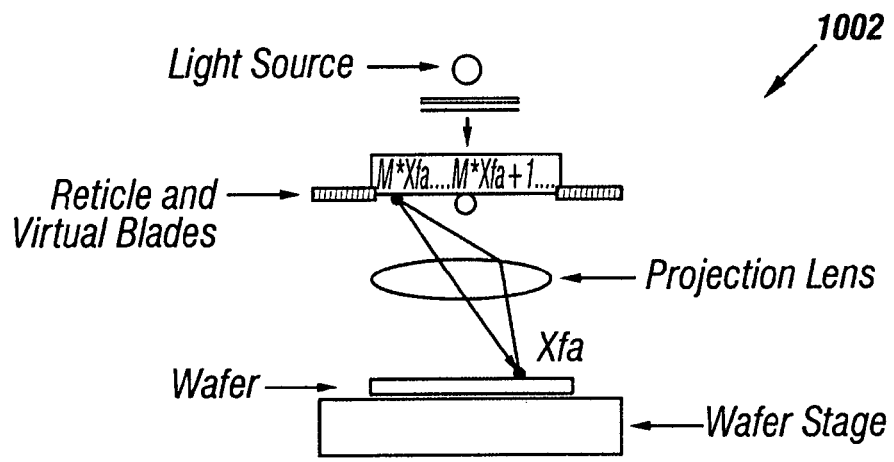
FIG. 10 is a block diagram showing a photolithographic stepper or scanner system.

FIG. 6 is a flowchart illustrating an embodiment for creating a reference wafer. In block 602, a reference reticle, for example the reticle illustrated in FIGS. 13A, 13B, 13C, and 14 containing an array of alignment attributes 1302, 1304, 1306 and wafer alignment marks 1308, is loaded into an exposure tools' reticle management system 1002, as illustrated in FIG. 10, and aligned. Wafers possibly laser or otherwise scribed with unique wafer identification codes and possibly coated with various thin films are provided. Examples of such thin films on silicon wafers are silicon nitride, silicon dioxide, amorphous silicon, or polysilicon.

Figure 12:
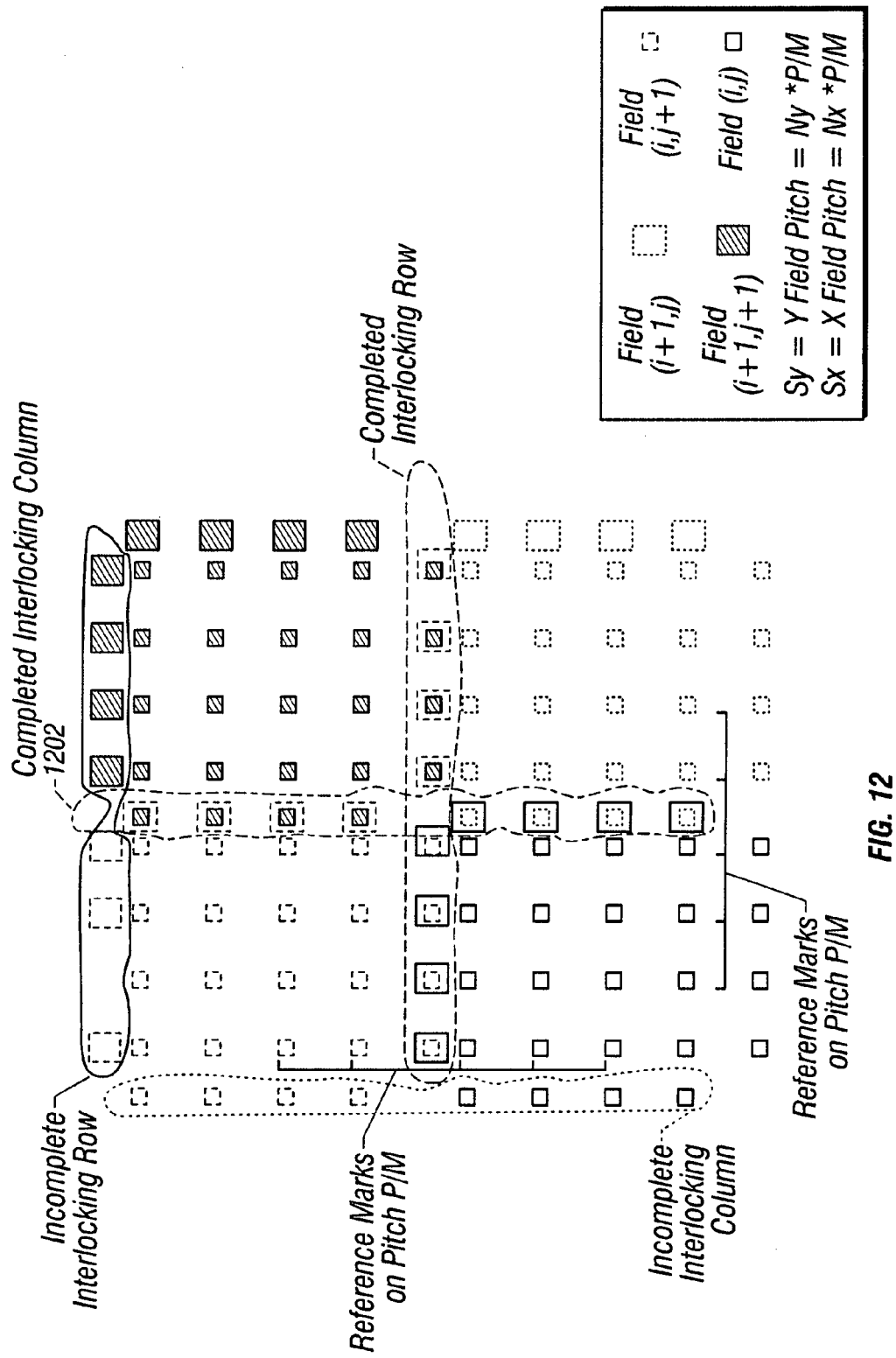
FIG. 12 is a schematic showing additional detail of the interlocking of fields in X and Y directions on reference wafers.
Figure 16A:
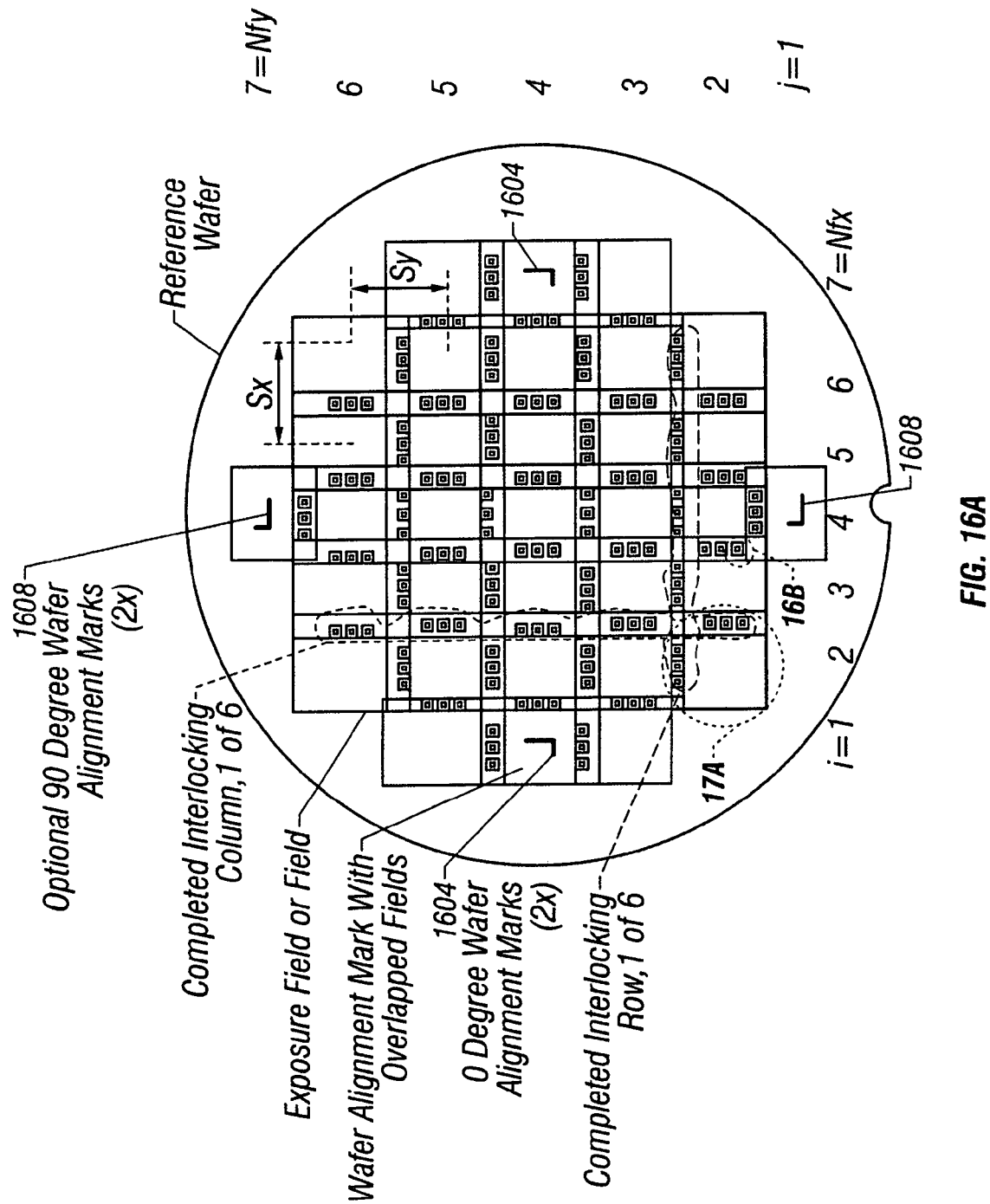
FIG. 16A is a schematic showing a tiled or interlocking schematic of the reference wafer.

Flow continues to block 604 where the wafer is then coated with photoresist and loaded into a projection imaging tool or machine and exposed, in block 606, in an overlapping interlocking pattern. Examples of overlapping interlocking patterns are illustrated in FIGS. 12 and 16A. The projection imaging tool may include contact or proximity printers, steppers, scanners, direct write, e-beam, x-ray, SCALPEL, IPL, or EUV machines. See Direct-Referencing Automatic Two-Points Reticle-to-Wafer Alignment Using a Projection Column Servo System, M. Van den Brink, H. Linders, S. Wittekoek, SPIE Vol. 633, Optical Microlithography V, 60:71, 1986; New 0.54 Aperture I-Line Wafer Stepper with Field by Field Leveling Combined with Global Alignment, supra; Reference U.S. Pat. No. 4,861,148; Micrascan™ III Performance of a Third Generation, Catadioptric Step and Scan Lithographic Tool, D. Cote et al., SPIE Vol. 3051, 806:816, 1997; ArF Step and Scan Exposure System for 0.15 Micron and 0.13 Micron Technology Node, J. Mulkens et al., SPIE Conference on Optical Microlithography XII, 506:521, March 1999; 0.7 NA DUV Step and Scan System for 150 nm Imaging with Improved Overlay, supra; Optical Lithography—Thirty Years and Three Orders of Magnitude, J. Bruning, SPIE Vol. 3051, 14:27, 1997; Large Area Fine Line Patterning by Scanning Projection Lithography, H. Muller et al., MCM 1994 Proceedings, 100:104; Large-Area, High-Throughput, High-Resolution Projection Imaging System, K. Jain, U.S. Pat. No. 5,285,236 issued Feb. 8, 1994; Development of XUV Projection Lithography at 60-80 nm, B. Newnam et al., SPIE Vol. 1671, 419:436, 1992; Mix-and-Match: A Necessary Choice, supra. In the examples illustrated in FIGS. 12 and 16A, each exposure field is separated from the previous exposure by a desired distance such that neighboring fields have their corresponding interlocking rows or columns overlapped. See Mix-and-Match: A Necessary Choice, supra. This partially overlapping exposure technique is shown in FIGS. 12 and 16A. Following the exposures of the interlocking array, the wafer alignment marks and their corresponding interlocking rows and columns are exposed as separate fields but interlock into the previous exposure set.

Figure 9:
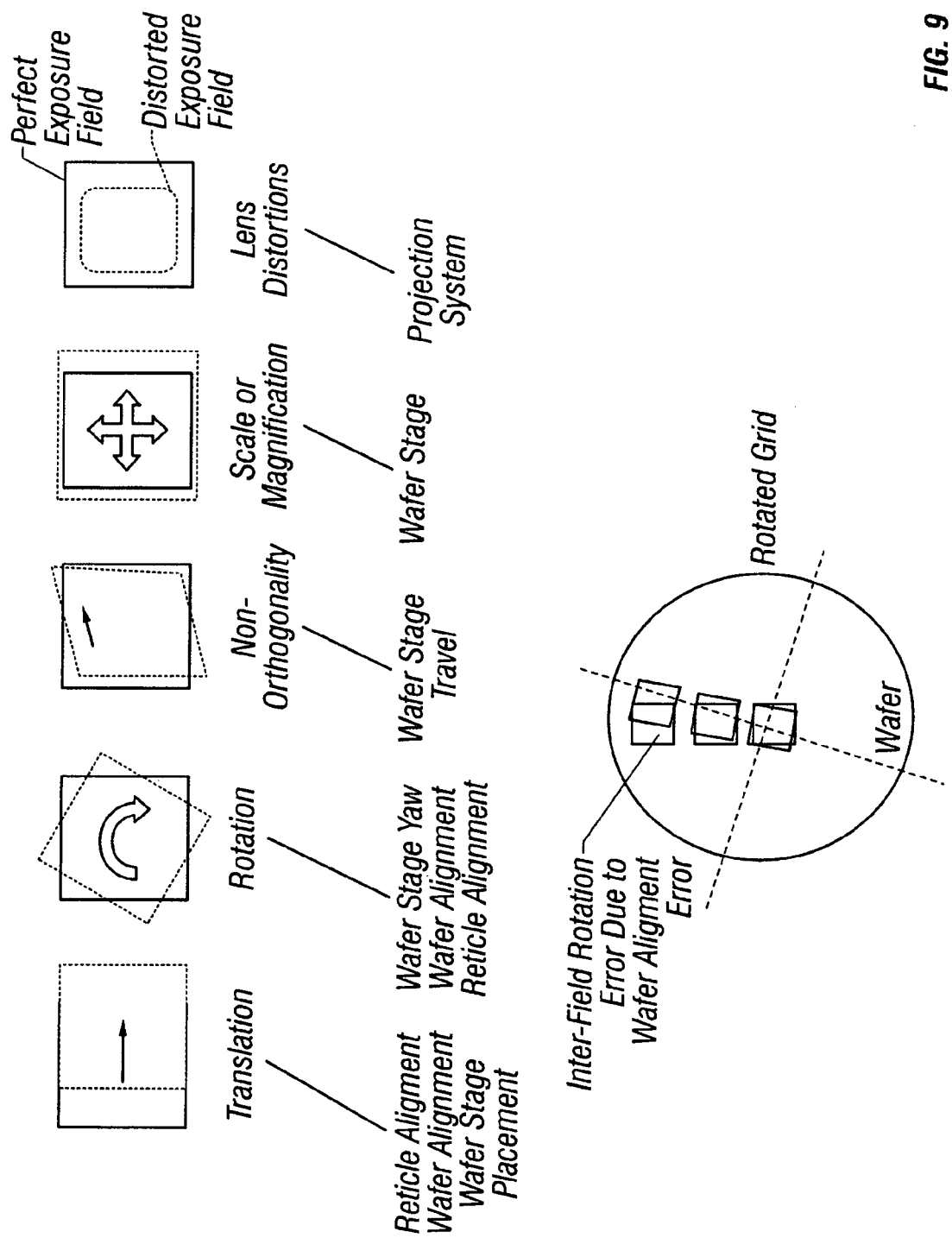
FIG. 9 is a block diagram illustrating common causes of overlay or placement error.

Flow then continues to block 608 where, after the final exposure the wafer is removed from the machine and sent through the final few resist development steps. Next, the wafers are etched and stripped of photoresist and possibly overcoated with another layer. This leaves the alignment attributes and wafer alignment marks permanently recorded on the wafer surfaces. Flow then continues to block 610 where the resulting alignment attributes along the interlocking rows and columns are measured for registration, placement or overlay error using an overlay metrology tool such as a KLA-Tencor model 5200. See KLA 5200 Overlay Brochure, supra; KLA 5105 Overlay Brochure, supra; Quaestor Q7 Brochures, supra; Process for Measuring Overlay Misregistration During Semiconductor Wafer Fabrication, I. Mazor et al., U.S. Pat. No. 5,438,413; Overlay Alignment Measurement of Wafers, supra. FIG. 9 is a schematic illustrating common causes of overlay or placement error for inter-field and intra-field.

Next, in block 612, the intra-field distortion of the projection imaging tool used to create the reference wafer is provided. Flow continues to block 614 when the resulting data set is entered into a computer algorithm where a special calibration file containing the positional coordinates for each alignment attribute is constructed for the reference wafer. The final articles as created by the present invention consist of a reference wafer containing reference marks on a periodic array interrupted only by wafer alignment marks as illustrated in FIG. 33, and a unique calibration file that lists the location of each reference and wafer alignment mark on the wafer as illustrated in FIG. 34. The process described above can be repeated multiple times resulting in numerous individual reference wafers. Once a calibration file is on record and the positions of each alignment attribute is known, the wafer can be used as a two dimensional (2-D) rigid ruler to measure the registration error associated with a given projection imaging tool—similar to the prior art golden wafer techniques. See A "Golden Standard" Wafer Design for Optical Stepper Characterization, supra. However, the preferred embodiment allows for the direct measurement of the overlay error unique to the machine being tested—without reference to another machine either directly or indirectly.

Figure 11A:
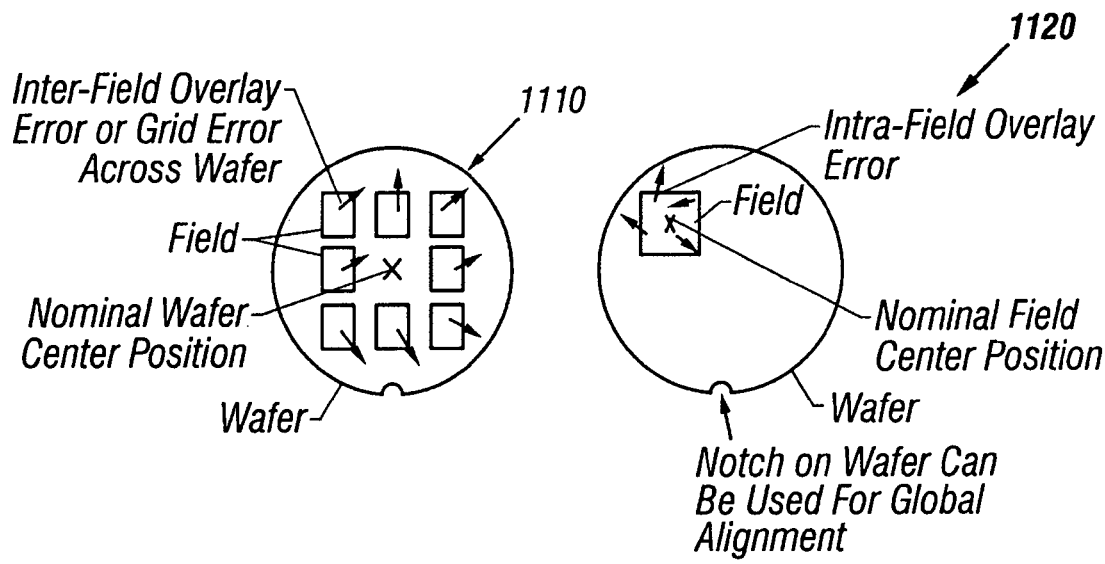
FIG. 11A is a schematic showing inter-field and intra-field overlay error.
Figure 11B:
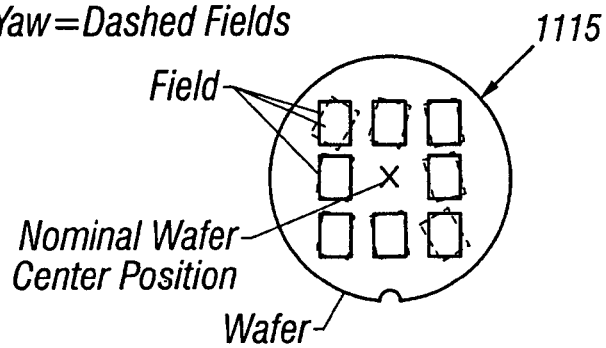
FIG. 11B is a schematic showing inter-field yaw error.

The effects of overlay error are typically divided into two major categories for the purpose of quantifying overlay error and making precise exposure adjustments to correct the problem. The first category, referred to as grid or inter-field error, is the positional shift and rotation 1110 as illustrated in FIG. 11A, or yaw 115 as illustrated in FIG. 11B, of each exposure pattern, exposure field, or simply field, with reference to the nominal center position of the wafer. These global or inter-field positional errors may be caused by the wafer stage subsystem of the photolithographic exposure tool. Overlay modeling algorithms typically divide grid or inter-field error into various sub-categories or components the most common of which are translation, rotation, magnification or scale, non-orthogonality, stage distortion and stage rotation. See Matching Performance for Multiple Wafer Steppers using an Advanced Metrology Procedure, supra.

The second category, intra-field overlay error is the positional offset of an individual point inside an exposure field referenced to the nominal center of an individual exposure field 1120 in FIG. 11A. Generally, the term "nominal center" means the location of the center of a perfectly aligned exposure field; operationally this is the (x,y) position where the lithographic projection is commanded to print the exposure field (field). The following four components, each named for a particular effect, are typically used to describe the sources of intra-field error: translation, rotation, scale or magnification and lens distortion. Intra-field overlay errors are typically related to lens aberrations, reticle alignment, and dynamic stage errors for scanners. Separation of the overlay error into inter-field and intra-field components is based on the physically distinguishable sources of these errors, lens aberrations, dynamic stage errors, or reticle positioning for intra-field and the wafer stage for inter-field.

A process of creating and maintaining calibrated registration reference wafers that can be used to measure and determine the registration error associated with wafer stages and lenses of projection tools is described. The placement of patterned features on subsequent levels must match the placement of corresponding features on previous levels, i.e. overlap, within an accuracy which is typically some fraction of a minimum feature size or critical dimension (CD). Overlay registration is the localized translational error that exists between features exposed layer to layer in the vertical manufacturing process of semiconductor devices on silicon wafers. Overlay registration is also referred to as registration error or pattern placement error.

Figure 21:
FIG. 21 is a schematic showing overlay measurement notation.

Inter-field error can be divided into various components of which the six most commonly used are: translation, rotation, scale, non-orthogonality, wafer stage distortion and stage yaw. See Matching Performance for Multiple Wafer Steppers using an Advanced Metrology Procedure, supra. In order to measure and quantify the overlay error that exists between device layers special overlay target patterns may be printed in designated locations across the wafer at each lithographic processing step. If the two patterned layers are perfectly aligned to each other the overlay target patterns will be aligned with each other. For example if a box-in-box target pattern were used, a centered box-in-box structure 2102 as illustrated in FIG. 21 would result. Any positional offset or misalignment of the box-in-box target pattern 2104 is a measure of the overlay error, illustrated in FIG. 21.

Figure 1:
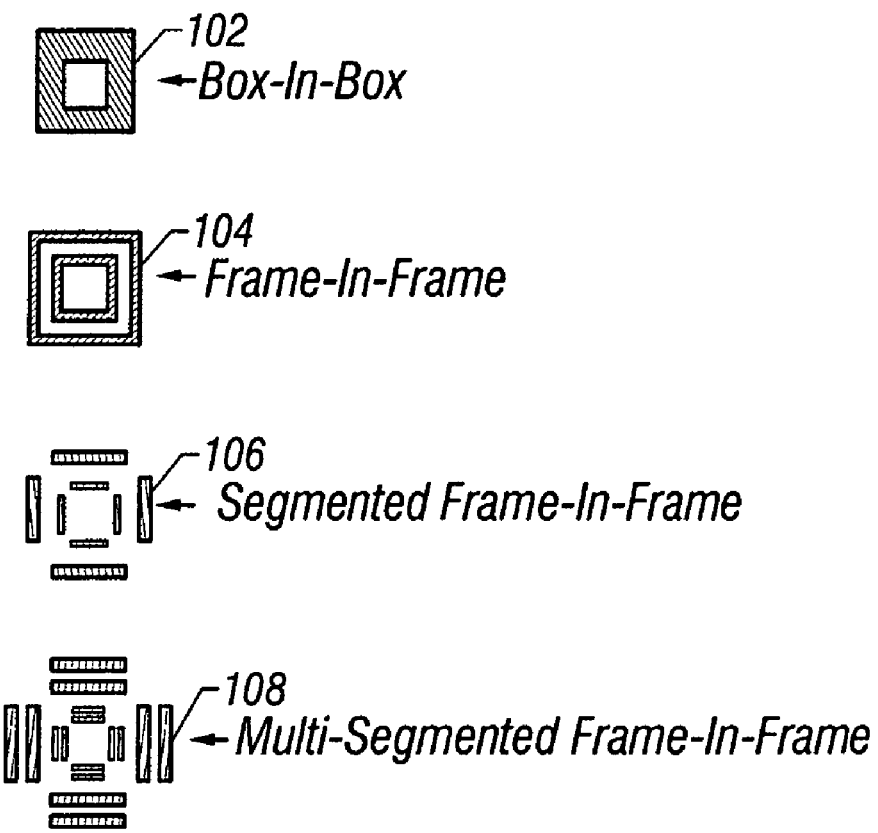
FIG. 1 is a schematic showing typical overlay patterns or completed alignment attributes.
Figure 2:
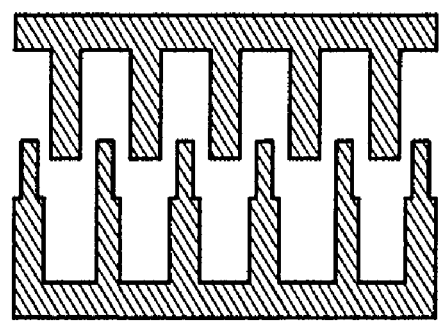
FIG. 2 is a schematic showing typical optical verniers.
Figures 18, 19, 20:
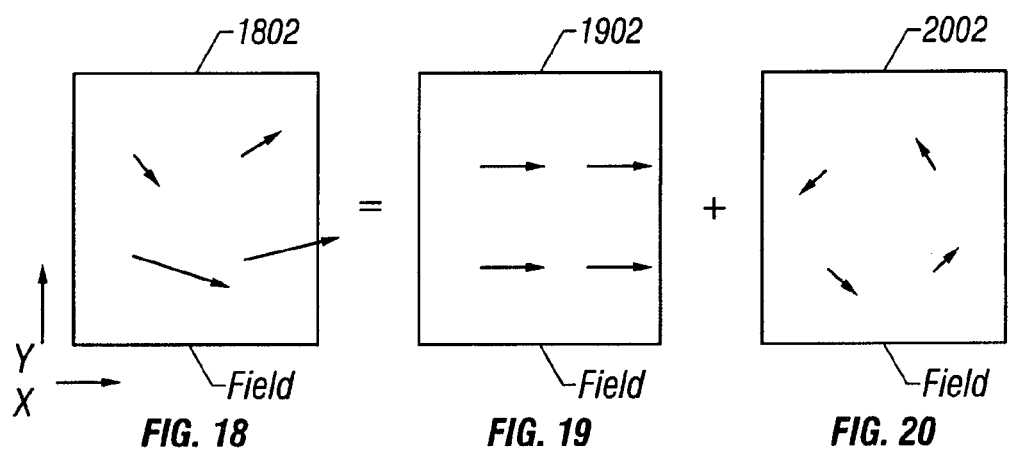
FIG. 18 is a schematic showing an overlay error vector plot.
FIG. 19 is a schematic showing a translation overlay vector plot.
FIG. 20 is a schematic showing a rotation overlay vector plot.

FIG. 1 shows a variety of different overlay target patterns. There are many types of alignment attributes or overlay target patterns, for example, a box-in-box 102, a frame-in-frame 104, a segmented frame-in-frame 106, and a multi-segmented frame-in-frame 108 as shown in FIG. 1, optical verniers as shown in FIG. 2, and gratings. The positional offset of these different target patterns is measured with a commercial optical overlay metrology tool. In some cases, the overlay error can be measured using the projection imaging tool's alignment system. See Matching Management of Multiple Wafer Steppers Using a Stable standard and a Matching Simulator, supra. Vector displacement plots as illustrated in FIGS. 18, 19 and 20, can be used to give a visual description of the direction and magnitude of overlay error are mathematically separated into different spatial components using a variety of regression routines. For example, an overlay plot 1802 illustrated in FIG. 18 includes a translation component 1902, illustrated in FIG. 19, plus a rotation component 2002, illustrated in FIG. 20.

There are many commercial software packages that can be used to model and statistically determine the intra-field error components for the purpose of process control and exposure tool set-up. See, for example, (Monolith (See A Computer Aided Engineering Workstation for Registration Control, supra), Klass II (Lens Matching and Distortion Testing in a Multi-Stepper, Sub-Micron Environment, supra)). Once determined, the intra-field error components are analyzed and used to adjust calibration constants of the wafer handling stage to improve pattern alignment. In addition, because different exposure tools are used to produce a given device the exposure tools must be matched or fingerprinted and adjusted so that registration errors unique to one tool are removed or minimized as much as possible. See Mix-and-Match: A Necessary Choice, supra.

Golden Wafers

Finding the relative magnitude of wafer stage placement error, commonly uses a process of creating and using a "golden wafer". Using a golden wafer, the wafer stage placement error can be measured semi-independent of other sources of registration error. Semiconductor manufacturing facilities typically use the resulting placement error information to manually or automatically adjust the wafer stage and stepper alignment system in such a way so as to minimize the impact of overlay error. See Matching Management of Multiple Wafer Steppers Using a Stable standard and a Matching Simulator, supra; Matching Performance for Multiple Wafer Steppers using an Advanced Metrology Procedure, supra.

Figure 3:
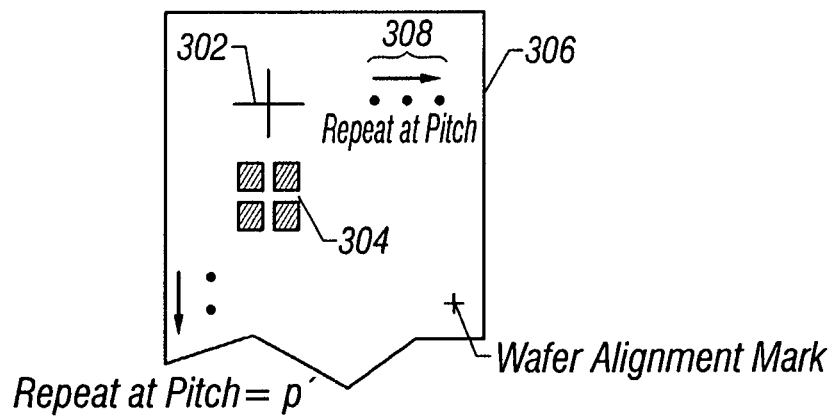
FIG. 3 is a schematic showing a reticle.
Figure 5A:
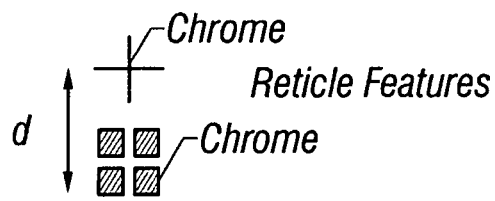
FIG. 5A is a schematic showing additional details of the reticle of FIG. 3.
Figure 5B:
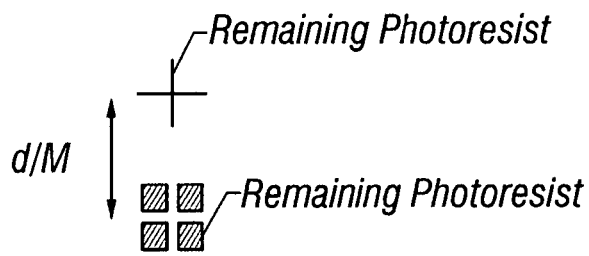
FIG. 5B is a schematic showing additional details of FIG. 5A in developed positive photoresist.

FIG. 3 shows a typical set of geometrically placed overlay target patterns consisting of a matching pair of male 302 and female targets 304. The male 302 and female 304 targets may be regularly spaced across a wafer stage test reticle 306 as shown in FIG. 3. FIGS. 5A and 5B show additional detail of the reticle shown in FIG. 3.

Figure 22:
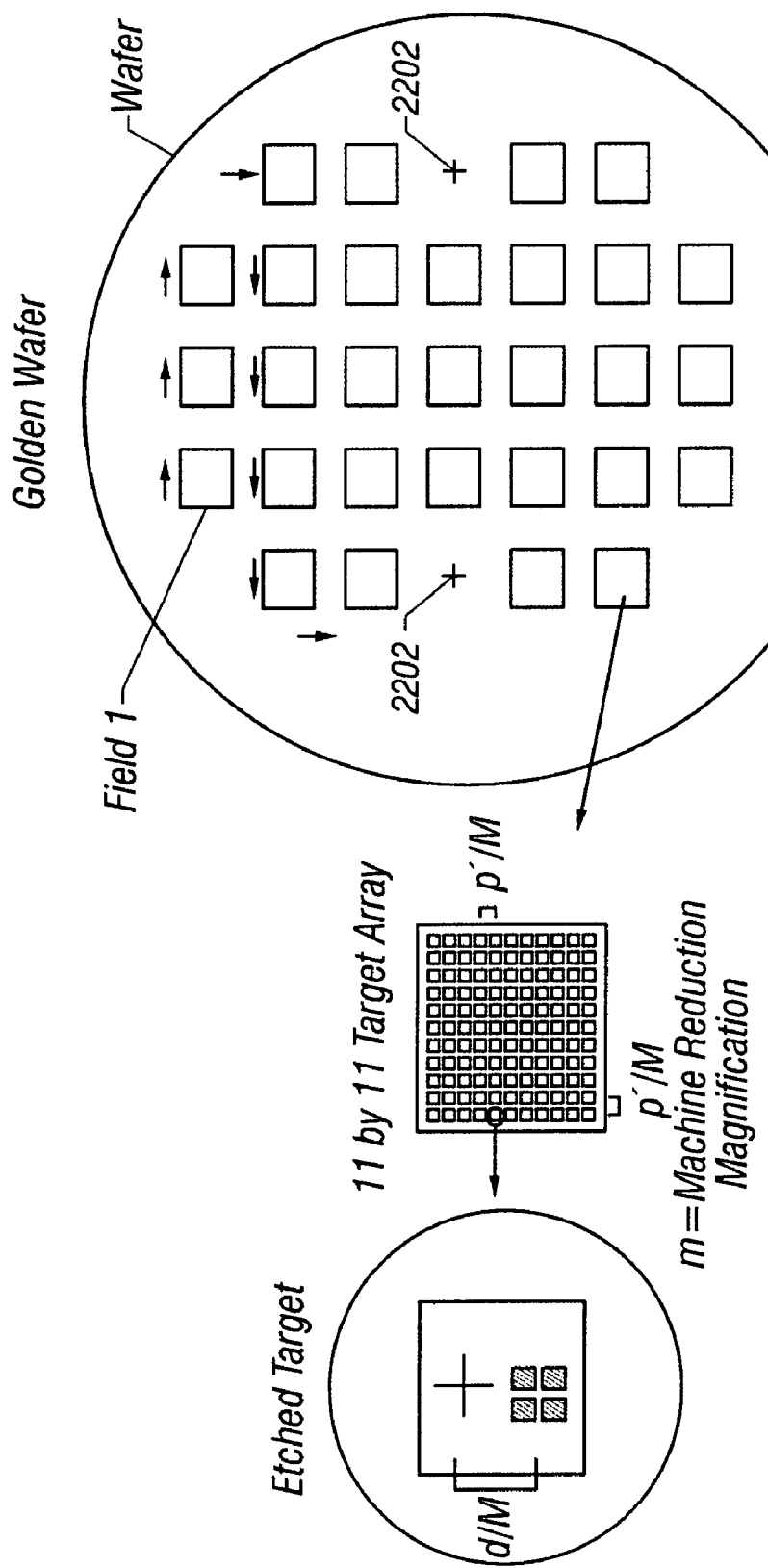
FIG. 22 is a schematic showing an example of a golden wafer.

It should be noted that typically the chrome target patterns on most reticles are 4 or 5 times larger as compared with the patterns they produce at the image plane, this simply means modern semiconductor projection imaging tools are reduction systems. Further, (by measuring the reticle and then applying these corrections) the overlay target patterns are placed in nearly perfect geometric positions on the wafer stage test reticle. For example, first, a photoresist coated wafer is loaded onto an exposure tool or stepper wafer stage and globally aligned. Next, the full-field image of the reticle is exposed several times at various positions across the surface of the photoresist coated wafer as illustrated in FIG. 22. In addition, several wafer alignment marks 2202 may also be printed across the wafer using the reticle as illustrated in FIGS. 3 and 22. For example, the full-field of the reticle 306 may consist of an 11 by 11 array of male 302 and female 304 targets evenly spaced at pitch p' 308, across the reticle surface [FIG. 3]. The pattern is then sent through the remaining portions of the lithographic patterning process to delineate the resist pattern. Finally, the patterned wafer is etched and the alignment attributes are permanently recorded in the wafer surface. This permanently etched wafer is called a golden wafer.

Figure 4:
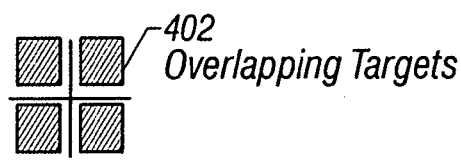
FIG. 4 is a schematic showing overlapped male and female target pairs.

In general, the golden wafer may be used to extract stage errors on any photolithographic exposure tool in the following way. The golden wafer is loaded onto the wafer stage in question and aligned into position using the previously placed wafer alignment marks 2202 illustrated in FIG. 22. Next, the wafer stage is moved so as to align the reticle 306 illustrated in FIG. 3 containing, for example, an 11 by 11 array of male targets 302 directly on top of the first full-field exposure pattern containing an 11 by 11 array of female 304 targets resulting in overlapping targets 402 as illustrated in FIG. 4 [FIGS. 4, 22]. Making these overlapping targets involves shifting the wafer onto the small increment d/M so male and female targets lie on top of one another. When the stepper has finished the alignment procedure the x,y wafer stage coordinates and overlay error associated with several male-female targets is electronically recorded. This step, align and record procedure is repeated across a desired portion of the wafer for each full-field 11 by 11 exposure pattern. The electronically recorded target coordinates and overlay errors may then be entered into a statistical modeling algorithm to calculate the systematic and random components of inter-field and intra-field overlay error. It is important to note that the resulting inter-field or wafer stage overlay error not yield the unique overlay error of the wafer stage in question. Rather, it can only be used to report the inter-field or wafer stage overlay error as referenced to a golden wafer that was produced on another reference machine. In general, semiconductor manufacturers always rely on some kind of stage matching or cross-referencing technique to calculate the relative wafer stage overlay error.

There are several problems associated with the golden wafer technique. First, as noted above, the technique does not yield the unique wafer stage overlay error for the machine in question, it only provides a relative measure of all components. To obtain the relative stage error between two machines, the inter-field errors of each machine are determined and then subtracted from each other resulting in an increase in the noise in the stage error determination. Second, the models used to calculate the systematic inter-field error usually do not account for the stage error associated with distortion and yaw. These models are typically limited to translation, rotation, orthogonality and x and y scale errors (See A Computer Aided Engineering Workstation for Registration Control, supra), higher order errors are ignored or otherwise not taken into account. Relying on golden wafers created on a reference machine, results in wafers that are not identical, or have overlay deviations from one another even if they are exposed on a single machine in a short time to minimize machine instabilities. See Matching Management of Multiple Wafer Steppers Using a Stable standard and a Matching Simulator, supra. It would be very desirable to have an inter-field overlay technique that can determine overlay error independently from a cross referenced golden wafer. See Mix-and-Match: A Necessary Choice, supra.

Reference Machine

Figure 23:
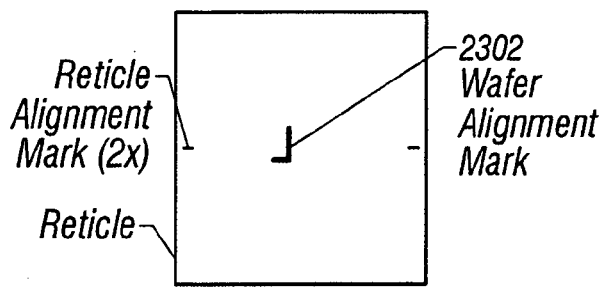
FIG. 23 is a schematic showing a wafer alignment mark reticle.
Figure 24:
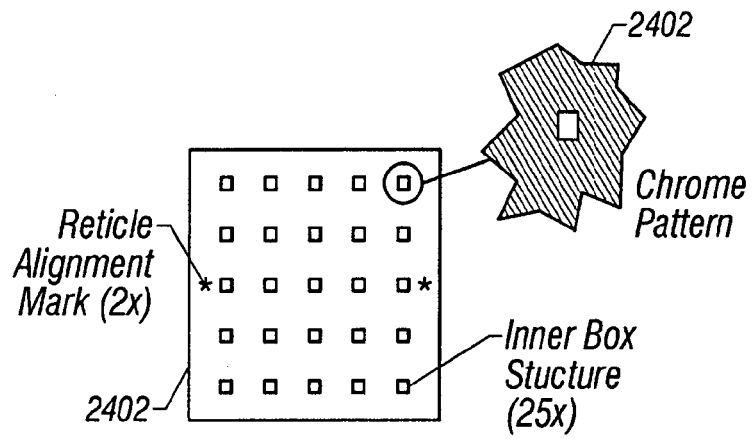
FIG. 24 is a schematic showing an inner box reticle.
Figure 25:
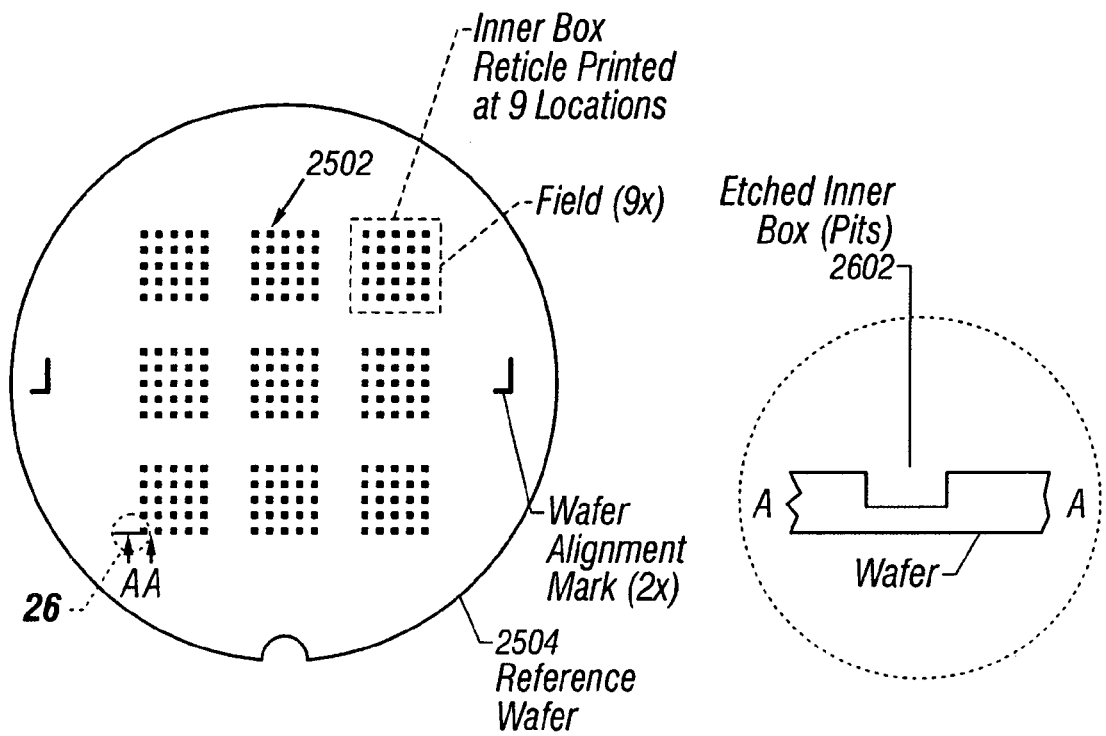
FIG. 25 is a schematic showing an example of a golden wafer layout.
Figure 26:
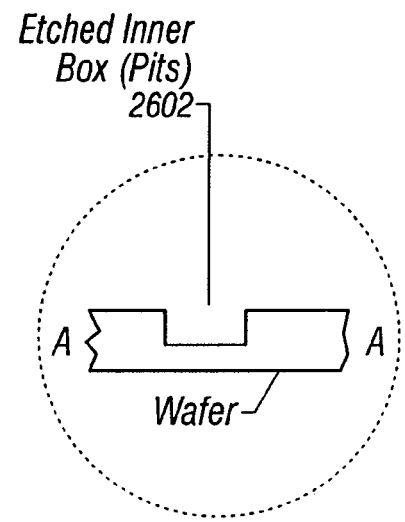
FIG. 26 is cross sectional view of an inner box.

Another technique utilizes a reference machine (projection imaging tool) for measurement of inter-field overlay error (See Matching Performance for Multiple Wafer Steppers using an Advanced Metrology Procedure, supra; Expanding Capabilities in Existing Fabs with Lithography Tool-Matching, supra). The reference machine is typically one that is closest to the average of all machines in the factory (Expanding Capabilities in Existing Fabs with Lithography Tool-Matching, supra) or a machine that exhibits long term stability. See Matching Performance for Multiple Wafer Steppers using an Advanced Metrology Procedure, supra. On the reference machine, a golden wafer is exposed, developed and etched. The golden wafer is exposed using a desired target, for example, an inner box reticle 2402 as illustrated in FIG. 24 that contains a regular array of inner box structures in a regular pattern covering the wafer, such as a 3×3 array 2502 as shown in FIG. 25. Next, wafer alignment marks are exposed using a designated portion of the inner box reticle or a separate reticle containing the wafer alignment mark 2302 illustrated in FIG. 23. The golden wafer is then typically etched and stripped to produce pits 2602 illustrated in FIG. 26 corresponding to the inner box locations.

A number of such wafers may be produced and the locations of the inner box arrays (individual printings of the inner box reticle) then represent the inter-field positions of the reference machine. Next, a reticle containing outer box structures 2702 illustrated in FIGS. 27 and 28 in the same nominal positions as the inner box reticle (or the pattern required to produce a completed, machine readable alignment attribute (complementary pattern) ), the outer box reticle, is placed on the machine to be measured, a completed golden wafer 2504 in FIG. 25 is coated with photoresist, exposed and developed. The result is a developed golden or reference wafer 2902 illustrated in FIG. 29, containing box in box structures that can then be measured on an overlay metrology tool. FIG. 30 is a cross sectional view of a typical box-in-box structure shown in FIG. 29.

The resulting measurements are then typically averaged over each field, for example, in FIG. 29, the twenty-five measurements within each field would be averaged together to produce a net translation (Dxg, Dyg) and rotation (Yawg) for each of the nine fields. This averaged data is then fit to the following set of equations. See Matching of Multiple Wafer Steppers for 0.35 Micron Lithography using Advanced Optimization Schemes, M. Van den Brink et al., SPIE Vol. 1926, 188:207, 1993; Matching Performance for Multiple Wafer Steppers using an Advanced Metrology Procedure, supra:

$$Dxg = Txg + sxg*xg + (-qg + qog)*yg + D2x*yg^2 + Rwx \quad \text{(Eq 1)}$$

$$Dyg = Tyg + syg*yg + qg*yg + D2y*xg^2 + Rwy \quad \text{(Eq 2)}$$

$$Yawg = Qg + syawg*yg - 2*D2y*xg + Rwy \quad \text{(Eq 3)}$$

Where:

Dxg, Dyg, Yawg=x,y, yaw grid errors at grid position xg, yg xg, yg=grid position=position on wafer with respect to the center of stage travel Txg, Tyg=x,y grid translation sxg, syg=x,y grid scale or magnification error qg, qog=grid rotation, orthogonality D2x, D2y=x,y stage bow terms Rwx, Rwy, RwY=grid residual in the x, y, Yaw direction (we do not try fitting to these parameters).

The Yaw error (Yawg) is the deviation of the rotation of the projected field at a specific point. It results in a difference in field to field rotation as a function of placement position (xg, yg) on the wafer. The 10 unknown parameters (Txg, Tyg, ... D2x, D2y) in Equations 1, 2, 3 are solved for using least squares techniques. See Numerical Recipes, The Art of Scientific Computing, W. Press et al., Cambridge University Press, 509:520, 1990.

Problems with this technique include the systematic (repeatable) and random grid errors on the reference machine (the machine used for creating the golden wafers) are permanently recorded as half (inner or outer box) of our factory wide metrology standard. The magnitude and distribution of these errors is entirely unknown. For machine to machine comparisons of grid errors, the systematic part of the errors cancel out but the influence of the random or non-repeatable errors remains. To try and overcome this problem typically, multiple golden or reference wafers are used to improve machine to machine matching results. See Matching Management of Multiple Wafer Steppers Using a Stable standard and a Matching Simulator, supra. Furthermore, reference machine instabilities over time lead to a drift or error in the factory wide standard represented by the reference machine. Yet another problem with this technique is that because it utilizes full size projected fields to determine the inter-field errors, it does not work with partially exposed fields 3202 illustrated in FIG. 32. The ability to include partially exposed fields is important because product wafers typically contain multiple die within an exposure field and therefore the inter-field error of partially exposed fields directly affects the edge die overlay error.

Reference Reticles

Figure 13:
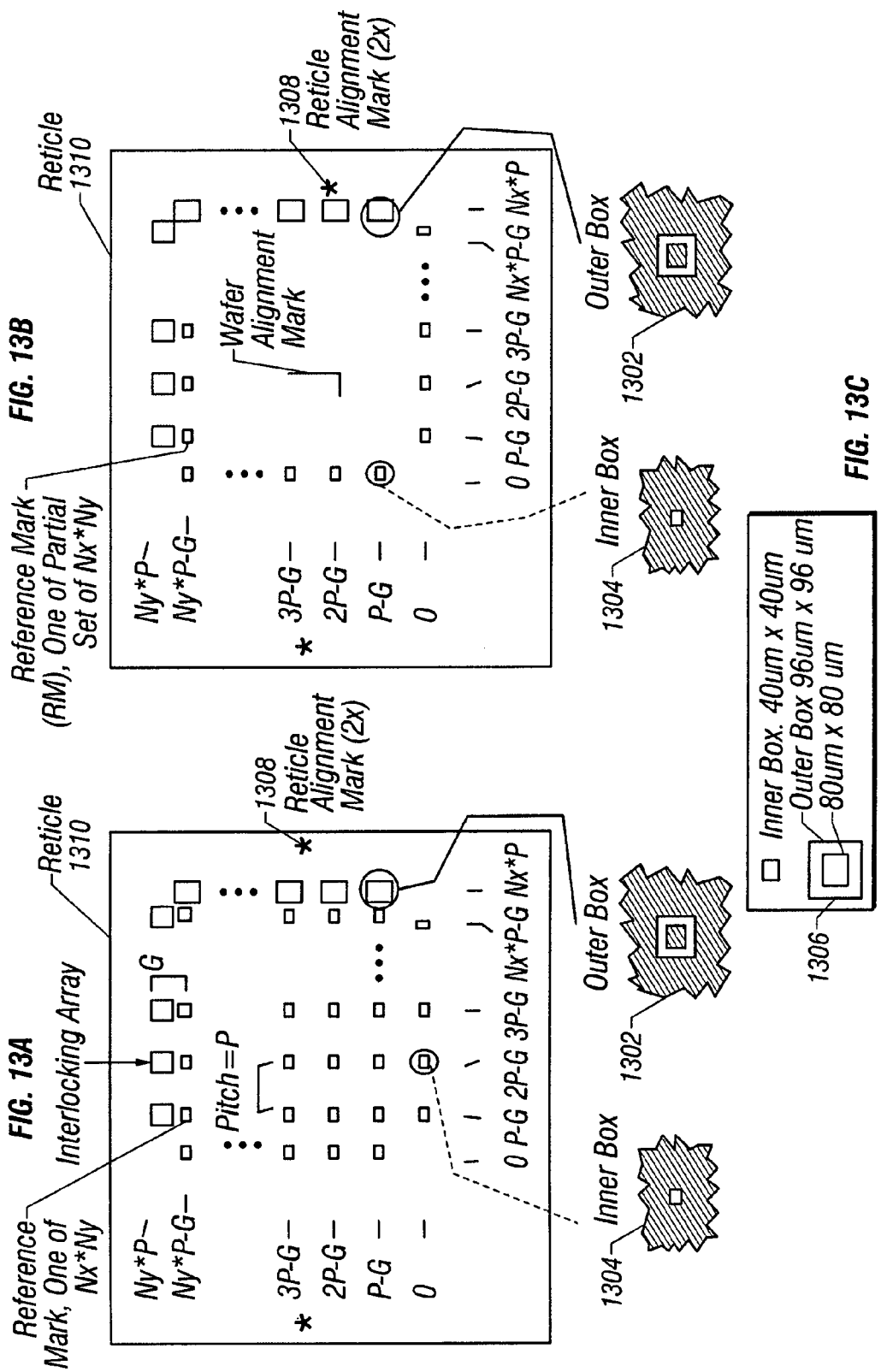
FIG. 13A is a schematic showing a reference reticle.
FIG. 13B is a schematic showing a reference reticle that includes wafer alignment marks.
FIG. 13C is a schematic showing exemplary inner and outer box sizes.
Figure 15:
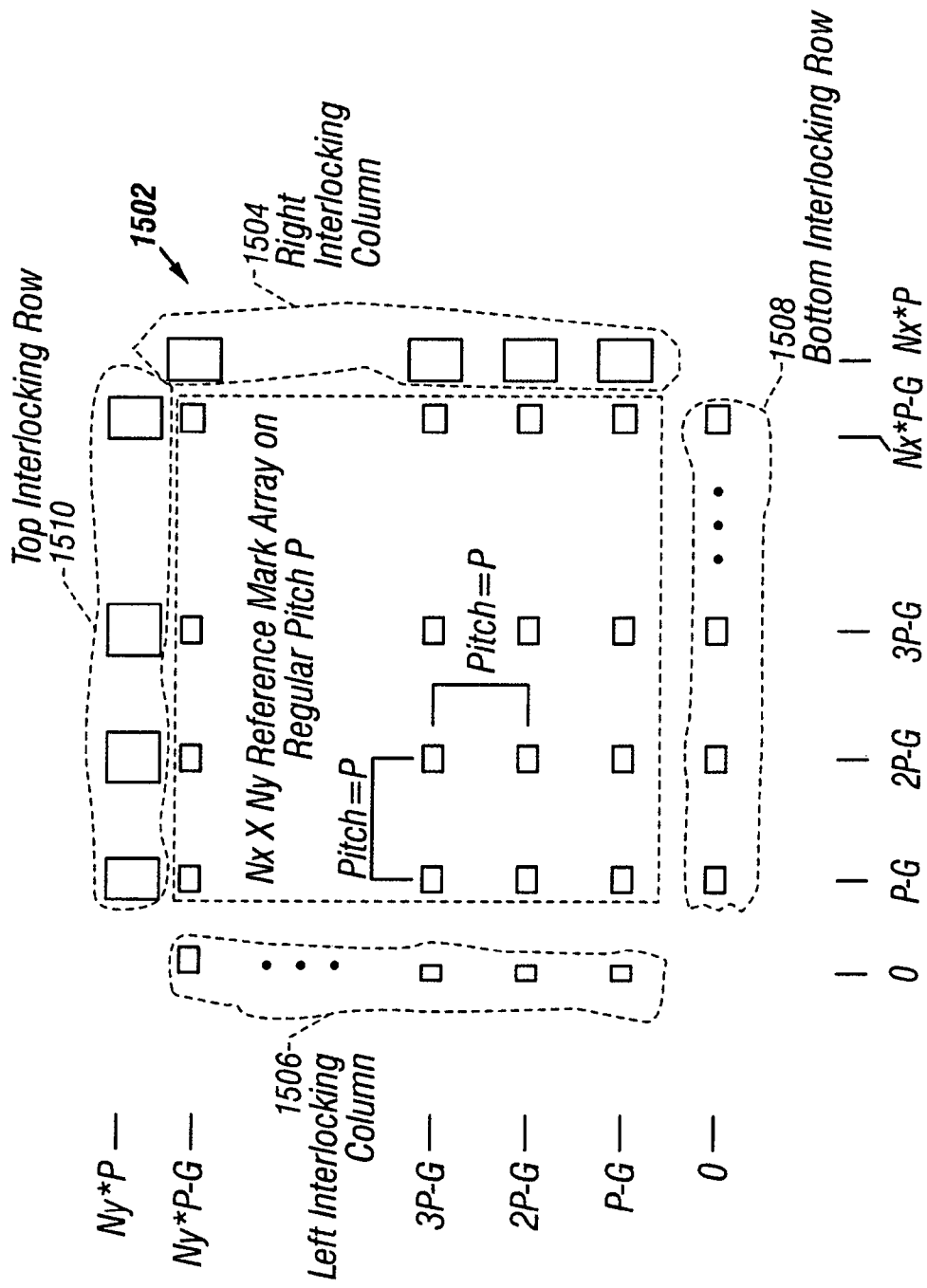
FIG. 15 is a schematic showing a further explanation of the components of the interlocking array of the reference reticle.

FIG. 13A shows a reference reticle 1310 containing an Nx+2 by Ny+2 array of overlay targets or box structures used for creating the basic interlocking array pattern on a substrate. The substrate may be different materials, for example, a silicon wafer, a quartz wafer, a flat panel display, a reticle, a photo-mask, or a mask plate. This reticle 1310 creates the basic periodic grid on a wafer with pitch P/M (M is the reduction magnification ratio of the projection imaging tool) and also creates the features that overlap or interlock from field to field and thereby improve accuracy. FIG. 15 illustrates additional detail of the components of the interlocking array. In the middle is an Nx×Ny reference mark array 1502 on pitch P. These features become part of the wafer scale P/M grid and include a set of inner boxes 1304 as detailed in FIG. 13A. On the right side of FIG. 15 is the right interlocking column 1504. It consists of an Ny long set of outer boxes 1304 detailed in FIG. 13A, at the indicated X and Y positions. The position of this column is determined so that the inner boxes in the left interlocking column 1506 of a subsequent exposure of the reticle, precisely overlap them on the wafer when the interlocking array is stepped and printed an X distance Sx=Nx*P/M at the wafer.

The left interlocking column 1506 includes an Ny long set of inner boxes that are off pitch (by the amount G) relative to the Nx×Ny reference mark array. The left interlocking column is off pitch (P-G spacing in FIG. 13A), so that an array of reference marks uninterrupted by field boundaries can be created and also be able to create a system of interlocking columns 1202 as shown in FIG. 12.

FIG. 15 also details the position of the bottom 1508 and top 1510 interlocking rows, both of which contain Nx features. Their function and location is analogous to the function and position of the left 1506 and right 1504 interlocking columns respectively. The relative Y position of the top 1510 and bottom 1508 interlocking rows is determined to overlap the inner boxes of the bottom interlocking row when the projected field is stepped a distance Sy=Ny*P/M at the wafer.

In addition to the reference reticle of FIG. 13A, another reference reticle containing wafer alignment marks is provided as illustrated in FIG. 13B. The description and layout of this reticle is identical to the description above, the only difference is that where the wafer alignment mark of FIG. 13B either covers a reference mark within the Nx×Ny reference array, or where the design rules for the wafer alignment mark dictate prescribed featureless areas, this reticle will contain no reference array marks. There will be a wafer alignment mark present or more typically several wafer alignment marks, one for each tool type used in the fab. The reticle containing the full interlocking array, FIG. 13A, and any reticles with wafer alignment marks, FIG. 13B, are then sequentially loaded and aligned on the projection imaging tool (machine) on which we will be manufacturing reference wafers.

FIG. 13C illustrates some typical inner and outer box sizes, for use on an M=4 or 5 stepper or scanner while a typical reticle pitch P=10 mm and offset G=0.5 mm. For these parameters Nx and Ny may be selected so that Nx=NY=8 thus allowing for the manufacture of reference wafers on either standard field steppers or scanners.

Wafers

As described above in block 604 of FIG. 6, wafers are then provided. These wafers can be, for example, blank silicon or quartz (See Matching Management of Multiple Wafer Steppers Using a Stable standard and a Matching Simulator, supra) and may be possibly laser scribed with an appropriate wafer id number for future identification 3304 as shown in FIG. 33. If desired, the silicon reference wafers can be coated with a thin film of silicon nitride or silicon dioxide before continuing (quartz wafers would typically be chrome coated). Next, the wafer is coated with resist and loaded onto the wafer stage of the machine.

Interlocking Reference Mark Exposures

A series of exposures, each containing an Nx+2 by Ny+2 array of box structures, is made in an overlapping interlocking pattern. FIGS. 12 and 16A are examples of an interlocking pattern. Following the first exposure, subsequent exposures in the same row are separated by a distance of Sx=Nx*P/M or the distance between the leftmost inner box of the projected field and the rightmost outer box of the field. Subsequent exposures in the same column are separated by a distance of Sy=Ny*P/M or the distance between the inner box at the bottom of the projected field and the topmost outer box within the projected field. P is the reticle pitch of reference marks within the Nx×Ny reference mark array as shown in FIG. 15. M is the reduction magnification ratio of the machine. This field placement pattern creates an interlocking array of fields. FIG. 12 shows additional detail of the interlocking array and FIG. 16A shows a schematic of the entire resulting wafer.

Figure 16B:
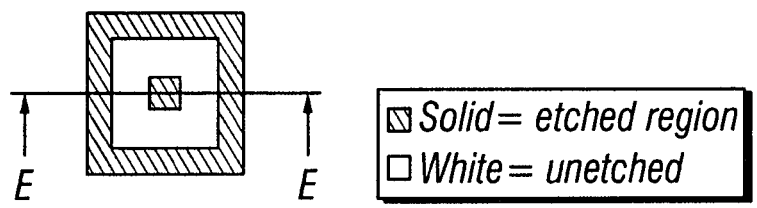
FIG. 16B is a plan view showing an interlocking measurement site.
Figure 16C:
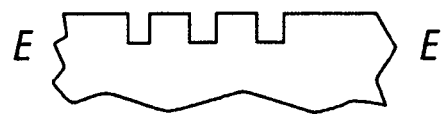
FIG. 16C is a cross sectional view of an interlocking measurement site.
Figure 17A:
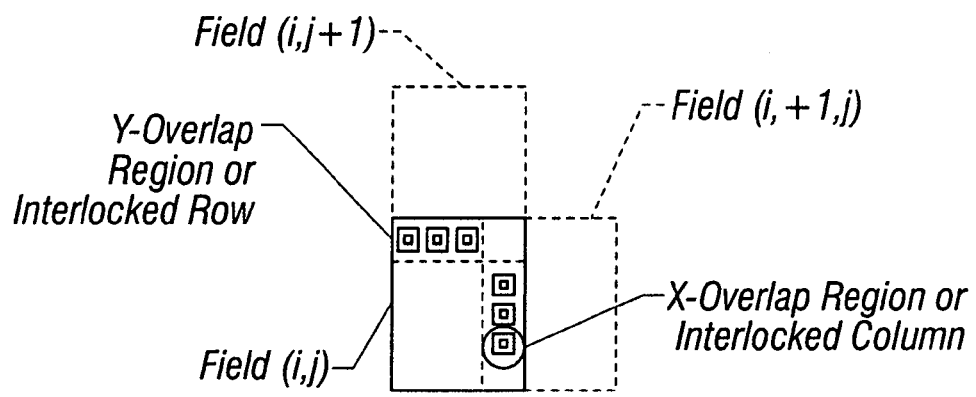
FIG. 17A is a schematic showing typical overlapping regions showing 3 box-in-box overlay targets.
Figure 17B:
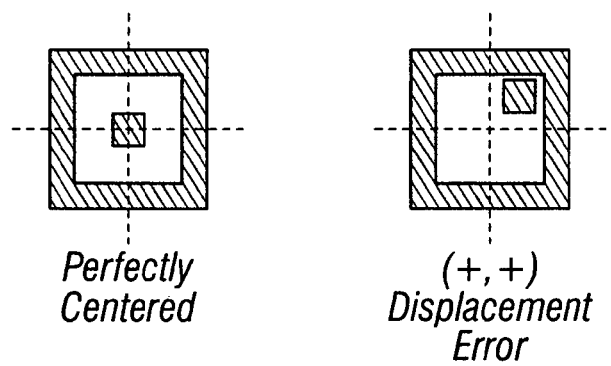
FIG. 17B is a schematic showing examples of completed alignment attributes (box-in-box).

An example of the final interlocking exposure pattern is shown in FIG. 16A. It forms an Nfx×Nfy rectangular array of fields, the only missing fields being those allocated for wafer alignment marks or where a field position is not desired. FIG. 16B is a plan view of an interlocking measurement site and FIG. 16C is a cross sectional view of interlocking measurement sites of FIG. 16B. FIG. 17A is a diagram showing typical overlapping regions of three box-in-box overlay targets. FIG. 17B illustrates a perfectly centered overlay target box measurement site and sign conventions for displacement.

Figure 32:
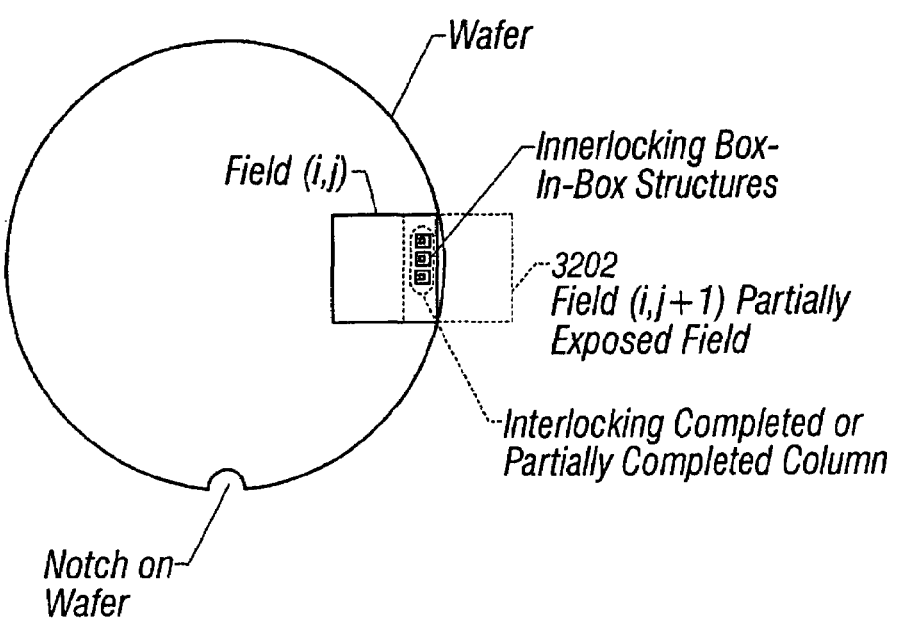
FIG. 32 is a schematic showing a partially exposed field.

The Nfx×Nfy array can contain partially exposed fields 3302 as shown in FIG. 32, where the entire field is not printed on the wafer. These partial fields are important because the large exposure fields in modem steppers and scanners allow for multiple product die within a field (such as illustrated in Nikon Lithography Tool Brochures (Japanese), Nikon). Thus partially exposed fields 3202 can print multiple product die while not exposing the entire field. Because overlay error tends to be worse near the edges of the wafer, it is beneficial to have reference marks near the reference wafers' edge (See A New Approach to Correlating Overlay and Yield, supra). For the partially exposed field 3202 to be usefully included on the reference wafer, at least two completed or overlapped box-in-box structures should be present along the partially exposed fields' interlocking rows or columns. This facilitates determining the position of the partially exposed field relative to the other fields in the reference wafer.

Wafer Alignment Mark Exposures

Next the reference reticle containing the wafer alignment marks, as shown in FIG. 13B, is loaded into the exposure position on the machine. The wafer alignment marks are exposed in openings in the previously defined Nfx×Nfy field array and placed so that its interlocking rows and columns interlock or overlap the interlocking rows and columns already placed with the previous reference reticle. The result is schematically shown in FIG. 16A where two wafer alignment marks 1604 suitable for a 0 degree wafer orientation have been printed. The left wafer alignment mark (FIG. 16A, field i=1, j=4) overlaps the previously placed reference reticle array along its top and bottom interlocking rows and along its right interlocking column while the right wafer alignment mark (FIG. 16A, field i=7, j=4) overlaps the previously placed reference reticle array along its top and bottom interlocking rows and along its left interlocking column. Additional (optional) wafer alignment marks 1608 suitable for a 90 degree wafer orientation and interlocked into the field pattern are also shown.

Develop, Etch, Strip

After the last exposure is complete, the wafer is removed from the wafer stage and sent through the final resist development steps. Next, the alignment attributes and wafer alignment marks for each reference wafer are permanently etched into the reference wafer using a standard semiconductor etch process. The remaining resist is then stripped. An additional overcoating (SiO2 overcoating, for chrome over quartz) is possibly provided. FIGS. 35A-35F show a variety of vertical cross sections for the resulting reference mark (in this instance an inner box). The dashed vertical lines are the silicon wafer (or other substrate) while the diagonal lines represent a pre or post exposure deposited or overcoated layer. Thus in the case of a silicon wafer provided before exposure with a silicon dioxide, polysilicon, amorphous silicon, or silicon nitride coating, the reference marks would have the cross section of FIG. 35C. Other vertical structures are clearly possible.

Measure Interlocking Rows and Columns

Referring to block 610 of FIG. 6, at this point, the interlocking array row and column overlay target positions are measured. That is, the overlay errors present in the completed alignment attributes (box-in-box structures) present along the interlocking rows and columns (FIG. 12 in detail and FIG. 16A schematically) of the reference wafer are measured. In general, at least two distinct box-in-box overlay targets should be measured along each edge (top, bottom interlocking row and left, right interlocking column) of the interior fields. Referring to FIG. 16A, a field (i,j) is an interior field if all of its neighboring fields interlocking rows and columns are completely present on the wafer. For other fields, typically, at least 2 distinct measurements altogether distributed amongst its' interlocking rows and columns in the overlapping regions. Increasing the number of measurements along the interlocking rows and columns is desirable because this may increase the accuracy of the resulting calibration file, as shown in FIG. 34, that characterizes the reference wafer. The aforementioned alignment attributes or box-in-box along the interlocking rows and columns are then measured on an overlay metrology tool such as a KLA-Tencor model 5105 or 5200 (See KLA 5105 Overlay Brochure, supra; KLA 5200 Overlay Brochure, supra) or a Bio-Rad Semiconductor Systems Quaestor Q7. See Quaestor Q7 Brochures, supra. The resulting overlay data set is saved and entered into a computer algorithm for analysis and the overlay positional coordinates of the alignment attributes are computed and then saved for the subsequent calculation of the calibration file.

Intra-Field Distortion

Referring to block 612 of FIG. 6, the intra-field or within the exposure field distortion pattern of the machine being used to create the reference wafer is provided. This can come from a variety of sources since a number of techniques are available for the determination of the intra-field distortion (dxf, dyf). One technique is described by Smith et al in U.S. Pat. No. 6,573,986 issued on Jun. 3, 2003. This patent describes a self referencing technique that can be carried out using overlay metrology tools widely available in semiconductor factories and allows for highly accurate determination of the intra-field distortion (dxf, dyf) over a set of grid points to within an x, y translation, rotation, and overall scale or symmetric magnification factor. Another technique is to expose on a photoresist coated wafer, a reticle pattern containing simple crosses or squares as illustrated in FIG. 24 that are located at the desired intra-field grid positions illustrated in FIG. 31. The wafer is then developed and the position of the resulting grid of boxes is measured using an absolute metrology tool such as a Leica LMS2000, Leica IPRO (Leica Microsystem, Wetzlar, Germany, (See Leica LMS IPRO Brochure, Leica), Nikon 51 or Nikon 61 (Nikon, Tokyo, Japan, (See Measuring System XY-5I, K. Kodama et al., SPIE Vol. 2439, 144:155, 1995)).

The technique described above is highly accurate but absolute metrology tools are not widely available in semiconductor factories and so it typically is not used. Yet another technique involves assuming that the machines' inter-field or stage errors are small over the dimensions occupied by a single field, then printing a small field where a single inner box on a reticle is stepped around by the wafer stage to a grid of locations in the field. Then another reticle containing an array of complementary outer boxes covering the full image field is printed over the inner boxes and the resulting box-in-box measurements are directly interpreted as the intra-field distortion. See A "Golden Standard" Wafer Design for Optical Stepper Characterization, supra. This technique is the least accurate and least preferred. With all of these techniques, the overall scale or symmetric magnification is determined with a greater or lesser degree of accuracy; more on this below.

Calculate Calibration File

Referring to block 614 of FIG. 6, the reference wafer calibration file is calculated. This is the step that creates a unique calibration file for each reference wafer. Because the intra-field errors are known, they can be combined with the overlay measurements made along the interlocking rows and columns of the reference wafer to determine the stage or inter-field errors. Then combining the determined stage errors with the intra-field errors produces the calibration file that contains the locations of all of the reference marks on a wafer scale periodic grid (P/M=period) and the positions of the wafer alignment marks. The step of determining the inter-field errors uses the techniques described in Smith et al, U.S. Pat. No. 6,734,971.

The following model may be used in the determination of the stage errors:

$$BBx(i, j; a, T) = \left[\begin{array}{c} dxG(i, j+1) + dxf(a, B) - \\ Qg(ij+1) * yfn(B) \end{array}\right] - \qquad (Eq\ 4)$$
$$\left[\begin{array}{c} dxG(i, j) + dxf(a, T) - \\ Qg(ij) * yfn(T) \end{array}\right]$$
$$= dxG(i, j+1) - dxG(i, j) - Qg(ij+1) *$$
$$yfn(B) + Qg(i, j) * yfn(T) + dxf(a, B) -$$
$$dxf(a, T)$$

$$BBy(i, j; a, T) = \left[\begin{array}{c} dyG(i, j+1) + dyf(a, B) + \\ Qg(i, j+1) * xfn(a) \end{array}\right] - \qquad (Eq\ 5)$$
$$\left[\begin{array}{c} dyG(i, j) + dyf(a, T) + \\ Qg(ij) * xfn(a) \end{array}\right]$$
$$= dyG(i, j+1) - dyG(i, j) + Qg(i, j+1) *$$
$$xfn(a) - Qg(i, j) * xfn(a) + dyf(a, B) -$$
$$dyf(a, T)$$

$$BBx(i, j; b, R) = \left[\begin{array}{c} dxG(i+1, j) + dxf(b, L) - \\ Qg(i+1, j) * yfn(b) \end{array}\right] - \qquad (Eq\ 6)$$
$$\left[\begin{array}{c} dxG(i, j) + dxf(b, R) - \\ Qg(i, j) * yfn(b) \end{array}\right] dxG(i+1, j) - dxG(i, j) -$$
$$Qg(i+1, j) * yfn(b) + Qg(i, j) * yfn(b) + dxf(b, L) - dxf(b, R)$$

$$BBy(i, j; b, R) = \left[\begin{array}{c} dyG(i+1, j) + dyf(b, L) + \\ Qg(i+1, j) * xfn(L) \end{array}\right] - \qquad (Eq\ 7)$$
$$\left[\begin{array}{c} dyG(i, j) + dyf(b, R) + \\ Qg(i, j) * xfn(R) \end{array}\right] dyG(i+1, j) - dyG(i, j) +$$
$$Qg(i+1, j) * xfn(L) - Qg(i, j) * xfn(R) + dyf(b, L) - dyf(b, R)$$

Figure 31:
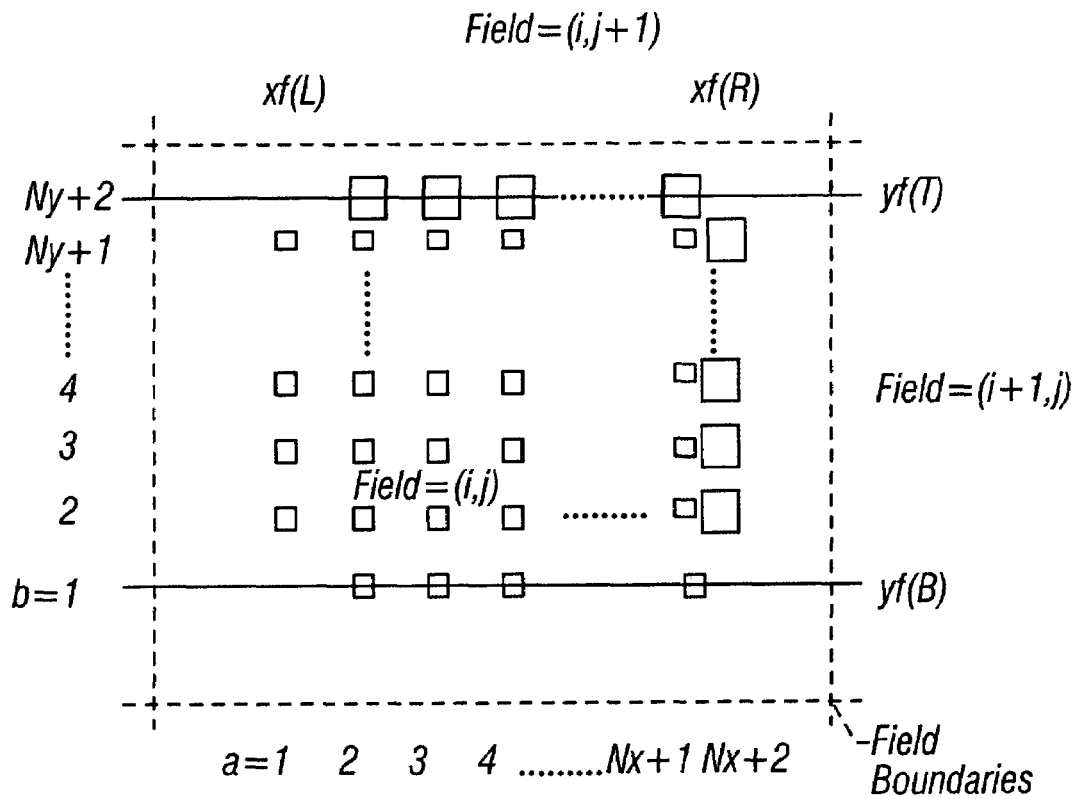
FIG. 31 is a schematic showing inter-field and intra-field indices.

Where:

T, B, R, L=designate the top, bottom, right and left most row or column within each field [see FIG. 31].

(i, j)=field indices [see FIGS. 17A and 31]. i=1: Nfx, j=1:Nfy but not all i, j pairs occur Equations 4-7. If the field or the corresponding measurement set (T or R) does not occur then that equation is absent. That is, i labels fields consecutively left to right while j labels fields consecutively from bottom to top.

(a, b)=intra-field indices or indices corresponding to each feature [FIG. 31], a=1:Nx+2, b=1:Ny+2. That is, a labels features consecutively left to right while b labels features consecutively from bottom to top.

xf(L), xf(R)=x intrafield nominal position of left (a=1), right (a=Nx+2) interlocking columns [FIGS. 15 and 31]. These are known quantities.

yf(T), yf(B)=y intrafield nominal position of the top (b=Ny+2), bottom (b=1) interlocking rows [FIGS. 15 and 31]. These are known quantities.

xfn(a), yfn(b)=(x,y) intrafield nominal position of feature with index (a,b). These are known quantities (see FIG. 15 for relative positions on the reticle);

BBx, BBy(i,j;a,T)=(x,y) measured overlay errors along the top (b=Ny+2) interlocking row of field (i,j) at column a. Thus, "a" covers the range a=2:Nx+1 but the actual number of measurements made along this edge is at the user's discretion subject to the availability of a site on partially exposed fields. See above for the number of measurements required for the purposes of this invention. These are known quantities.

BBx, BBy(i,j;b,R)=(x,y) measured overlay errors along the right (a=Nx+2) edge of field (i,j) at row b. "b" covers the range b=2:Ny+1 but the actual number of measurements made along this edge is at the user's discretion subject to the availability of a site on partially exposed fields. These are known quantities.

dxG(i,j), dyG(ij), Qg(i,j)=inter-field placement errors in x, y, and yaw or rotation at field (i,j). These are the error terms that characterize the wafer stage stepping. These quantities are solved for, to construct the calibration file.

dxf(b,L), dyf(b,L)=x,y intra-field lens distortions along the left interlocking column (a=1) of the field [FIG. 31]. These are known quantities.

dxf(b,R), dyf(b,R)=x,y intra-field lens distortions along the right interlocking column (a=Nx+2) of the field [FIG. 31]. These are known quantities.

dxf(a,T), dyf(a,T)=x,y intra-field lens distortions along the top interlocking row (b=Ny+2) of the field [FIG. 31]. These are known quantities.

dxf(a,B), dyf(a,B)=x,y intra-field lens distortions along the bottom interlocking row (b=1) of the field [FIG. 31]. These are known quantities.

Thus, all of the quantities in Equations 4-7 are known except the inter-field or grid error (dxG, dyG, Qg)(i,j) which must be solved for. Equations 4-7 are typically over determined in the sense of equation counting (there are more equations than unknowns) but are still singular in the mathematical sense; the null space of Equations 4-7 has a dimension of three. See Numerical Recipes, The Art of Scientific Computing, W. Press et al., Cambridge University Press, 52:64, 1990. Now it can be mathematically shown that this 3-dimensional null space corresponds to our inability to uniquely solve for the inter-field error to within an overall X or Y translation and an overall rotation. Put differently, if error (dxG, dyG, Qg)(i,j)) is a solution to Equations 4-7, then (dxG(i,j)+Tx−qg*yG(i,j), dyG(i,j)+Ty+qg*xG(i,j), Qg(i,j)+qg) is also a solution of Equations 4-7 where:

Tx, Ty=arbitrary translation, qg=arbitrary rotation (xG,yG)(i,j) is the nominal center position in wafer coordinates of field (i, j).

To uniquely define a solution we can require that the computed solution have zero values for these modes. Then:

$$\Sigma dxG(i,j)=0 \text{ no } x \text{ translation} \quad \text{(Eq 8)}$$

$$\Sigma dyG(i,j)=0 \text{ no } y \text{ translation} \quad \text{(Eq 9)}$$

$$\Sigma yG(i,j)*dxG(i,j)-xG(i,j)*dyG(i,j)=0 \text{ no rotation} \quad \text{(Eq 10)}$$

$\Sigma$ denotes summation over all inter-field grid point pairs (i, j) whose offsets and yaws are to be determined. Equations 4-7 are typically solved using the singular value decomposition to produce the minimum length solution. See Numerical Recipes, The Art of Scientific Computing, supra. It can be shown that the constraints of Equations 8-10 effectively define a unique solution within the null space of Equations 4-7, and therefore they can be applied after the minimum length solution (dxGm, dyGm, Qg)(i,j) has been determined.

Using Eq 11-13 below we solve for Tx, Ty, qg:

$$\Sigma dxGm(i,j)+Tx-qg*yG(i,j)=0 \quad \text{(Eq 11)}$$

$$\Sigma dyGm(i,j)+Ty+qg*xG(i,j)=0 \quad \text{(Eq 12)}$$

$$\Sigma yG(ij)*(dxGm(i,j)+Tx-qg*yG(i,j))-xG(i,j)*(dyGm(i,j)+Ty+qg*xG(i,j)) \quad \text{(Eq 13)}$$

and the inter-field distortion array satisfying Equations 8-10 and Equations 4-7 is:

$$dxG(i,j)=dxGm(i,j)+Tx-qg*yG(i,j) \quad \text{(Eq 14)}$$

$$dyG(i,j)=dyGm(i,j)+Ty+qg*xG(i,j) \quad \text{(Eq 15)}$$

$$Qg(i,j)=Qgm(i,j)+qg \quad \text{(Eq 16)}$$

At this point, having uniquely determined the inter-field distortion array, we can calculate the reference wafer calibration file. At a minimum, the following four quantities (xG, yG, dx, dy) are recorded into the wafer calibration file for each feature in the reference array which is on regular pitch P/M and each wafer alignment mark:

(xG, yG)=nominal (x,y) position of feature on the wafer (interfield or grid coordinates with center of coordinate system at wafer center (x,y axis in FIG. 33)), (dx, dy)=offset or error in nominal position of feature on the wafer. The true position of the feature is given by:

$$(X\text{true}, Y\text{true})=(xG+dx, yG+dy)=\text{true position of feature on wafer.} \quad \text{(Eq 17)}$$

The nominal positions (xG, yG) of all features on the wafer are known to us because they are the positions as they would be placed by a perfect projection imaging system using perfect reference reticles. These numbers are known since both the stepping pattern on the reference wafer is known as well as the design of the reference reticles.

The offset errors of a feature located at intra-field index (a,b) within exposure field (i,j) on the reference wafer the offset error (dx, dy) is calculated as:

$$dx(a,b;i,j)=dxG(i,j)-Qg(i,j)*xf(a)+dxf(a,b) \quad \text{(Eq 18)}$$

$$dy(a,b;i,j)=dyG(i,j)+Qg(i,j)*yf(b)+dyf(a,b). \quad \text{(Eq 19)}$$

All of the quantities on the right hand side of Equations 18 and 19 are known and therefore (dx, dy) is directly determined. This suffices for the determination of the offset errors for the reference array on regular pitch P/M (FIG. 33).

For wafer alignment marks, WM, that cover a more extended region or off grid portion of projection field (i,j) we would use the following formulas to determine the offset error:

$$dx(WM,i,j) = dxG(i,j) - Qg(i,j)^* <xf>(WM) + <dxf>(WM) \quad (Eq\ 20)$$

$$dy(WM,i,j) = dxG(i,j) + Qg(ij)^* <yf>(WM) + <dyf>(WM) \quad (Eq\ 21)$$

where:

(<xf~>, <yf>)(WM)=(x,y) center of mass or average position of WM in intra-field coordinates, and (<dxf>, <dyf>)(WM)=average intra-field distortion of WM. This is calculated by interpolating the given values for intra-field distortion, (dxf, dyf)(a,b), so that they apply everywhere in the field and then calculating the area weighted offset of all of the components making WM. Having computed all of the nominal positions and offsets we create a file (FIG. 34) detailing the feature, xG, yG, dx, dy, and possibly other information. This file is uniquely associated with a particular reference wafer (FIG. 33).

Final Articles

The final articles that result from the process of FIG. 6 is a completed reference wafer (FIG. 33) and corresponding calibration file (FIG. 34). Because the reference wafer of FIG. 33 has a wafer scale (covering the entire wafer, not limited to a single exposure field) reference array (pitch=P/M) that is uninterrupted by field boundaries, and the position of each reference mark and wafer alignment mark is accurately known from the calibration file and Equation 17, the article can be used to perform stepper and scanner matching without any regard to field size or format. See System and Method for Optimizing the Grid and Intrafield Registration of Wafer Patterns, supra; Mix-and-Match: A Necessary Choice, supra; Expanding Capabilities in Existing Fabs with Lithography Tool-Matching, supra. Thus, the interlocking rows and columns of the reference wafer that were vital to the accurate determination of position, though they physically remain, are not a concern and do not interfere with users of the reference wafer; all that is required is the reference wafer and its calibration file.

ALTERNATE EMBODIMENTS

Figure 14:
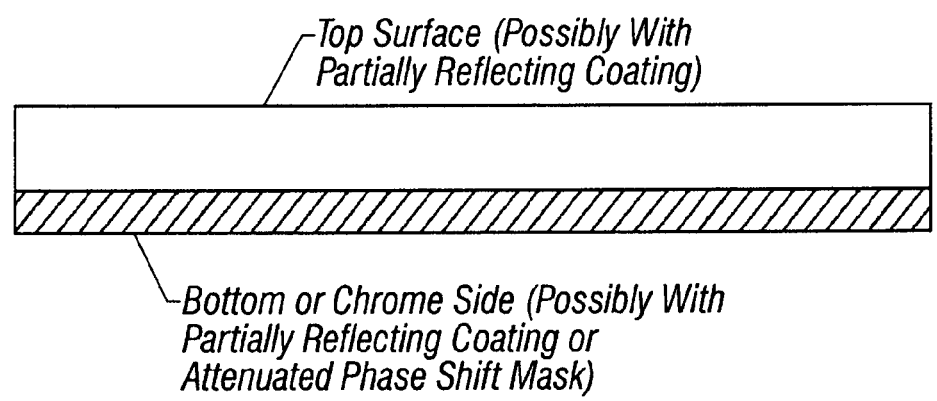
FIG. 14 is a side view of a reference reticle.

Similar process steps as described above are used except for being adapted to step and scan tools (scanners) (See Optical Lithography—Thirty Years and Three Orders of Magnitude, supra) by exposing the wafer alignment marks and the interlocking reference arrays with multiple sub-Eo exposures, and also providing a reticle with reduced transmission. Eo (E-zero) is the minimum exposure dose required for a large (>200 micron at wafer) open area pattern on the reticle to become fully developed or cleared (in the case of positive resist). Eo depends on the particular resist and resist development process. The intra-field error of scanners has an intrinsic non-repeatable component (0.7 NA DUV Step and Scan System for 150 nm Imaging with Improved Overlay, supra) whose effect on the manufactured reference wafers is desired to minimize. Reference reticles, similar to the reticles shown in FIGS. 13A and 13B, may be provided with a partially reflecting dielectric coating either on their non-chrome or possibly chrome coated (machine optical object plane) surface as shown in FIG. 14. For example, a 95% reflecting dielectric coating applied to the reference reticles means that if twenty exposure sequences at a dose of 2*Eo each are performed the net effect is to expose the wafer with a dose of 2*Eo and to have effectively averaged over as many as twenty exposures. An advantage of this technique is that it averages out the non-repeatable part of the scanner error. Thus, if the reference wafer requires a dose of b*Eo, and we expose at a dose of a*Eo, the overlay reticle has a coating that reflects a fraction R of light incident on it, then the number of exposures (N) required to get a dose of b*Eo on the reference wafer is:

$$N = 1 + \text{floor}(b/(a^*(I-R))) \quad (Eq\ 22)$$

and floor(x)=integer part of the real number x.

As a typical example, exposing at a dose of 1*Eo (a=1), using reference reticles that are 90% reflecting (R=0.90) and requiring a dose on the reference wafers of 2*Eo (b=2) means the number of required exposures is (Equation 22) N=21 resulting in effectively averaging over as many as twenty-one realizations of the intra-field distortion. While this embodiment has been described with respect to a partially reflecting reticle, there are similar considerations if the overlay reticle is absorbing or attenuated. An attenuated phase shift mask is well suited for this purpose (See The Attenuated Phase Shift Mask, B. Lin, Solid State Technology, Special Series/Advanced Lithography, 35(1): 43-47 (1992)) instead of reflecting; all that is required is a reticle with a decreased optical transmission from normal. In general, the reticle typically needs an optical transmission (1-R for a reflective mechanism) of <50% of normal or nominal.

Reference Reticle Fabrication

The reticle plate, as shown in FIGS. 13A, 13B and 14, makes no requirements on the size of the reticle plate, the design of the overlay targets or alignment attributes or the types of materials used to fabricate it. In cases where it might be necessary to have more wafer alignment marks a third or multiple reference reticles might be appropriate. Alternatively, both the interlocking array with reference marks and the wafer alignment marks could be contained on one and the same reticle. This is especially practical if the reference wafers are to be manufactured on a scanner using the scanner's static field, then there is certainly room on a single reticle for both. Heretofore, we have considered the reticle creating the patterns as perfect. In practice it is, but errors in the reticle manufacture can be taken into account by first measuring the position of all the individual structures on the reference reticle using an absolute metrology tool such as the Nikon 51 (See Measuring System XY-5I , supra), or Leica IPRO series tools. See Leica LMS IPRO Brochure, supra. Next, in formulating Equations 4-7, this reticle error (divided by the projection imaging tool demagnification (M) ) is explicitly written out on the right hand side and then subtracted from the resulting overlay measurements on the left hand side of the equations (thereby canceling out on the right hand side). The result is Equations 4-7 as they are written above but with a correction applied to the overlay measurements appearing on the left hand side. This accounts for the reticle error in the determination of the inter field grid and yaw distortion (dxG, dyG, Qg). The other correction for reticle distortion is directly added to the dx or dy term of Equations 18-21 as the reference reticle error at the feature we are considering divided by M.

ADDITIONAL EMBODIMENTS

Thus far, embodiments have been mainly described with respect to alignment attributes that are in the form of a box-in-box or frame-in-frame pattern as shown in FIG. 11A. Other alignment attributes such as gratings (See Overlay Alignment Measurement of Wafers, supra [FIG. 1b], wafer alignment marks (See Matching Management of Multiple Wafer Steppers Using a Stable standard and a Matching Simulator, supra), van der Pauw resistors (See Automated Electrical Measurements of Registration Errors in Step and Repeat Optical Lithography Systems, supra), vernier pairs (See Method of Measuring Bias and Edge Overlay Error for Sub 0.5 Micron Ground Rules, supra), or capacitor structures (See Capacitor Circuit Structure for Determining Overlay Error, supra) could be used instead. In general, any alignment attribute that can be used by an overlay metrology tool for measuring offsets can be utilized.

The overlay metrology tool utilized is typically a conventional optical overlay tool such as those manufactured by KLA-Tencor (See KLA 5105 Overlay Brochure, supra; KLA 5200 Overlay Brochure, supra) or Bio-Rad Semiconductor Systems. See Quaestor Q7 Brochures, supra. Other optical overlay tools can also be used. See Process for Measuring Overlay Misregistration During Semiconductor Wafer Fabrication, supra or See Overlay Alignment Measurement of Wafers, supra. In addition, some steppers or scanners can utilize their wafer alignment systems and wafer stages to function as overlay tools (See Matching Management of Multiple Wafer Steppers Using a Stable standard and a Matching Simulator, supra). In general, the total size of the alignment attribute is limited (in this case consisting of two wafer alignment marks) to a distance over which the wafer stage would be as accurate as a conventional optical overlay tool. This distance is typically <0.5 mm. When electrical alignment attributes are used for overlay (See Electrical Methods for Precision Stepper Column Optimization, L. Zych et al., SPIE Vol. 633, 98:105, 1986; Automated Electrical Measurements of Registration Errors in Step and Repeat Optical Lithography Systems, supra, Capacitor Circuit Structure for Determining Overlay Error, supra), the overlay metrology tool would correspond to the electrical equipment utilized for making the corresponding measurement.

Thus far, the description has been with respect to manufacture and use of a reference wafer on the projection imaging tools (steppers (See Direct-Referencing Automatic Two-Points Reticle-to-Wafer Alignment Using a Projection Column Servo System, supra; New 0.54 Aperture I-Line Wafer Stepper with Field by Field Leveling Combined with Global Alignment, supra; Projection Optical System for Use in Precise Copy, T. Sato et al., U.S. Pat. No. 4,861,148 issued Aug. 29, 1989)), and scanners (See Micrascan™ III Performance of a Third Generation, Catadioptric Step and Scan Lithographic Tool, supra; Step and Scan Exposure System for 0.15 Micron and 0.13 Micron Technology Node, supra; 0.7 NA DUV Step and Scan System for 150 nm Imaging with Improved Overlay, supra) most commonly used in semiconductor manufacturing today. However, the articles described can be manufactured or applied to other projection imaging tools such as contact or proximity printers (See Optical Lithography—Thirty Years and Three Orders of Magnitude, supra), 2-dimensional scanners (See Large Area Fine Line Patterning by Scanning Projection Lithography, supra; Large-Area, High-Throughput, High-Resolution Projection Imaging System, supra; Optical Lithography—Thirty Years and Three Orders of Magnitude, supra), office copy machines, and next generation lithography (ngl) systems such as XUV (See Development of XUV Projection Lithography at 60-80 nm, supra), SCALPEL, EUV (Extreme Ultra Violet) (See Reduction Imaging at 14 nm Using Multilayer-Coated Optics: Printing of Features Smaller than 0.1 Micron, J. Bjorkholm et al., Journal Vacuum Science and Technology, B 8(6), 1509:1513, November/December 1990), IPL (Ion Projection Lithography), and EPL (electron projection lithography). See Mix-and-Match: A Necessary Choice, supra.

The above description utilized only a single projected wafer alignment mark. However, multiple types of wafer alignment marks, one for each type of tool in the fab we will be analyzing or different angular orientations, See FIG. 33, could be projected to increase the utility of the reference wafer. In the case of multiple wafer alignment marks, the procedure would be modified so that the resulting calibration file would contain the nominal and offset position of all of the projected alignment marks.

Figure 36:
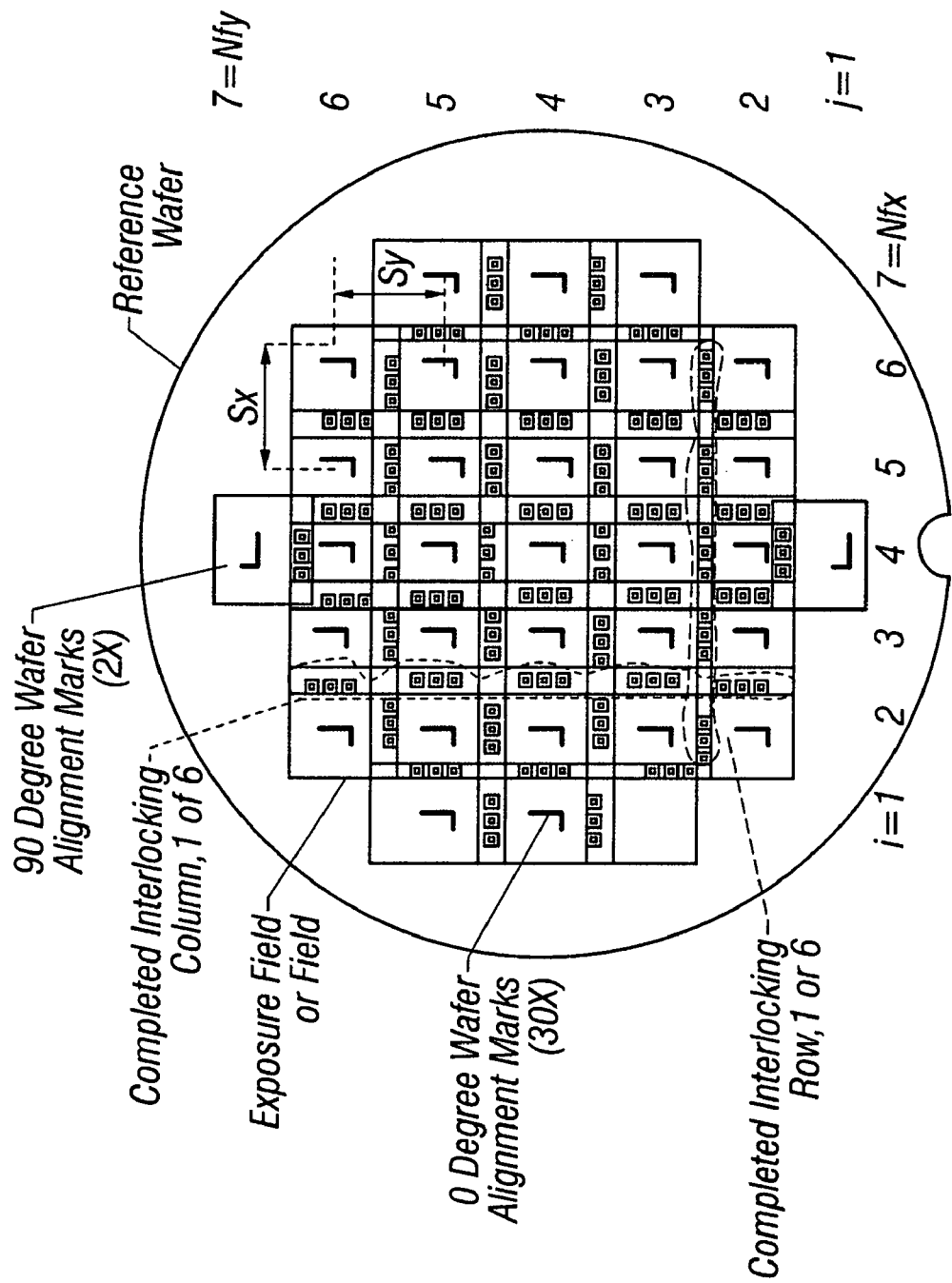
FIG. 36 is a schematic showing a reference wafer containing wafer alignment marks only.

While the above described laying down a series of reference marks on a regular, wafer scale array of pitch P/M, any other pattern that is built up by interlocking fields along rows and columns can also be used. The positions of the resulting features can be measured and recorded in a calibration file that is determined as described above. In particular, a wafer could be created that consisted entirely of wafer alignment marks at precisely known positions as illustrated in FIG. 36. Such a reference wafer and its associated calibration file is valuable for assessing projection imaging tool alignment system performance.

The reference reticle is typically glass with openings defined in a chrome coating. This is common for projection lithography tools utilized in semiconductor manufacture. The form the reticle can take will be determined by the format required by the specific projection imaging tool on which the reticle is loaded. Thus, an extreme ultra-violet (XUV) projection system would typically have a reflective reticle. See Development of XUV Projection Lithography at 60-80 nm, supra.

The embodiments described above have been mainly described with respect to the recording medium being positive photoresist. Negative photoresist could equally well have been used providing appropriate adjustment to the box-in-box structures on the reticle is made. Other types of recording medium can also be used, for example, an electronic CCD, a diode array, liquid crystal, or other optically sensitive material. In general, the recording medium is whatever is typically used on the projection imaging tool used for manufacturing the reference wafers. Thus, on an EPL tool, an electron beam resist such as PMMA could be utilized as the recording medium.

So far, the substrates on which the recording media is placed have been described as wafers. This will typically be the case in semiconductor manufacture. The exact form of the substrate will be dictated by the projection imaging tool used for its manufacture and its use in a specific manufacturing environment. Thus, in a flat panel manufacturing facility, the reference substrate would be a glass plate or panel. Circuit boards or multi-chip module carriers are other possible substrates.

Figure 7:
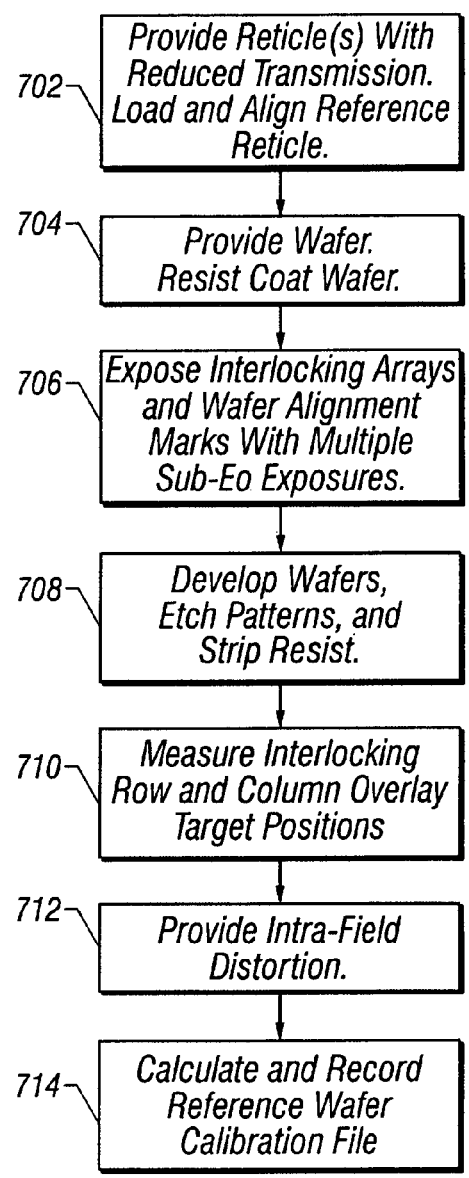
FIG. 7 is a flowchart of another embodiment for creating reference wafers.

FIG. 7 is a flow chart illustrating another embodiment for creating a reference wafer. In block 702 a reference reticle with reduced transmission is loaded into an exposure tools' reticle management system. Flow continues to block 704 where the wafer is then coated with photoresist and loaded into a projection imaging tool or machine. In block 706 the wafer is exposed, in an overlapping interlocking pattern, with multiple sub-E0 exposures.

Flow then continues to block 708 where, after the final exposure the wafer is removed from the machine and sent through the final few resist development steps. Next, the wafers are etched and stripped of photoresist and possibly overcoated with another layer. This leaves the alignment attributes and wafer alignment marks permanently recorded on the wafer surfaces. Flow then continues to block 710 where the resulting alignment attributes along the interlocking rows and columns are measured for registration, placement or overlay error.

Next, in block 712, the intra-field distortion of the projection imaging tool used to create the reference wafer is provided. Flow continues to block 714 when the resulting data set is entered into a computer algorithm where a special calibration file containing the positional coordinates for each alignment attribute is constructed for the reference wafer.

Figure 8:
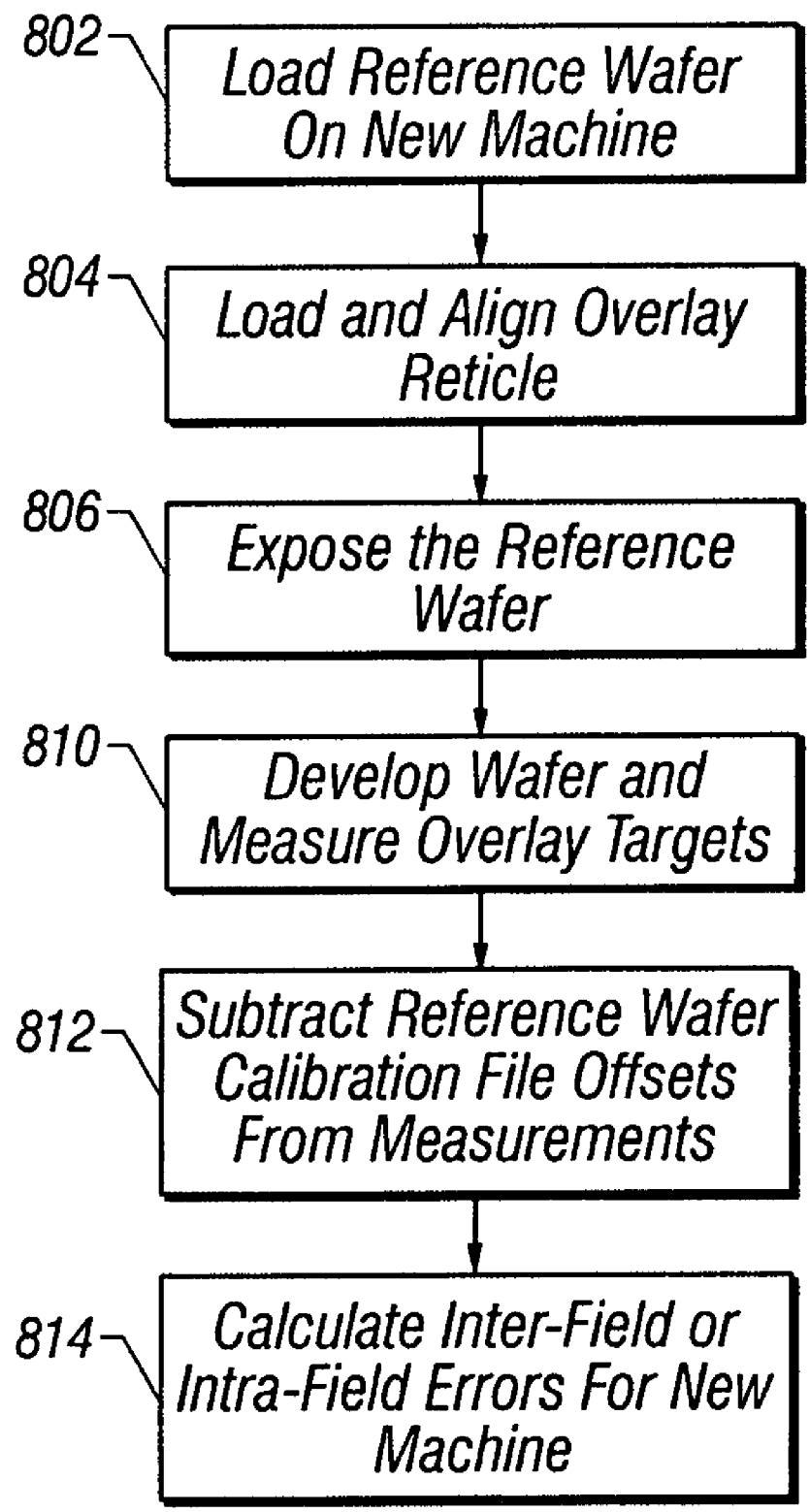
FIG. 8 is a flowchart illustrating an application of the reference wafer.

FIG. 8 is a flow diagram of an example of an application of the reference wafer. Flow begins in block 802 and the reference wafer is loaded onto a machine. Flow continues to block 804 where an overlay reticle is loaded and aligned on the machine. Then in block 806 the reference wafer is exposed. In block 810 the wafer is developed and the overlay targets are measured. In block 812 the references wafer calibration file offsets are subtracted from the measurements. Then, in block 814 the inter-field or intra-field errors for the new machine are calculated.

FURTHER EMBODIMENTS

As noted, the overlay or transverse (X, Y) misalignment of one process layer to another plays a vital role in the economics of semiconductor wafer processing (see, for example, M. Preil et al., "A New Approach to Correlating Overlay and Yield", Proc. of SPIE Conference on Metrology, Inspection, and Process Control for Microlithography XIII, pp. 208-216, March 1999; N. Sullivan, "Semiconductor Pattern Overlay", Proc. of SPIE Critical Reviews, Vol. CR52, pp. 160-188; and A. Starikov, "Metrology of Image Placement", Handbook of Silicon Semiconductor Metrology, pp. 411-475, 2001). Components of overlay error that can be accurately assessed include static lens distortion (see, for example, A. Smith et al., "Method and Apparatus for Self-Referenced Projection Lens Distortion Mapping", U.S. Pat. No. 6,573,986), dynamic lens distortion (see, for example, A. Smith et al., "Method and Apparatus for Self-Referenced Dynamic Step and Scan Intra-Field Lens Distortion", U.S. Pat. No. 6,906,780), dynamic scan synchronization error (see, for example, A. Smith et al., "Method and Apparatus for Self-Referenced Dynamic Step and Scan Intra-Field Scanning Distortion", U.S. Pat. No. 6,906,303), static wafer stage grid and yaw (see, for example, A. Smith et al., "Method and Apparatus for Self-Referenced Wafer Stage Positional Error Mapping", U.S. Pat. No. 6,734,971), dynamic wafer stage grid and yaw (U.S. Pat. No. 6,906,780), reticle stage error ("Method and Apparatus for Self-Referenced Dynamic Step and Scan Intra-Field Lens Distortion", U.S. Pat. No. 6,906,303) while net inter- and intra-field overlay error can also be assessed using the technique of U.S. Pat. No. 6,734,971 "Method and Apparatus for Self-Referenced Wafer Stage Positional Error Mapping". The aforementioned techniques produce absolute error maps (to within a few undefined modes) that isolate various machine (projection imaging tool, stepper or scanner) subsystems. Sometimes it is desirable to have an accurate or at the very least stable standard for transverse positioning that can readily utilize overlay metrology tools (KLA 5200 Overlay Tool Brochure, KLA-Tencor, 1996 and Quaestor Q7 Brochure, Bio-Rad Systems) or machine wafer alignment systems (see, for example, M. van den Brink et al., "Matching Management of Multiple Wafer Steppers Using a Stable Standard and a Matching Simulator", Proc. of SPIE, Vol. 1087, pp. 218-232, 1989). Such a standard (sometimes called an archive, reference, golden, or holy wafer) takes the form of an etched or otherwise permanently marked silicon or SiO2 substrate and possibly a calibration file that lists the deviations of the etched marks from their nominal positions. An example of such a reference wafer that can be manufactured with static fields or by using multiple sub E0 dynamic exposures is given in see, for example, U.S. Pat. No. 6,734,971, supra. This reference wafer is manufactured using a special reticle and the associated calibration file derives its accuracy from overlapped, completed alignment attributes that are permanently etched into the reference substrate. The resulting reference array etched into the reference wafer is a periodic array. Other less accurate archive wafers are described in see, for example, K. Kemp et al., "A 'Golden Standard' Wafer Design for Optical Stepper Characterization", Proc. of SPIE, Vol. 1464, pp. 260-266, 1991; and "Matching Management of Multiple Wafer Steppers Using a Stable Standard and a Matching Simulator", supra.

To the extent that an existing set of archive wafers is already in active use (see, for example, "A 'Golden Standard' Wafer Design for Optical Stepper Characterization", supra) in the fab, it would be advantageous to characterize or re-characterize and thus provide a more accurate calibration file. It would also be advantageous to have a greater variety of archive substrate manufacturing techniques to suit the capabilities/constraints of particular fabs.

Figure 42:
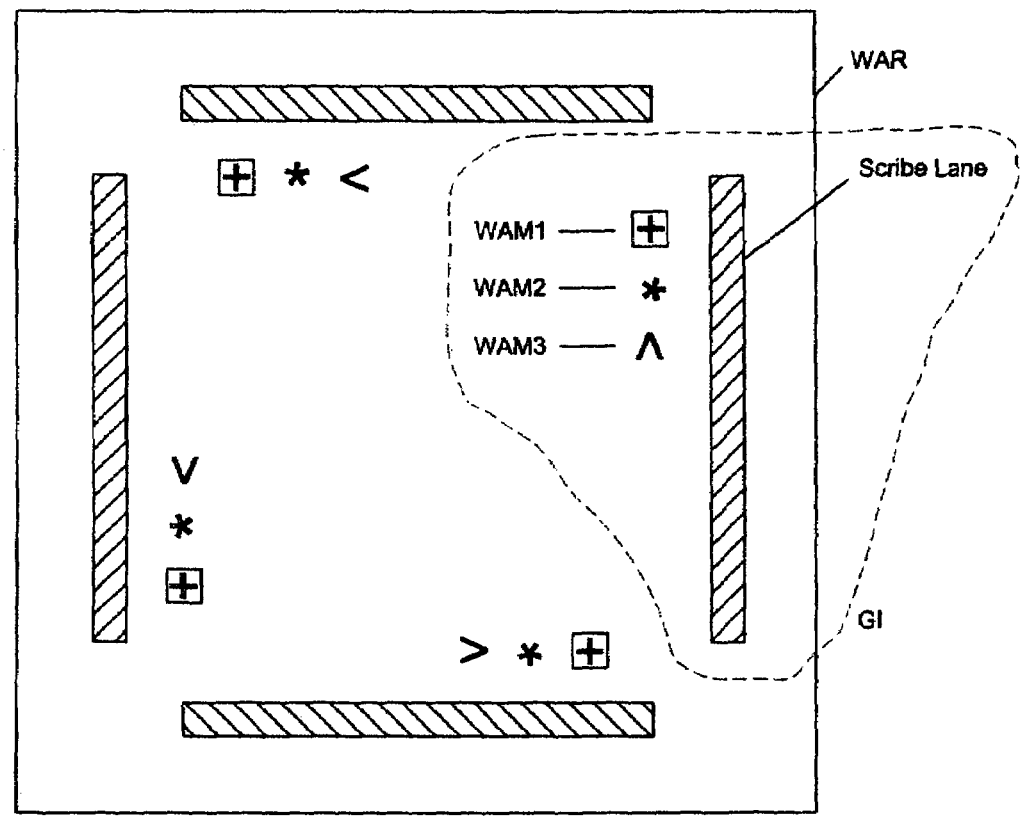
FIG. 42 shows an embodiment of a wafer alignment reticle (WAR) containing scribe lane and wafer alignment marks (WAM) in four groups.

In one embodiment, an uncalibrated archive substrate is manufactured by exposing an alignment attribute reticle in a regular grid (with possibly missing sites) and subsequently etching (or possibly depositing in an additive process) the printed alignment attributes another variation, a separate wafer alignment reticle (WAR in FIG. 42) is provided that contains WAM of multiple types and for multiple tools in strips. Alignment attributes, AA, on AAR are typically measured on a tool such as see, for example, Leica LMS IPRO Brochure and this information is used in constructing the calibration file (Block 1008).

Next, Block 1002, resist coated archive media is provided. The media assumes the form of the lithography tool it will be used on. One of the advantages of techniques described is the ability of production facilities to create their own stable archive media. Thus in a semiconductor fab it will typically be a 200 or 300 mm wafer while in a flat panel display factory it would be a rectangular glass plate.

Figure 37:
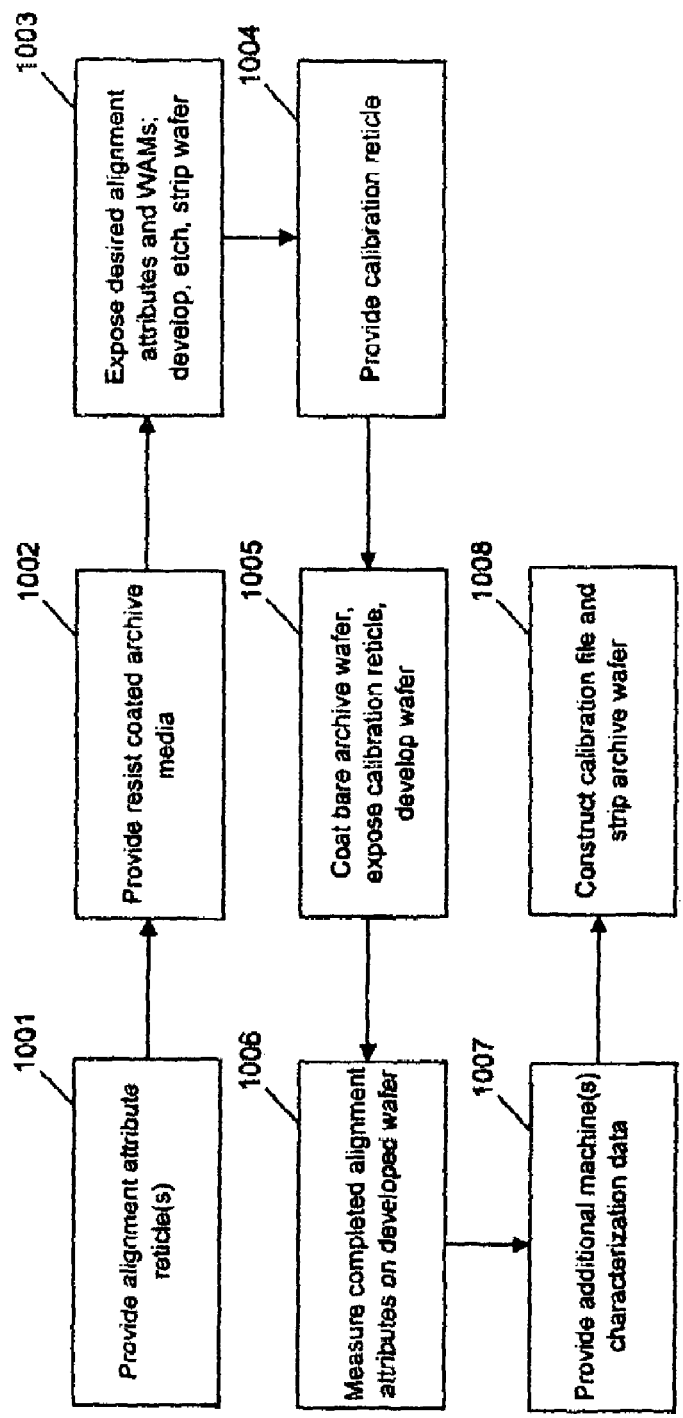
FIG. 37 shows the process flow for creation of an embodiment for manufacture of high accuracy archive wafers.
Figure 38:
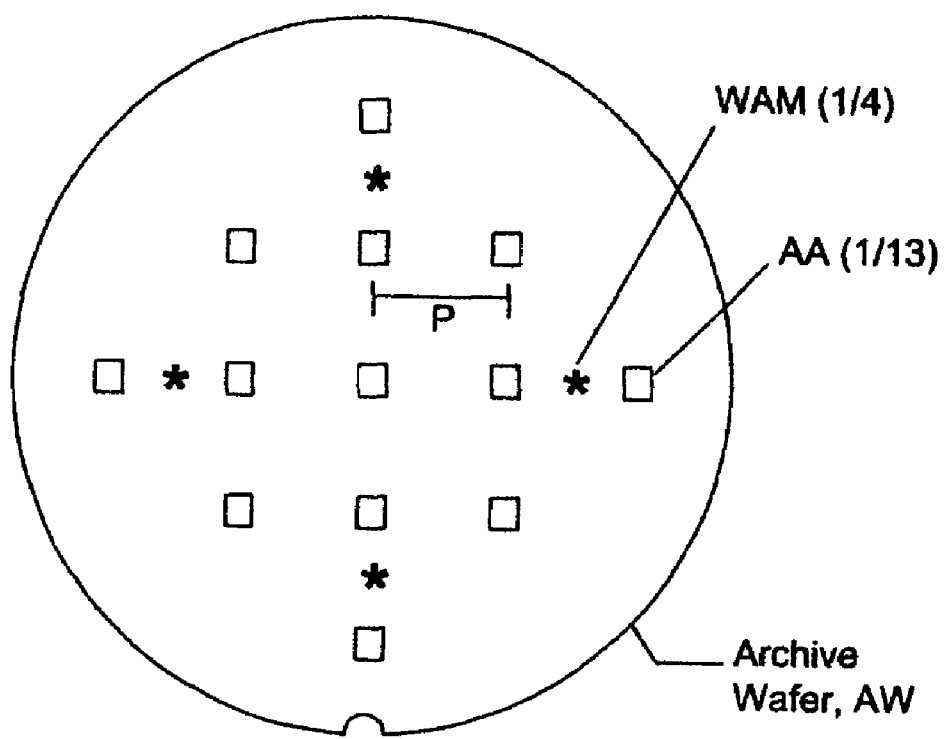
FIG. 38 shows an embodiment of a layout for an overlay tool specific archive wafer.
Figure 39:
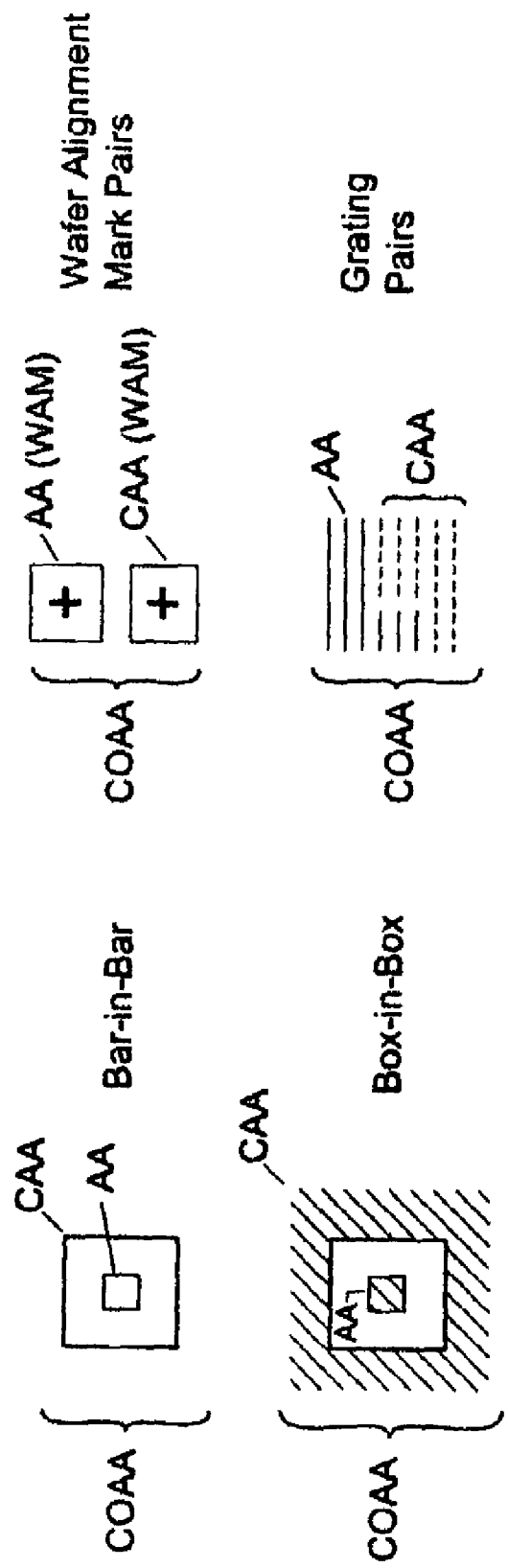
FIG. 39 shows some conventional overlay tool completed alignment attributes.
Figure 40:
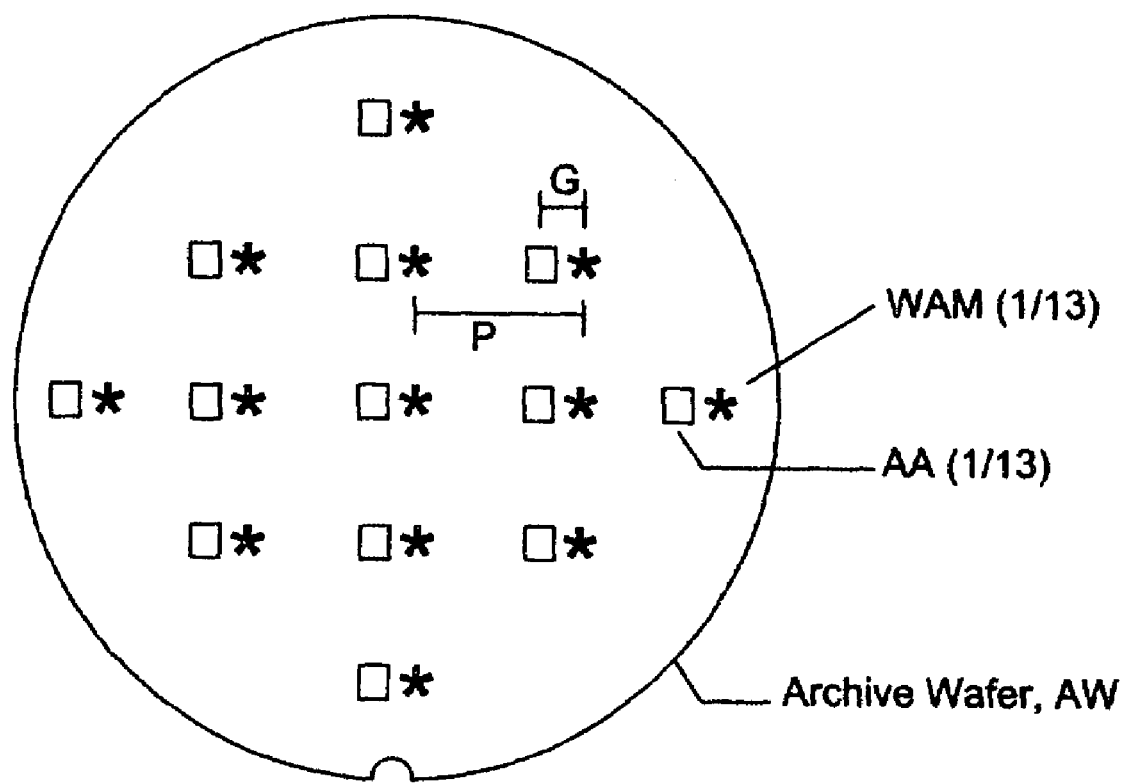
FIG. 40 shows an embodiment of a layout for a lithography tool specific archive wafer.
Figure 41:
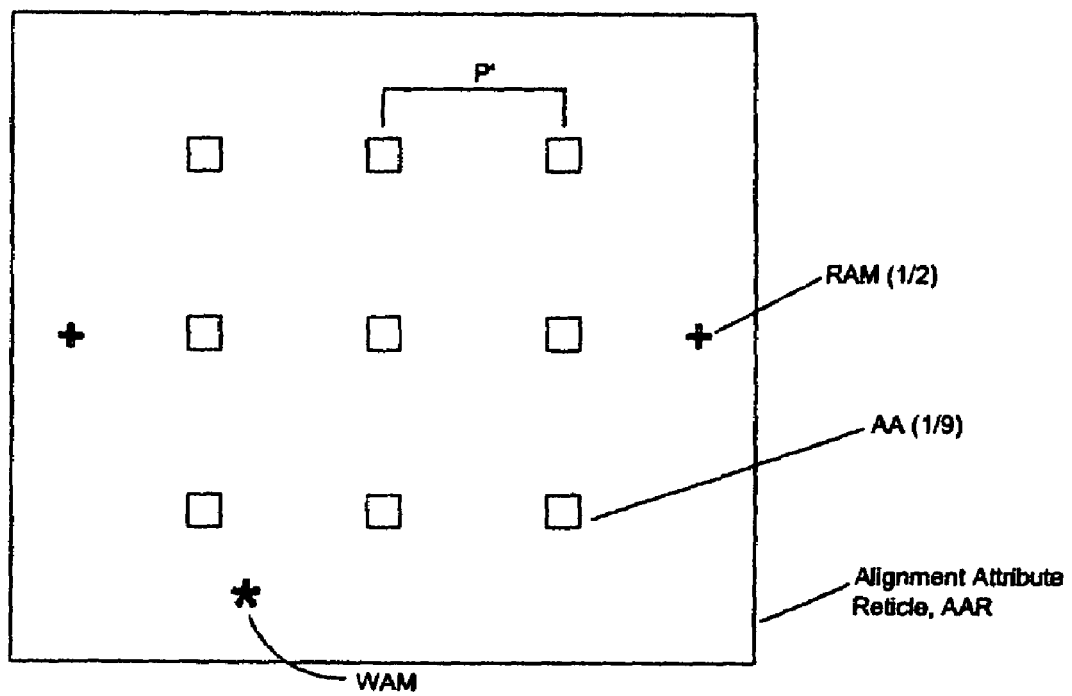
FIG. 41 shows an embodiment of an alignment attribute reticle, AAR, for use in exposing regular grid of alignment attributes on archive wafer AW.
Figure 43:
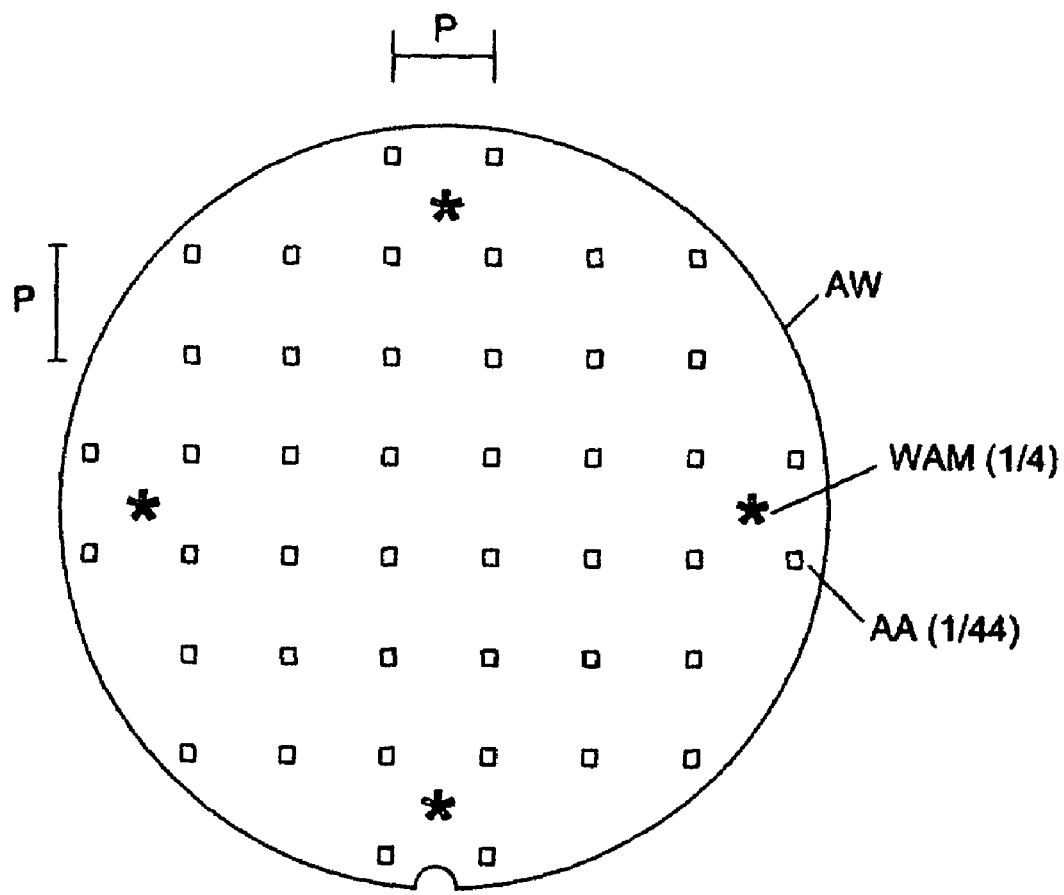
FIG. 43 shows an embodiment of an archive wafer, AW, with printed alignment attributes (AA) and wafer alignment marks (WAM).

Then, in Block 1003, the archive media is exposed (either statically or dynamically) with the alignment attributes, AA, on a regular grid and the wafer alignment marks (WAM) as required. FIG. 43 shows an archive wafer, AW, with alignment attributes, AA, on a regular grid of pitch P. Wafer alignment marks, WAM, are also printed at this time. This exposed wafer (archive media) is then developed and etched so the AA and WAM form permanent structures in the AW. Remaining resist is then stripped. At this point we have an uncalibrated archive wafer of the sort described in see, for example, "A 'Golden Standard' Wafer Design for Optical Stepper Characterization", supra, and "Matching Management of Multiple Wafer Steppers Using a Stable Standard and a Matching Simulator", supra. They are useful for checking for variations over time and across machines provided the archive wafers do not vary significantly in AA position from wafer to wafer. The subsequent steps (Blocks 1004 through 1008) in FIG. 37 provide the user with absolute calibration data for each archive wafer that provide for consistency and an absolute standard over time and across machines.

The exact form the calibration reticle (Block 1004) takes as well as subsequent exposure (Block 1005), metrology (Block 1006), machine data (Block 1007), and calibration file construction (Block 1008) will depend on the specific calibration technique employed. Table 1 lists five techniques (indexed by ITECH) for calibrating archive wafers depending on whether the initial archive wafer exposure made (Block 1003) was static or dynamic.

TABLE 1

| Archive Wafer Exposure Mode (Block 1003) | Calibration Technique (Blocks 1004-1008) | ITECH |
|---|---|---|
| static or dynamic | dynamic, overlapped scan technique | 1 |
| static or dynamic | static, field to field overlap technique | 2 |
| static or dynamic | static, interlocked site by site | 3 |
| static or dynamic | dynamic sub E0 exposures, field to field overlap | 4 |
| static or dynamic | static, field to field overlap technique with z-height corrections | 5 |

FIRST EMBODIMENT OF CALIBRATION TECHNIQUE

Figure 44:
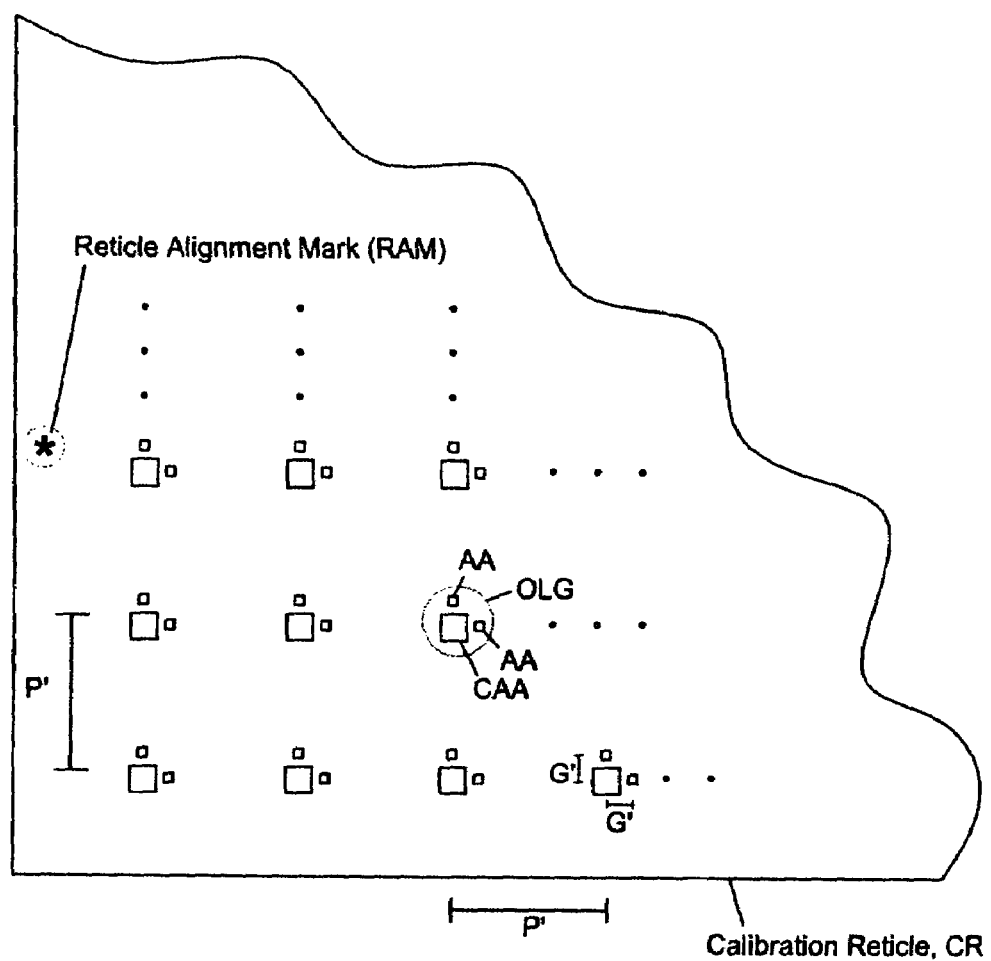
FIG. 44 shows a plan view of portion of an embodiment of a calibration reticle, CR containing NRX×NRY set of overlay groups on pitch P'.
Figure 45:
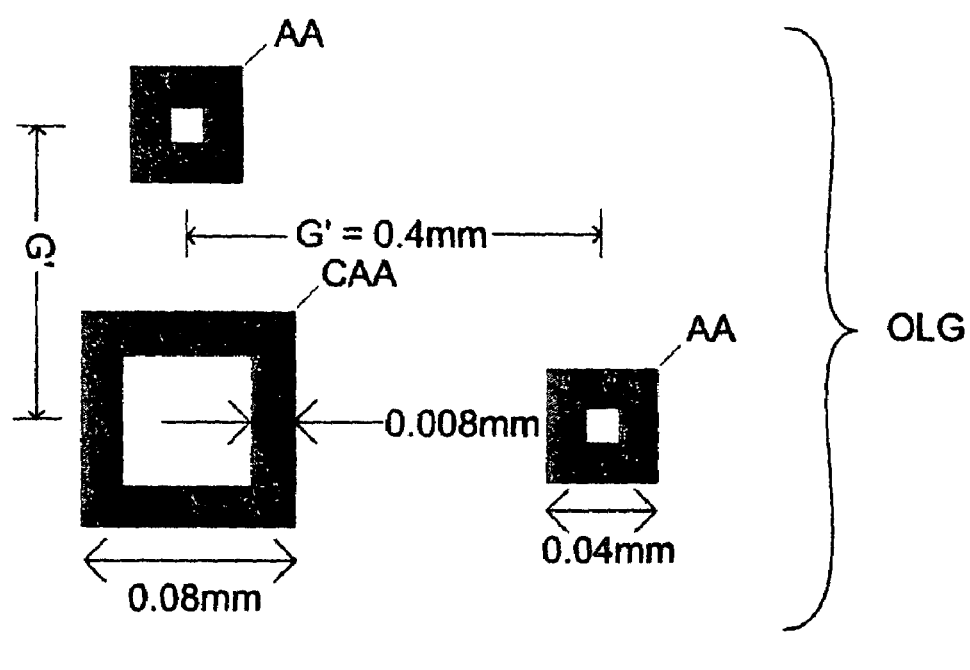
FIG. 45 shows a plan view and details of OLG of FIG. 44 written on a dark field mask; dimensions at reticle.
Figure 46:
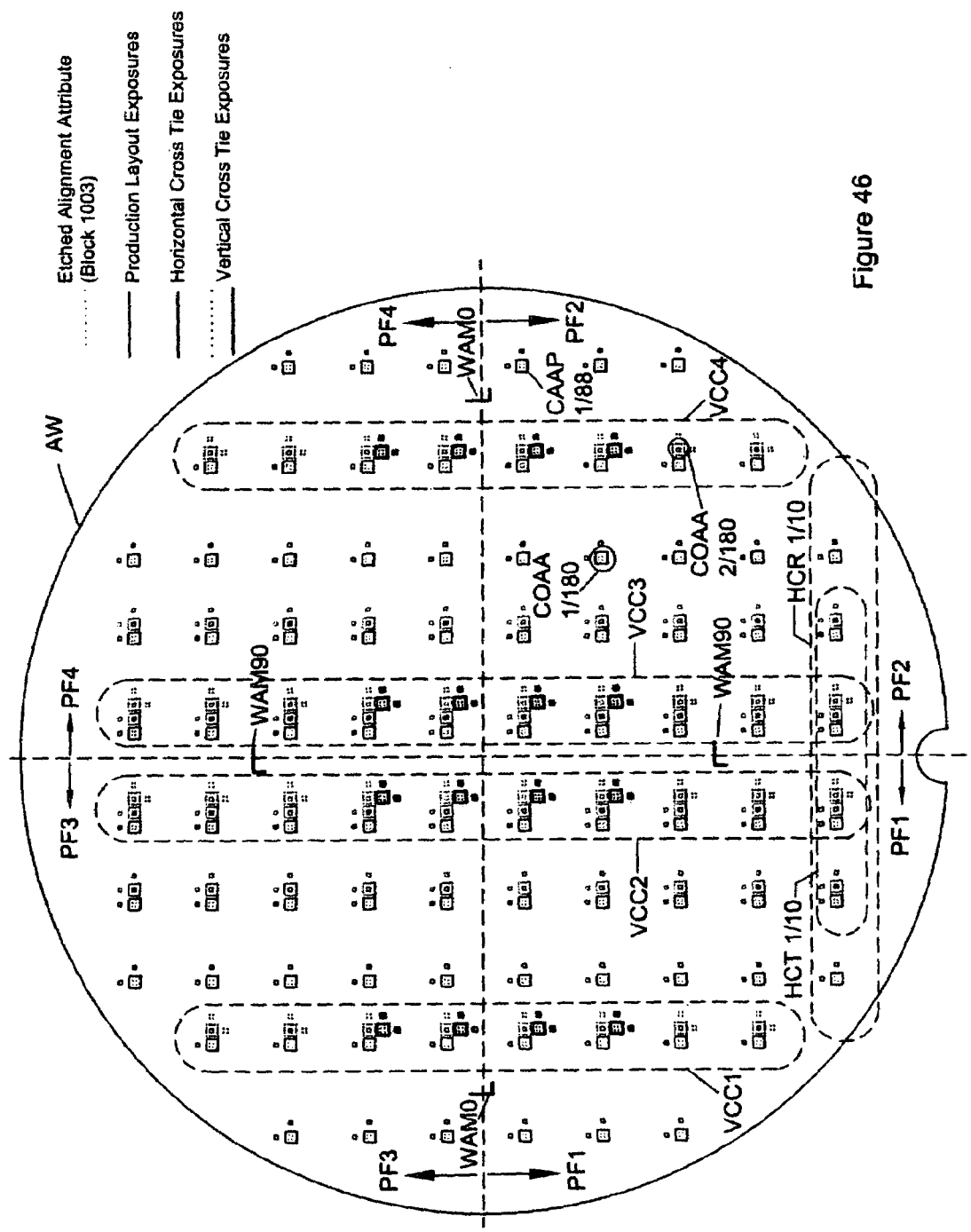
FIG. 46 shows an embodiment of a calibration exposure on archive wafer in the first embodiment (ITECH=1 of Table 1).

This description is for ITECH=1 of Table 1. Related aspects of this technique are described in U.S. patent application Ser. No. 10/252,021, now U.S. Pat. No. 6,906,303, supra which is herein incorporated by reference. Calibration reticle, CR, (Block 1004) is shown in FIG. 44 and overlay groups, OLG, in more detail in FIG. 45. Pitch P' on CR is related to pitch P of AA on AW (FIG. 43) according to:

$$P' = M*P \quad (Eq\ 23)$$

Where M=reduction magnification ratio (usually 4 or 5) of machine used for CR exposure (Block 1005). Looking at FIG. 46, the initial etched archive wafer, AW, consists of etched alignment attributes (light dotted inner boxes) on pitch P and etched wafer alignment marks suitable for use at 0° (WAM0) and at 90° notch rotation (WAM90). Etched AW could have been produced by either a series of static or dynamic exposures; we do not need to know which machine or other details of its exposure method, we will assess the site by site placement error in this etched archive wafer.

We now coat AW with photoresist, place it in a scanner, M' (not shown), and carry out the exposure steps detailed in see, for example, U.S. Pat No. 6,906,303, supra. AW is first exposed with calibration reticle CR of FIG. 44 per the production layout. In this case, the production layout is the set of exposures (printed fields or PF) that cover the etched alignment attributes with the complementary alignment attribute (CAA) of reticle CR. For the example in FIG. 46, this is four dynamically printed fields, PF1, PF2, PF3 and PF4 which are distinguished by the heavy dashed dividing line. Light black outline denotes the features exposed during this step. Scan direction was vertical relative to the page. Next, and following see, for example, U.S. Pat. No. 6,906,303, supra, horizontal cross tie exposures are done bridging the adjacent printed fields in the X-direction. Gray outline indicates these exposures (also with vertical scan) and horizontal cross ties, HCT, are thereby formed. Next, see, for example, U.S. Pat. No. 6,906,303, supra, AW is rotated 90°, aligned on WAM90 and vertical cross tie exposures are done (at least two), forming vertical cross columns labeled VCC1, VCC2, VCC3, and VCC4 in FIG. 46. The dotted and heavy black outlined structures are the result of this exposure set.

Moving to Block 1006, we now measure all of the completed alignment attributes, COAA. These fall into two groups, the overlay of the CAA from the production layout exposure with the etched archive wafer AA (the 156 light black on light dotted COAA of FIG. 46) and the remaining COAA (124 in FIG. 46) which are associated with this technique. Also, see, for example, U.S. Pat. No. 6,906,303, supra. These latter measurements are combined with the dynamic intrafield lens distortion of machine M' which is measured according to techniques, for example, U.S. Pat. No. 6,906,303, supra, to reconstruct the row by row scan synchronization error of the printed fields (PF1, PF2, . . . ).

To construct the archive wafer calibration file we need to go beyond techniques described in U.S. Pat. No. 6,906,303, supra. Using the computed (see, for example, U.S. Pat. No. 6,906,303, supra) row by row scan error, the provided calibration reticle error, and the provided dynamic intrafield lens distortion error, we can compute the locations of the complementary alignment attributes put down during the production layout exposure (CAAP) as:

$$(\Delta X, \Delta Y)(CAAP, XW, YW) = (tx1(irow, i),$$
$$ty1(irow, i) + XF(i)*q1(iro, i)) + (\Delta X, \Delta Y)(Ret, XF, YF)/M + (\Delta X, \Delta Y)(DL, XF) \quad (Eq\ 24)$$

where:

$(\Delta X, \Delta Y)$ (CAAP, XW, YW)=deviation of CAAP located at XW, YW from ideal or nominal position XW, YW=nominal position on wafer (tx1, ty1, q1) (irow, i)=scan synchronization error for scan row irow, transverse site i in production layout exposure XF, YF=intrafield coordinate for production layout exposure $(\Delta X, \Delta Y)$ (Ret, XF, YF)=reticle error at intrafield position XF, YF M=machine reduction magnification ratio $(\Delta X, \Delta Y)$ (DL, XF)=dynamic intrafield lens distortion error.

The archive wafer calibration offsets are then computed as:

$$(\Delta X, \Delta Y)(AW, XW, YW) = (BBX, BBY)(CAAP, XW, YW) + (\Delta X, \Delta Y)(CAAP, XW, YW) \quad (Eq\ 25)$$

where;

$(\Delta X, \Delta Y)$ (AW, XW, YW)=archive wafer calibration file offsets from ideal (BBX, BBY) (CAAP, XW, YW)=overlay measurements of etched alignment attributes and production layout exposure.

At this point (Block 1008) we strip the archive wafer of photoresist and create the calibration file associated with the wafer, FIG. 47.

SECOND EMBODIMENT OF CALIBRATION TECHNIQUE

Figure 48:
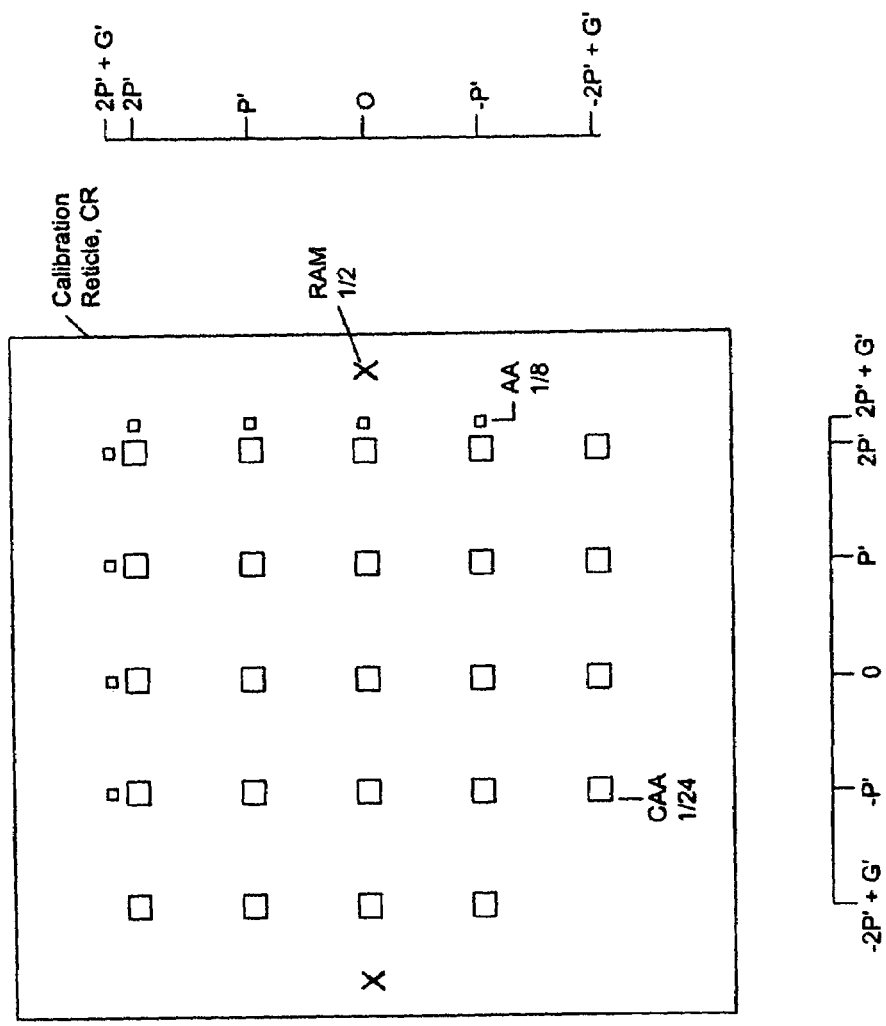
FIG. 48 shows a plan view of calibration reticle for the second embodiment.

This is ITECH=2 of Table 1. Related aspects of this technique are described in, for example, U.S. Pat. No. 6,734,971, supra which is herein incorporated by reference. Calibration reticle CR is as described in U.S. Pat. No. 6,734,971, supra is as shown in FIG. 48. It consists of an N×N array of complementary alignment attributes, CAA, with missing lower left corner on regular pitch P' except for the first row and first column which is shifted an additional amount G'. Additionally there are 2*(N−1) alignment attributes, AA, disposed a distance G' from the top column and rightmost column. In FIG. 48, N=5. Rectangular arrays are also possible, see, for example, U.S. Pat. No. 6,734,971, supra. Typical dimension G' is as in FIG. 45. P' is as specified in Equation 23, supra.

Figure 49:
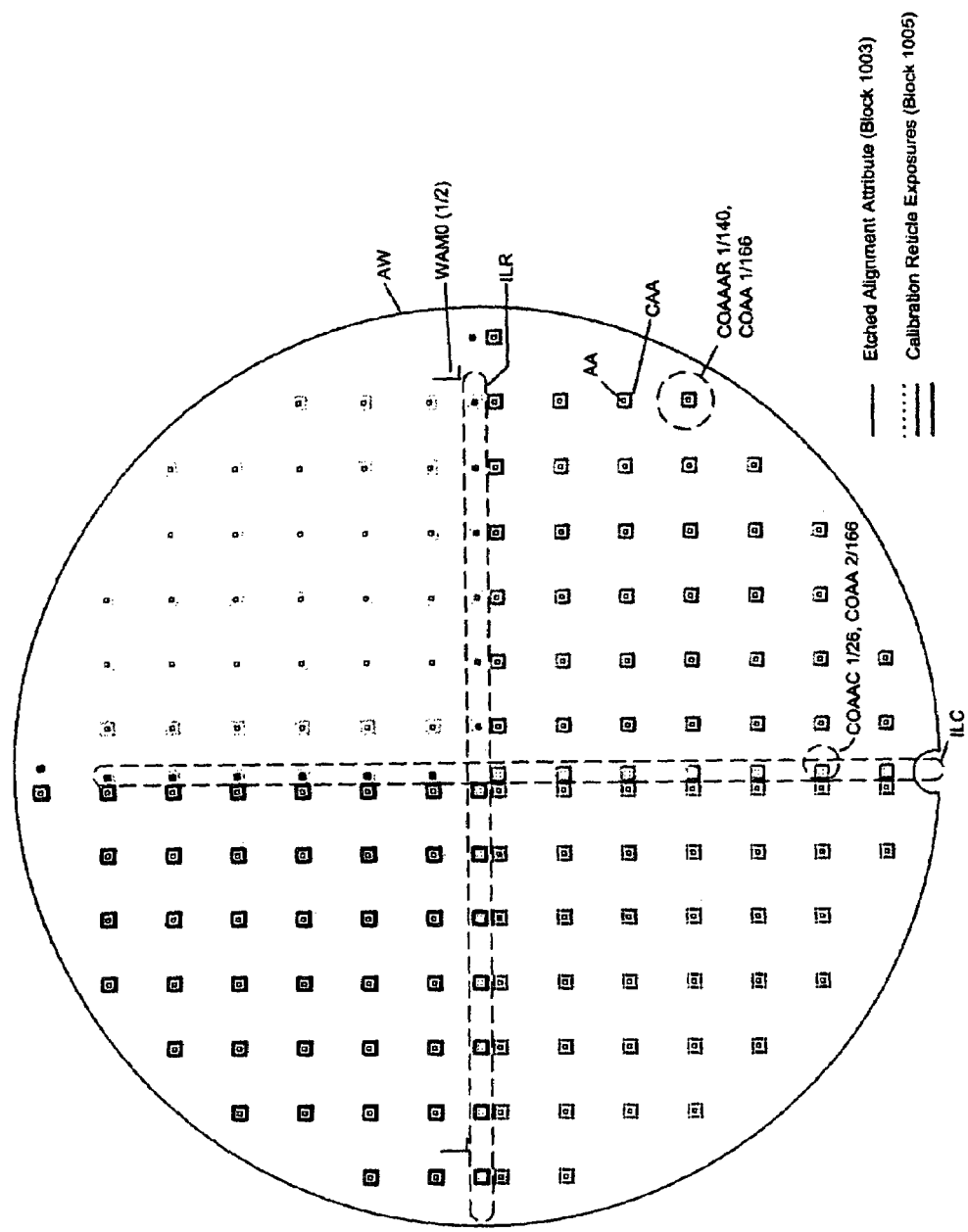
FIG. 49 shows an embodiment of a calibration exposure on archive wafer in the second embodiment (ITECH=2).

Looking at FIG. 49, the initial etched archive wafer AW consists of etched alignment attributes (light black inner boxes) on pitch P' and etched wafer alignment marks suitable for use at 0° (WAM0). Etched AW could have been reproduced by either a series of static or dynamic exposures; we do not need to know which machine or other details of its exposure method, we will assess the site by site placement error in this etched archive wafer.

We now coat AW with photoresist, place it in a stepper or scanner in static mode, M' (not shown), and carry out the exposure steps detailed in see, for example, U.S. Pat. No. 6,734,971, supra. These exposure steps consist of exposing an interlocking array of exposure fields using a special calibration reticle, CR (an example with N=5 is shown in FIG. 48) covering each etched alignment attribute, AA, with a complementary alignment attribute, CAA, thereby forming completed alignment attributes, archive (COAAR) of which 1 of 140 is pointed out in FIG. 49. As described in, for example, U.S. Pat. No. 6,734,971, supra, during the same exposure sequence interlocking rows (ILR) and interlocking columns (ILC) are created between adjacent static calibration reticle, CR, exposure fields. Looking at FIG. 49, four static, interlocking CR exposures are required to cover the wafer. The interlocking column, ILC, consists of thirteen completed alignment attributes, calibration (COAAC) of which one is explicitly called out. Likewise, interlocking row, ILR consists of thirteen COAA made up of inner and outer boxes from adjacent CR exposure fields.

Moving to Block 1006, we now measure all completed alignment attributes, COAA. Again, these fall into two groups, those containing an etched archive wafer alignment attribute (COAAAR of which there are 140 in FIG. 49) and those required for calibration (COAAC of which there are 26 in FIG. 49).

In Block 1007, we provide per U.S. Pat. No. 6,734,971, supra, the static lens distortion of machine M' (the machine carrying out the calibration reticle exposures). This may be accomplished, for example, using the method of U.S. Pat. No. 6,573,986, supra.

In Block 1008, we first utilize the COAAC overlay data, the manufacturing error file for calibration reticle CR, the provided intrafield lens distortion data for machine M', and combine them, for example, U.S. Pat. No. 6,734,971, supra to produce a map of the positional offsets as shown in U.S. Pat. No. 6,734,971, supra, FIG. 34 and denoted here as: (ΔX, ΔY) (COAAR, XW, YW). The archive wafer calibration offsets are then computed as:

$$(\Delta X, \Delta Y)(AW, XW, YW) = (BBX, BBY)(COAAAR, XW, YW) + (\Delta X, \Delta Y)(COAAAR, XW, YW) \quad \text{(Eq 26)}$$

where;

(BBX, BBY) (COAAAR, XW, YW)=overlay measurement from the etched archive wafer alignment attribute at position XW, YW on the wafer.

At this point (Block 1008) we strip the archive wafer of photoresist and create the calibration file associated with the wafer, FIG. 47.

THIRD EMBODIMENT OF CALIBRATION TECHNIQUE

Figure 50:
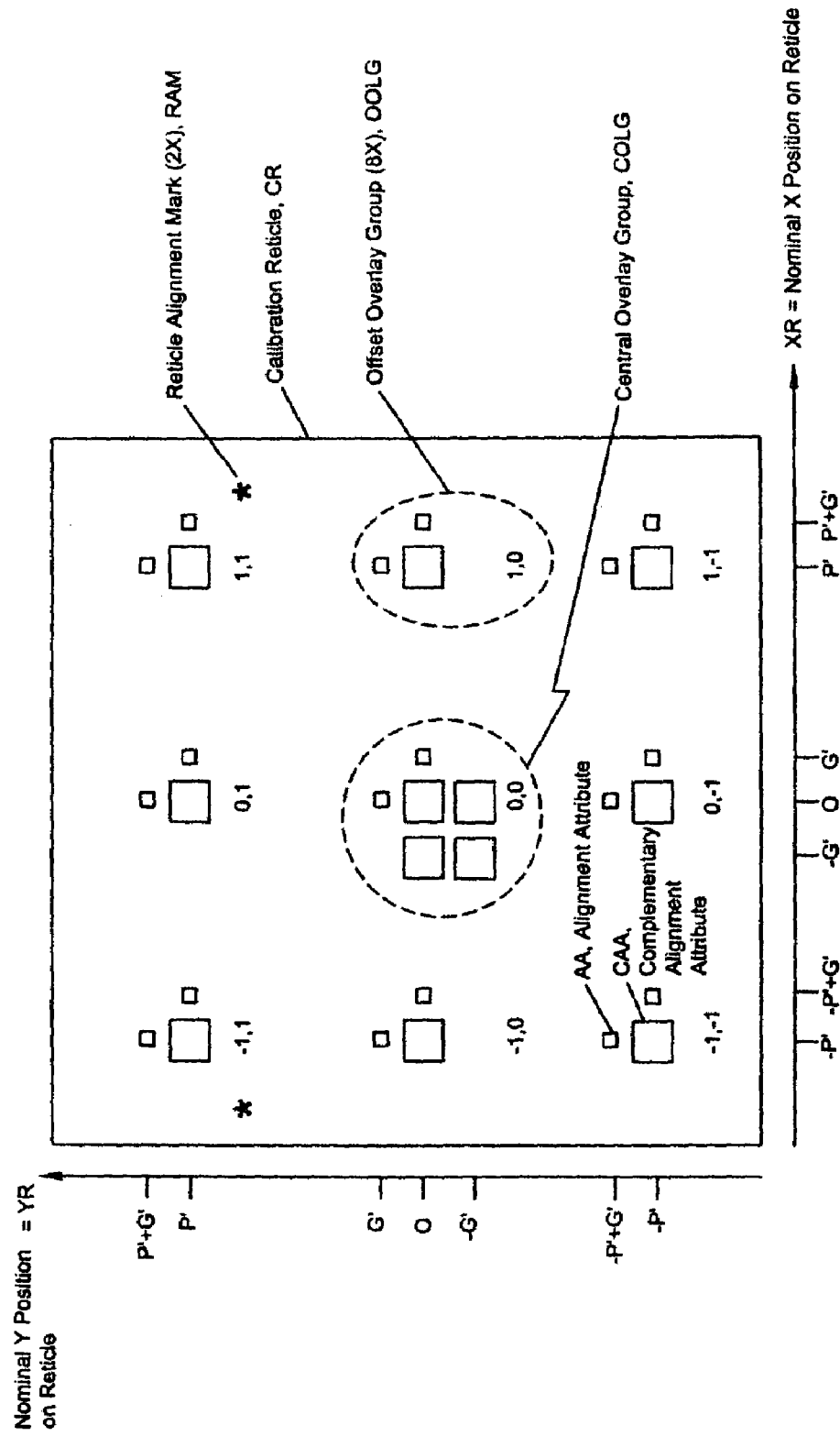
FIG. 50 shows a plan view of calibration reticle (CR) for a third embodiment.

This is ITECH=3 of Table 1. Related aspects of this technique are described in, B. McArthur et al., "Method and Apparatus for Self-Referenced Wafer Stage Positional Error Mapping", U.S. Publication No. 2004-0162687 which is herein incorporated by reference and for brevity referenced as, U.S. Publication No. 2004-0162687, supra. Calibration reticle, CR, may be described as, for example, U.S. Publication No. 2004-0162687, supra and also shown in FIG. 50. It consists of a 3×3 array of overlay groups of two types. First, a central overlay group, COLG, consisting of a 2×2 array of complementary alignment attributes on pitch G' (in this drawing they are the outer frames of a frame-in-frame alignment attribute) and two alignment attributes offset from (XR YR)=(0,0) in the X and Y directions an amount G'. In this instance the alignment attributes are the inner frames of a frame-in-frame pair. Nominal position of the COLG is (XR, YR)=(0,0). The second type of overlay group is the offset overlay groups, OOLG, which consist of a single complementary alignment attribute of the same type as of the 2×2 COLG portion (in this case, the outer frame of a frame-in-frame pair) and alignment attributes offset in X and Y directions by an amount G'. OOLG are on a pitch P' relative to COLG and each other.

Group numbering is present on each overlay group as an aid during exposure setup. Reticle alignment marks, RAM, will also be present on calibration reticle, CR. CR as illustrated is a dark field reticle. Thus, the lines representing the overlay groups are interpreted as openings in chrome. A typical dimension G' is as in FIG. 45. P' is as specified in Equation 23, supra.

Figure 51:
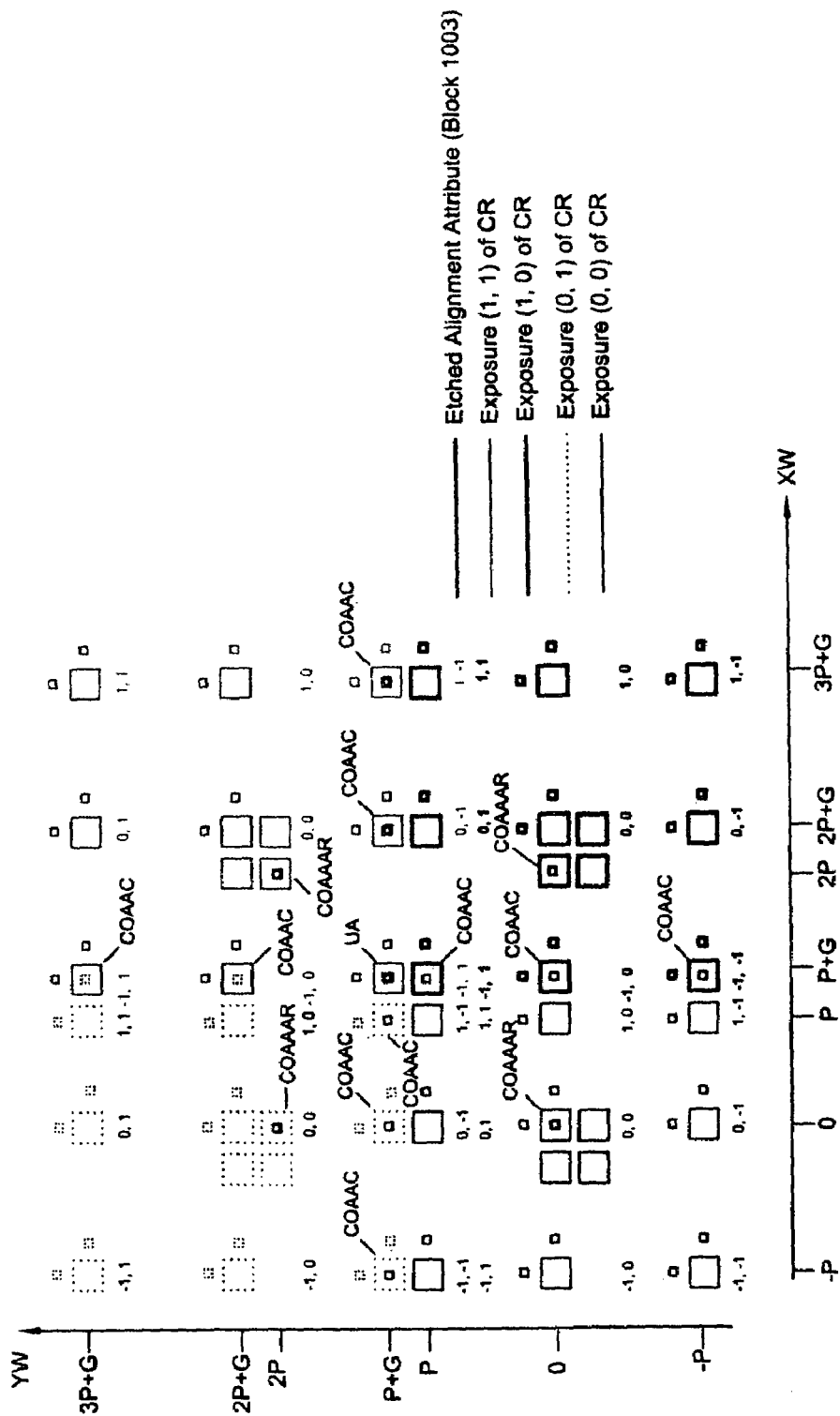
FIG. 51 shows an embodiment of a combined self referenced rectangular grid and etched alignment attributes, 2×2 section at wafer center.

FIG. 51 shows a portion of the initial etched archive wafer alignment attributes (heavy gray inner boxes) on pitch P and etched wafer alignment marks suitable for use at 0° (not shown). Etched alignment attributes could have been produced by either a series of static or dynamic exposures; we do not need to know which machine or other details of its exposure method, we will assess the site by site placement error in this etched archive wafer. We now coat the archive wafer with photoresist, place it in a stepper or scanner, M' (not shown), and carry out the exposure steps, for example as described in U.S. patent application Ser. No. 10/775,718, supra.

Reticle CR is now exposed in static mode in an interlocking array that covers the archive wafer (not shown) and covers each etched alignment attribute of the archive wafer with a complementary alignment attribute (CAA) from the COLG of CR thus forming a series of completed alignment attribute archives (COAAAR) of which four are shown in FIG. 51. Additionally, adjacent exposures of CR create completed alignment attributes, calibration (COAAC) of which ten are present in FIG. 51. There is additionally an unusable completed alignment attribute, UA, present in most exposures that is not used.

Moving to Block 1006, we now measure all COAAC and COAAAR completed alignment attributes. In Block 1007, we follow, for example, U.S. patent application Ser. No. 10/775,718, supra in providing the manufacturing error file for calibration reticle CR and possibly the static field distortion error of machine M' (machine doing the CR exposure).

In Block 1008, we follow, for example, U.S. Publication No. 2004-0162687, supra in reconstructing the locations of the complementary alignment attributes making up the COAAAR that span the archive wafer. Calling this (DX, DY) (COAAAR, XW, YW) the archive wafer calibration offsets are then computed as:

$$(DX, DY)(AW, XW, YW) = (BBX, BBY)(COAAAR, XW, YW) + (DX, DY)(COAAAR, XW, YW) \quad \text{(Eq 27)}$$

where;

(BBX, BBY) (COAAAR, XW, YW)=overlay measurement from the etched archive wafer alignment attribute at position XW, YW on the wafer.

At this point (Block 1008) we strip the archive wafer of photoresist and create the calibration file associated with the wafer, FIG. 47.

FOURTH EMBODIMENT OF CALIBRATION TECHNIQUE

This is ITECH=4 of Table 1. This is a variation of the second embodiment wherein instead of shooting calibration reticle CR of FIG. 48 in static mode on a stepper or scanner, it is shot in dynamic mode on a scanner. The discussion is largely the same so we discuss differences here only.

First, and referring to FIG. 48, calibration reticle CR could be of the partially transmitting type (for example only 5% transmitting) as discussed in, for example, U.S. Pat. No. 6,734,971, supra and shown in FIG. 14 therein. The reason for using a partially transmitting reticle is so that when doing the calibration exposures (Block 1005) in dynamic mode on a scanner, what would previously have been a single exposure (or more exactly one of many single exposures) is now carried out as multiple sub-E0, or sub-nominal dose, exposures. Multiple (for example, more than approximately 30) sub-E0 exposures have the cumulative effect of averaging out the non-repeatable portion of the reticle to wafer stage scan synchronization error so that what remains is the repeatable part of the scan synchronization error plus the dynamic lens distortion.

The next difference from the second embodiment is data, regarding machine M' intrafield distortion (Block 1007). Instead of providing the static lens distortion for M' ((DX, DY) (SL, XF, YF)) we provide the repeatable part of the dynamic intrafield distortion:

$$(DX,DY)(RIF, XF, YF)=(DX,DY)(DL, XF)+(DX,DY)(RSS, XF, YF) \quad \text{(Eq 28)}$$

where;

(DX,DY) (RIF, XF, YF)=repeatable part of the dynamic intrafield distortion at intrafield point XF, YF (DX, DY) (DL, XF)=dynamic lens intrafield distortion, and the repeatable part of the scan synchronization error is $$(DX, DY)(RSS, XF, YF)=(tx(YF), ty(YF)+XF*\theta(YF)) \quad \text{(Eq 29)}$$

where;

(tx, ty, θ) (YF)=repeatable part of the x-translation, y-translation, Yaw of the scan synchronization error.

The dynamic lens distortion, (DX,DY) (DL,XF), may be measured using the technique of , U.S. Pat. No. 6,906,780, supra while the repeatable part of the scan synchronization error may be measured using the technique of, U.S. Pat. No. 6,906,303, supra. Other techniques may also be used to measure the dynamic lens distortion and synchronization error. At this point, we provide the repeatable part of the dynamic intrafield distortion as input to an algorithm, see, for example, U.S. Pat. No. 6,734,971, supra and the remaining steps for this fourth embodiment are then similar to the second embodiment.

FIFTH EMBODIMENT OF CALIBRATION TECHNIQUE

This is ITECH=5 of Table 1. This is an improvement of the second embodiment that accounts for wafer height and stage height variation influence on transverse placement of the calibration exposures. It uses the method described in U.S. patent application Ser. No. 11/676,959 entitled "Systems And Methods For Determination Of Focus And Telecentricity, Amelioration Of Metrology Induced Effects And Application To Determination Of Precision Bossung Curves", which is herein incorporated by reference.

Figure 52:
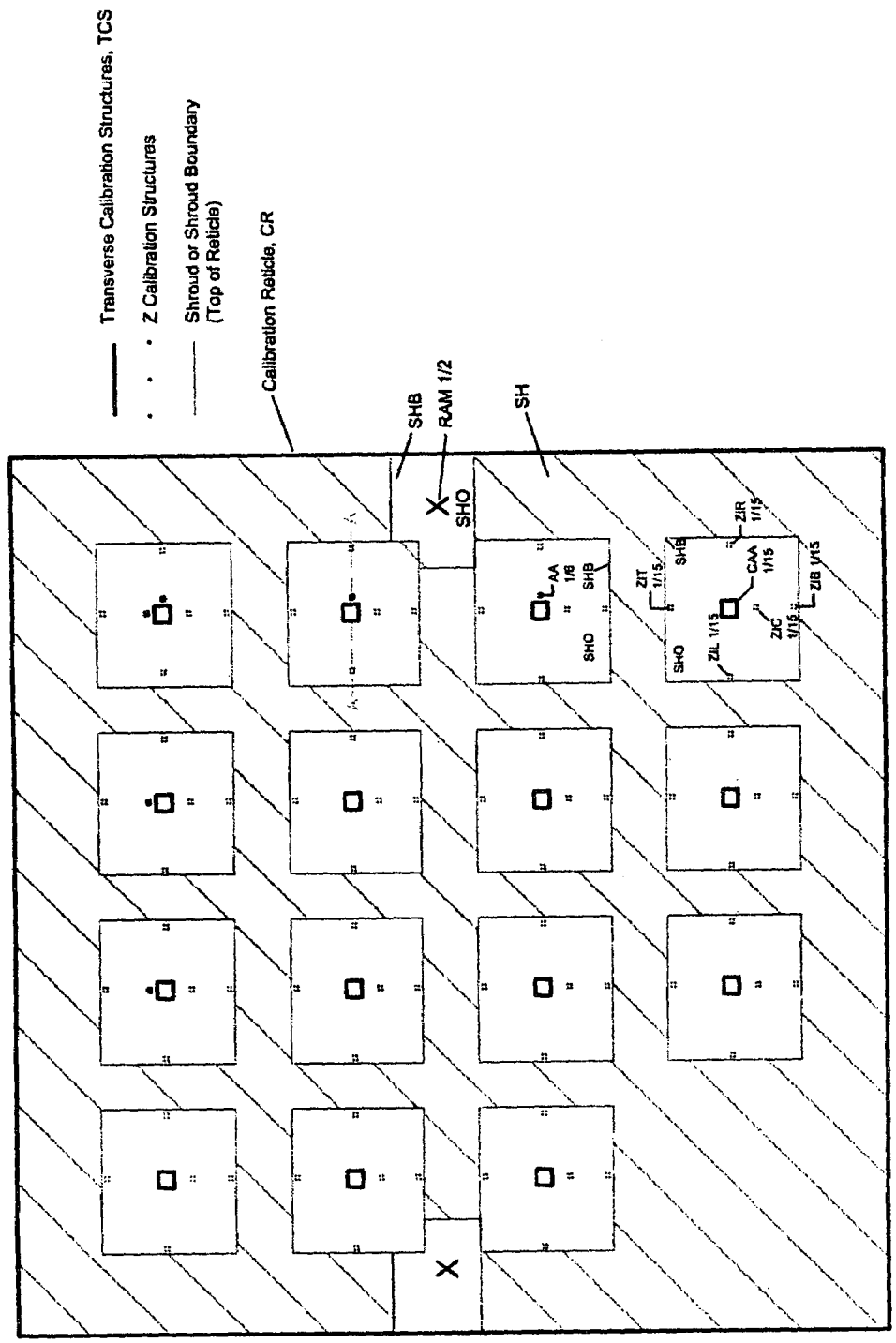
FIG. 52 shows a plan view of an embodiment of a calibration reticle including focusing fiducials for the fifth embodiment.
Figure 53:
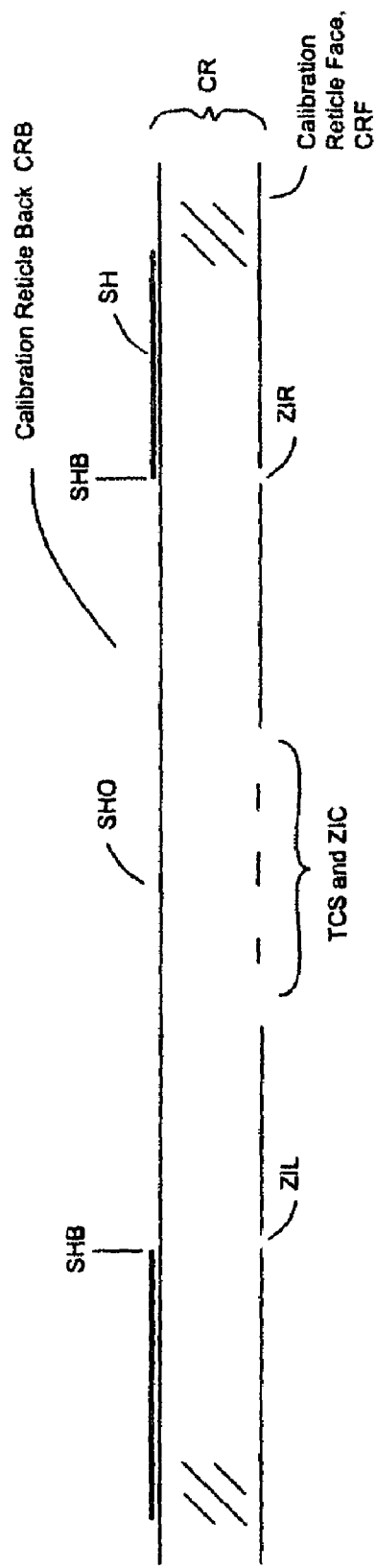
FIG. 53 shows a cross section through AA of calibration reticle of FIG. 52.

FIG. 52 shows in plan view calibration reticle CR (Block 1004) used. Its transverse calibration structures are identical to those of CR in FIG. 48 but it also has integrated z-height mapping structures as described in see, for example, A. Smith et al., "Method and Apparatus for Measurement of Exit Pupil Telecentricity and Source Boresighting", U.S. Publication No. 2006-0164618, specifically backside reticle shroud SH, and alignment attributes (dotted inner boxes as drawn in FIG. 52) for z-mapping ZIR, ZIT, ZIL, ZIB, and ZIC. ZIR, ZIT, ZIL, ZIB are located approximately underneath shroud boundary, SHB (shown also in cross section in FIG. 53) while ZIC and the transverse calibration structures are located so that shroud SH in no way occludes light incident from machine M' illumination source (not shown). Additionally, there is a z-reference group, ZREF, shown in plan view in FIG. 54. It is either located on CR, off to one side and so that shroud SH does not occlude it, or possibly on a separate reticle altogether.

Figure 54:
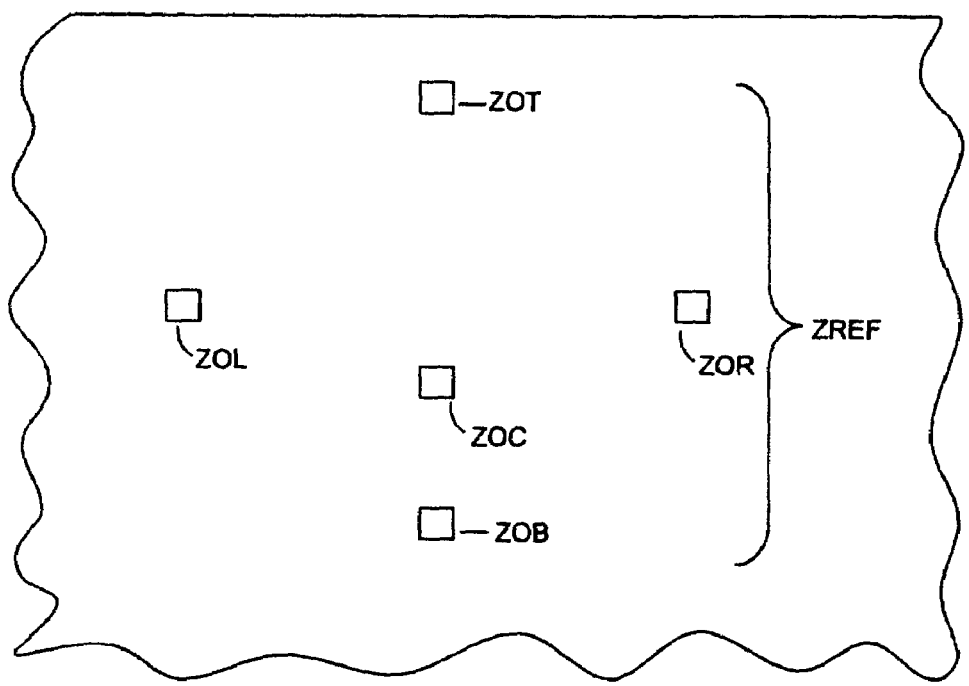
FIG. 54 shows a plan view of z-reference group located on separate reticle or possibly on CR of FIG. 52; shroud SH in no way obscures it.
Figure 55:
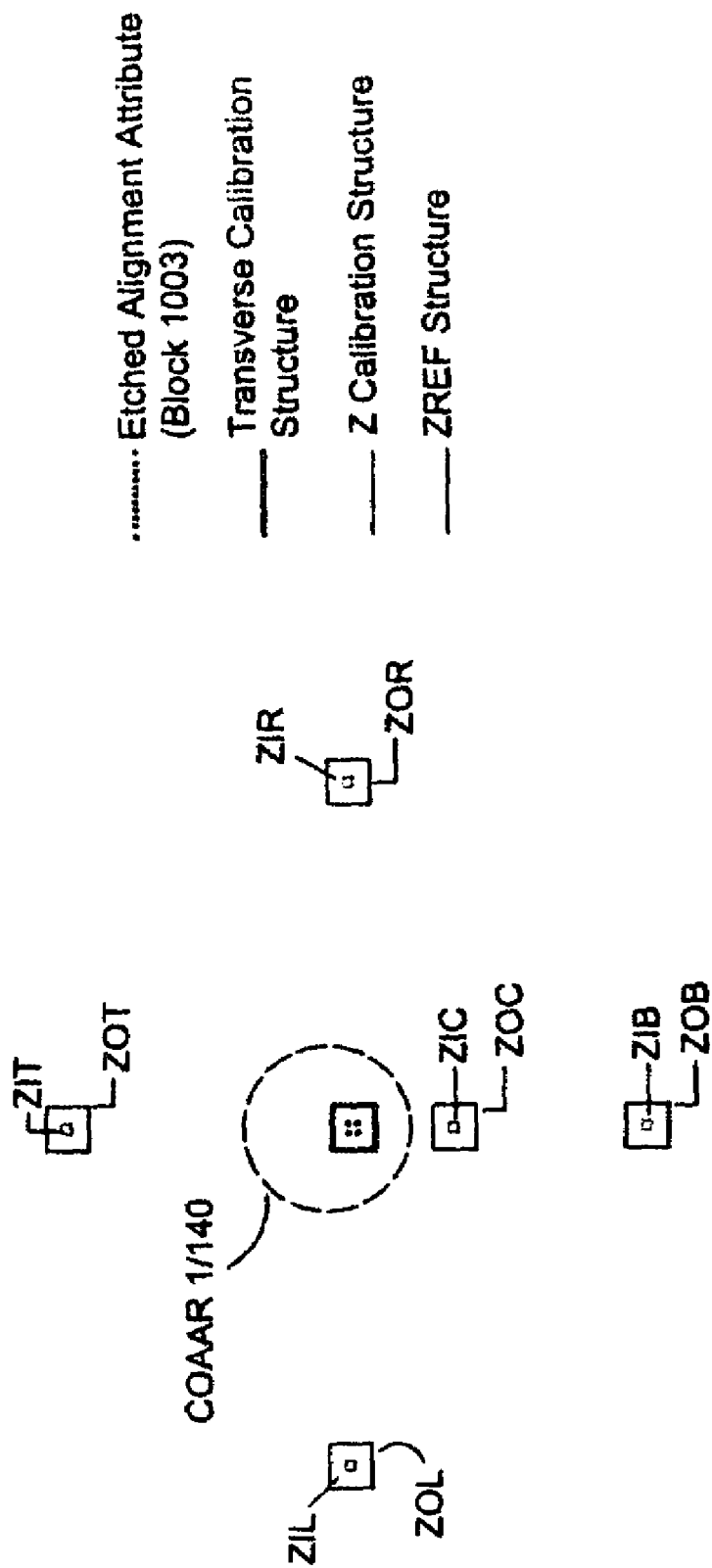
FIG. 55 shows an example of a sample completed alignment attribute and associated z-height calibration structures.

Moving to Block 1005, exposure steps are the same as in the second embodiment except that there is now the additional exposure sequence of blading down to the ZREF pattern of FIG. 54 and stepping/exposing it at each COAAAR or COAAC printed on archive wafer AW (see FIG. 49). FIG. 55 shows completed alignment attribute, archive (COAAAR 1/140) from FIG. 49 as it and its associated z-mapping structures would appear on archive wafers of the present embodiment. Five additional completed alignment attributes consisting of the pairs ZIC/ZOC, ZIR/ZOR, ZIT/ZOT, ZIL/ZOL, ZIB/ZOB go along with COAAAR and are used to reconstruct the z-height.

In Block 1006, in addition to the overlay measurements of the second embodiment, we also measure the five additional z-marks that go with every calibration or archive measurement of the second embodiment.

Moving to Block 1007, the enhanced accuracy of this method derives from taking into account the combined effect of non-telecentricity (source and exit pupil), lens aberrations, and focus variations (mostly from wafer height variations). Source, exit pupil, and lens aberrations are provided by the user most readily in the framework set forth in see, for example, A. Smith et al., "Method of Emulation of Lithographic Projection Tools", U.S. Publication No. 2005-0240895. These, in addition to the static lens distortion (supra) are provided.

In Block 1008, we compute the calibration file in view of the additional information provided by the z-height fiducials. At each COAAAR or COAAC we reconstruct the z-height (Z(XW, YW)) from the five z-height overlay measurements at each side using the method in U.S. patent application Ser. No. 11/676,959 entitled "Systems And Methods For Determination Of Focus And Telecentricity, Amelioration Of Metrology Induced Effects And Application To Determination Of Precision Bossung Curves". Now knowing the z heights, aberrations, source and exit pupil telecentricity, we can calculate the additional resulting transverse shifts (Dx, Dy) at each COAAAR or COAAC location and utilize them as corrections applied in addition to the static lens distortion data already provided. The calculations then proceed as in the second embodiment and at the end we strip the archive wafer of photoresist and create the unique calibration file associated with that wafer, FIG. 47.

ADDITIONAL EMBODIMENTS

Figure 56:
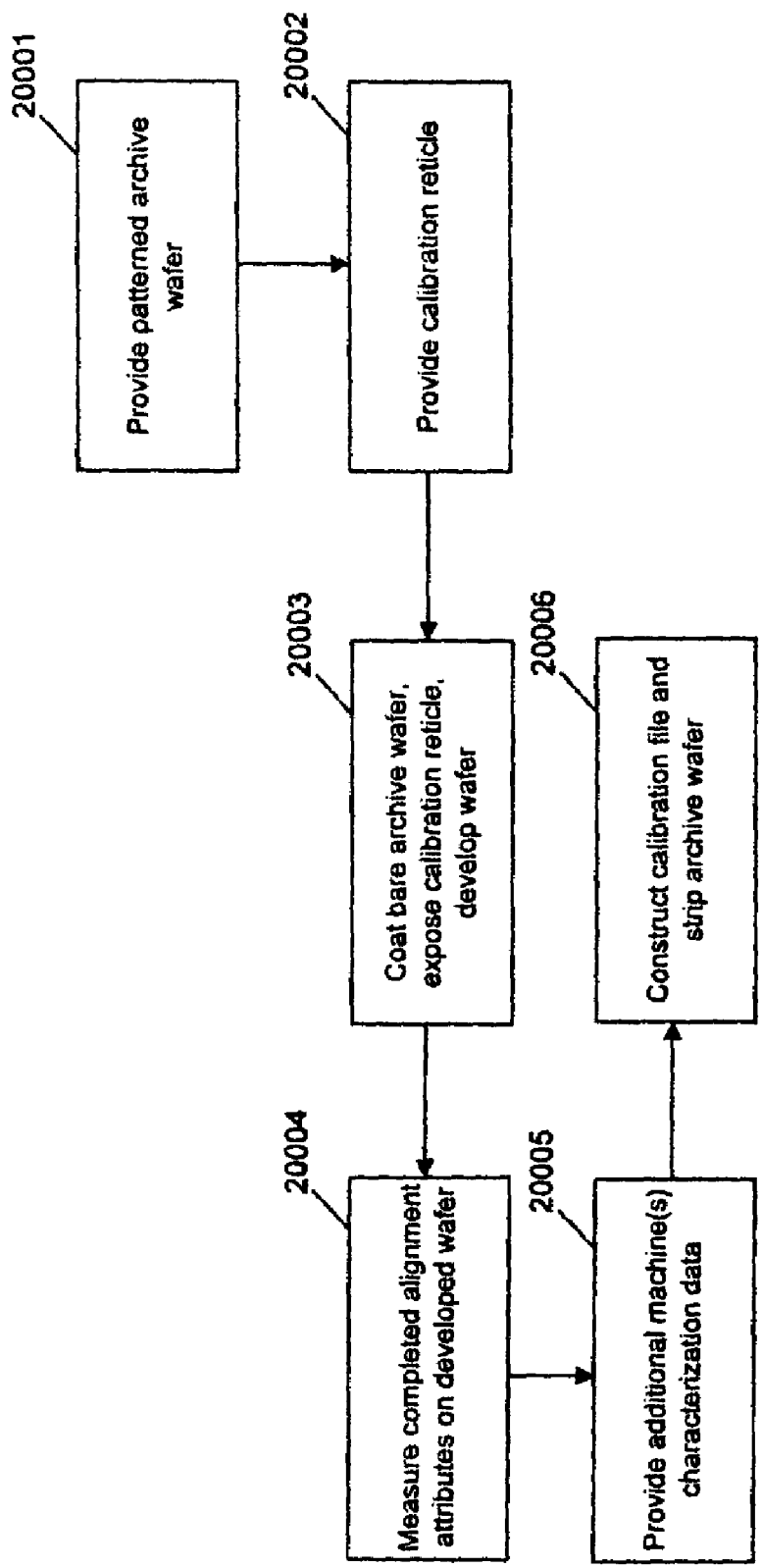
FIG. 56 shows an exemplary process flow for alternate embodiments for manufacture of high accuracy archive wafers.

In one class of embodiments the archive wafer is already provided; indeed it is likely an archive wafer that is already being used in routine machine calibration and it is likely that a calibration or improved calibration file is required. In this case, the process flow of FIG. 56 has as its first step (Block 20001) providing a previously patterned archive wafer. We are not concerned with the means, or manner in which it was produced, only that there be permanent alignment attributes on some pitch P. The archive wafer being thus provided, we proceed to carry out the steps of Blocks 20002-20006 which are similar to Blocks 1004-1008 of FIG. 37.

In another class of embodiments, archive wafer AW may not have permanent alignment attributes on pitch P that cover the entire wafer (i.e., missing sites). AW can still be calibrated by the method of this invention by carrying out the steps of FIG. 37 or FIG. 56 and at archive wafer sites that are missing the permanent alignment attributes, no entry in final archive wafer calibration file (FIG. 47) is made.

In yet another class of embodiments, we may want to calibrate an archive wafer that is a mixture of overlay alignment attributes and wafer alignment marks (see, for example, M. van den Brink et al. "Matching of Multiple Wafer Steppers for 0.35 micron Lithography Using Advanced Optimization Schemes", Proc. of SPIE, Vol. 1926, pp. 188-207, 1993). In this case the only prerequisite for the archive wafer is that the overlay alignment attributes lie on an incomplete grid of regular pitch P and be proximate to (i.e., within the isoplanatic patch of the machine that printed the archive wafer) the wafer alignment marks. Then the incomplete grid calibration method (supra) can be applied.

The above specific examples have utilized a round or notched semiconductor wafer. It is understood the technique also applies to archive media that are rectangular substrates (i.e., flat panels, printed circuit boards, circuit modules, reticles) or any other planar substrate. The substrate could also be a CCD array we wish to calibrate, and in that case, the physical CCD pixels take the place of the etched archive wafer alignment attributes and the calibration reticle exposures will be the same as above. Now, instead of overlay data (BBX, BBY), we will directly read out the position of the complementary alignment attributes and utilize them in the calculation of the pixel positions within the CCD array.

Heretofore we have referred to etched alignment attributes in the archive wafer. Any permanent, durable mark, etched, raised, embossed, or possibly drawn serving as the alignment attribute is all that is required for the practice of this invention.

The machine on which the reference wafer is loaded may be different types of imaging tools. For example, the machine may be a stepper projection imaging tool, a scanner projection imaging tool, an electron beam imaging system, an electron beam direct write system, a SCAPEL tool, an extreme ultra-violet imaging apparatus, an ion projection lithography tool, or an x-ray imaging system. Also, the subtraction of the calibration file and the calculation of the inter-field or intra-field errors may be preformed on a computer or a controller. In addition, the calibration file may be stored on a computer readable medium, for example, a tape, a diskette, or a CD.

The foregoing description details certain embodiments of the invention. It will be appreciated, however, that no matter how detailed the foregoing appears, the invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes which come with the meaning and range of equivalency of the claims are to be embraced within their scope.

We claim:

1. A reticle for use in constructing a calibration file for an archive media; the reticle comprising a pattern of complementary alignment attributes that are exposed onto an archive media such that the pattern of complementary alignment attributes overlay and interlock with a etched alignment attributes on the archive thereby forming completed alignment attributes, wherein measurements of offsets in the completed alignment attributes are used to construct a calibration file for the archive media based upon the offset measurements and dynamic intrafield lens distortion data of a lens used to expose the pattern of complementary alignment attributes, and calibration error of the complementary alignment attributes.

2. A calibration reticle for use in constructing a calibration file for an archive media; the calibration reticle comprising a pattern exposed onto an archive media, wherein the pattern of the calibration reticle includes complementary alignment attributes, and the reticle is positioned such that the pattern of complementary alignment attributes overlay and interlock etched alignment attributes on the archive media, thereby forming interlocking rows and columns of completed alignment attributes between adjacent static calibration reticle exposure fields, wherein measurements of offsets in the completed alignment attributes are used to construct a calibration file for the archive media based upon the offset measurements and intrafield lens distortion data of a lens used to expose the pattern of complementary alignment attributes, and manufacturing error data for the calibration reticle.

* * * * *

UNITED STATES PATENT AND TRADEMARK OFFICE
CERTIFICATE OF CORRECTION

PATENT NO. : 7,381,503 B2
APPLICATION NO. : 11/742468
DATED : June 3, 2008
INVENTOR(S) : Smith et al.

It is certified that error appears in the above-identified patent and that said Letters Patent is hereby corrected as shown below:

FRONT PAGE
On the Title Page
(56) References Cited insert the following

| | | |
|---|---|---|
| US- 6,130,750 | 10/2000 | Ausschnitt et al |
| US- 6,137,578 | 10/2000 | Ausschnitt |
| US- 6,142,641 | 11/2000 | Cohen et al |
| US- 6,143,621 | 11/2000 | Tzeng et al |
| US- 6,153,886 | 11/2000 | Hagiwara et al |
| US- 6,163,366 | 12/2000 | Okamoto et al |
| US- 6,204,912 | 03/2001 | Tsuchiya et al |
| US- 6,218,200 | 04/2001 | Chen et al |
| US- 6,417,929 | 07/2002 | Ausschnitt et al |
| US- 6,737,207 | 05/2004 | Imai |
| US- 4,861,148 | 08/1989 | Sato et al |
| US- 6,573,986 | 06/2003 | Smith et al |
| US- 6,734,971 | 05/2004 | Smith et al |
| US- 6,906,303 | 06/2005 | Smith |
| US- 6,906,780 | 06/2005 | Smith |
| US- 2004/0162687 | 08/2004 | Smith et al |
| US- 2005/0240895 | 10/2005 | Smith et al |
| US- 5,402,224 | 03/1995 | Hirukawa et al |

Signed and Sealed this

Twenty-ninth Day of July, 2008

JON W. DUDAS
*Director of the United States Patent and Trademark Office*